(12) United States Patent
Cho et al.

(10) Patent No.: US 10,985,340 B2
(45) Date of Patent: **\*Apr. 20, 2021**

(54) ORGANIC LIGHT EMITTING DIODE DISPLAY INCLUDING CAPPING LAYER HAVING HIGH REFRACTIVE INDEX

(71) Applicant: SAMSUNG DISPLAY CO., LTD., Yongin-si (KR)

(72) Inventors: Hwan-Hee Cho, Yongin-si (KR); Myeong-Suk Kim, Yongin-si (KR); Sung-Wook Kim, Yongin-si (KR)

(73) Assignee: Samsung Display Co., Ltd., Yongin-si (KR)

(\*) Notice: Subject to any disclaimer, the term of this patent is extended or adjusted under 35 U.S.C. 154(b) by 0 days.

This patent is subject to a terminal disclaimer.

(21) Appl. No.: 16/170,287

(22) Filed: Oct. 25, 2018

(65) Prior Publication Data

US 2019/0067628 A1 Feb. 28, 2019

Related U.S. Application Data

(63) Continuation of application No. 14/853,165, filed on Sep. 14, 2015, now Pat. No. 10,121,987.

(30) Foreign Application Priority Data

Nov. 24, 2014 (KR) ........................ 10-2014-0164595

(51) Int. Cl.
*H01L 51/50* (2006.01)
*H01L 51/52* (2006.01)
*H01L 51/00* (2006.01)

(52) U.S. Cl.
CPC ........ *H01L 51/5237* (2013.01); *H01L 51/008* (2013.01); *H01L 51/0052* (2013.01);
(Continued)

(58) Field of Classification Search
None
See application file for complete search history.

(56) References Cited

U.S. PATENT DOCUMENTS 8,598,786 B1 12/2013 Kim et al.
8,680,543 B2 3/2014 Takeda et al.
(Continued)

FOREIGN PATENT DOCUMENTS

EP 2 530 717 A2 12/2012
EP 2763507 A1 8/2014
(Continued)

OTHER PUBLICATIONS

EPO European Search Report dated Jan. 22, 2020, for corresponding European Patent Application No. 19194972.6 (5 pages).
(Continued)

*Primary Examiner* — Gregory D Clark
(74) *Attorney, Agent, or Firm* — Lewis Roca Rothgerber Christie LLP

(57) ABSTRACT

An organic light emitting diode display including a first substrate; a first electrode on the first substrate; an organic light emitting layer on the first electrode; a second electrode on the organic light emitting layer; and a capping layer on the second electrode, wherein the capping layer includes at least one heterocyclic compound, the heterocyclic compound including a carbazole group and a heterocyclic group bonded with the carbazole group.

18 Claims, 3 Drawing Sheets

(52) U.S. Cl.
CPC ...... *H01L 51/0058* (2013.01); *H01L 51/0067* (2013.01); *H01L 51/0071* (2013.01); *H01L 51/0072* (2013.01); *H01L 51/0073* (2013.01); *H01L 51/0074* (2013.01); *H01L 51/0094* (2013.01); *H01L 51/5253* (2013.01); *H01L 51/5275* (2013.01); *H01L 2251/55* (2013.01)

(56) References Cited

U.S. PATENT DOCUMENTS

| | | |
|---|---|---|
| 8,921,840 B2 | 12/2014 | Kim et al. |
| 9,368,731 B2 | 6/2016 | Saito et al. |
| 2006/0113907 A1 | 6/2006 | Im et al. |
| 2008/0023724 A1 | 1/2008 | Takeda et al. |
| 2009/0143505 A1 | 6/2009 | Samukawa et al. |
| 2011/0121271 A1 | 5/2011 | Jeon et al. |
| 2014/0034942 A1* | 2/2014 | Saito .............. H01L 51/0072 257/40 |
| 2014/0225100 A1 | 8/2014 | Yokoyama et al. |
| 2015/0171341 A1 | 6/2015 | Lee et al. |

FOREIGN PATENT DOCUMENTS

| | | |
|---|---|---|
| KR | 10-0700013 B1 | 3/2007 |
| KR | 10-2007-0103463 A | 10/2007 |
| KR | 10-2011-0058126 A | 6/2011 |
| KR | 10-2014-0008215 A | 1/2014 |
| KR | 10-2014-0027141 A | 3/2014 |
| KR | 10-2014-0059372 A | 5/2014 |
| KR | 10-2014-0074928 A | 6/2014 |
| KR | 10-1431644 B1 | 8/2014 |
| TW | 201247655 A1 | 12/2012 |
| WO | 2013/161603 A1 | 10/2013 |

OTHER PUBLICATIONS

European Search Report dated Apr. 25, 2016 in Corresponding European Patent Application No. 15196112.5.
Extended European Search Report dated Aug. 26, 2016 in Corresponding European Patent Application No. 15196112.5.
Korean Patent Application No. 10-2014-0164595 Office Action dated Dec. 20, 2016.
Korean Notice of Allowance dated Aug. 4, 2017 for Korean Patent Application No. 10-2014-0164595.

* cited by examiner

ORGANIC LIGHT EMITTING DIODE DISPLAY INCLUDING CAPPING LAYER HAVING HIGH REFRACTIVE INDEX

CROSS-REFERENCE TO RELATED APPLICATIONS

This is a continuation application based on pending application Ser. No. 14/853,165, filed Sep. 14, 2015, the entire contents of which is hereby incorporated by reference.

Korean Patent Application No. 10-2014-0164595, filed on Nov. 24, 2014, in the Korean Intellectual Property Office, and entitled: "Organic Light Emitting Diode Display Comprising Capping Layer Having High Refractive Index," is incorporated by reference herein in its entirety.

BACKGROUND

1. Field

Embodiments relate to an organic light emitting diode display (OLED display) including a capping layer having a high refractive index.

2. Description of the Related Art

An OLED display is a self-emission type display device that displays an image using an organic light emitting diode (OLED) that emits light. An OLED display does not require a separate light source, which is different from liquid crystal display devices, thereby having relatively small thickness and light weight. Further, the OLED display may exhibit excellent properties such as low power consumption, high luminance, and high speed of response, and thus has drawn attention as a display device of the next generation.

The OLED may include a hole injection electrode, an organic light emitting layer, and an electron injection electrode. A hole and an electron may be respectively supplied from the hole injection electrode and the electron injection electrode into an organic light emitting layer, and may then be combined with each other therein to form an exciton. The OLED emits light by energy generated when the exciton falls from an excited state to a ground state.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Embodiments are directed to an organic light emitting diode display (OLED display) including a capping layer having a high refractive index.

The embodiments may be realized by providing CLAIM LANGUAGE TO BE ADDED an organic light emitting diode display including a first substrate; a first electrode on the first substrate; an organic light emitting layer on the first electrode; a second electrode on the organic light emitting layer; and a capping layer on the second electrode, wherein the capping layer includes at least one heterocyclic compound, the heterocyclic compound including a carbazole group and a heterocyclic group bonded with the carbazole group.

The heterocyclic compound may be represented by one of the following Chemical Formulae 1 to 5:

[Chemical Formula 1]

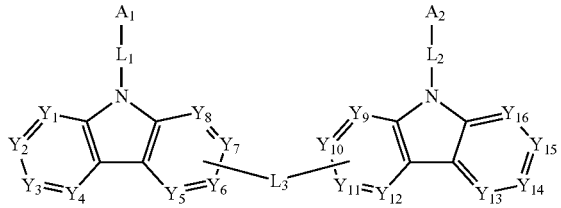

[Chemical Formula 2]

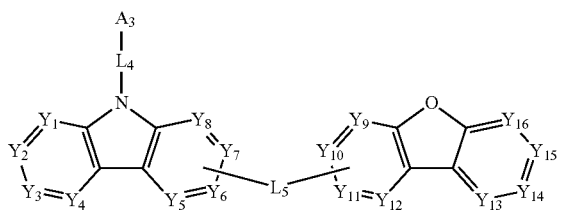

[Chemical Formula 3]

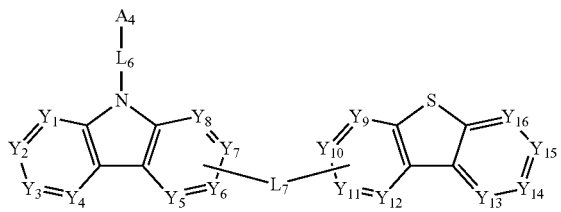

[Chemical Formula 4]

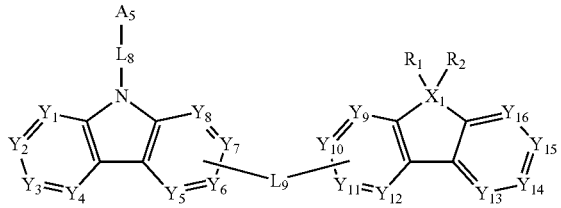

[Chemical Formula 5]

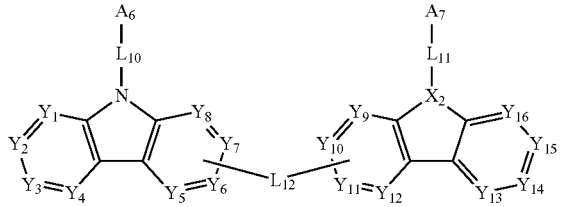

wherein, in Chemical Formulae 1 to 5, $A_1$ to $A_7$ may each independently be or include a substituted or unsubstituted aromatic hydrocarbon group having 6 to 30 ring carbon atoms or a substituted or unsubstituted aromatic heterocyclic group having 1 to 30 ring carbon atoms; $Y_1$ to $Y_{16}$ may each independently be C—R or a nitrogen atom, wherein each R of the C—R may independently be one of a hydrogen atom, a substituted or unsubstituted aromatic hydrocarbon group having 6 to 30 ring carbon atoms, a substituted or unsubstituted aromatic heterocyclic group having 1 to 30 ring carbon atoms, a substituted or unsubstituted alkyl group having 1 to 30 carbon atoms and having a linear, branched, or cyclic structure, a substituted or unsubstituted alkoxy group having 1 to 30 carbon atoms, a substituted or unsubstituted aryloxy group having 6 to 30 ring carbon atoms, a substituted or unsubstituted aralkyl group having 7 to 30 carbon atoms, a substituted or unsubstituted haloalkyl group having 1 to 30 carbon atoms, a substituted or unsubstituted haloalkoxy group having 1 to 30 carbon atoms, a substituted or unsubstituted alkylsilyl group having 3 to 30 carbon atoms, a substituted or unsubstituted dialkylarylsilyl group having 8 to 40 carbon atoms, a substituted or unsubstituted alkyldiarylsilyl group having 13 to 50 carbon atoms, a substituted or unsubstituted triarylsilyl group having 18 to 60 carbon atoms, a substituted or unsubstituted alkenyl group having 2 to 30 carbon atoms, a substituted or unsubstituted alkynyl group having 2 to 30 carbon atoms, a halogen atom, cyano group, a hydroxyl group, a nitro group, or a carboxyl group; R of adjacent C—R, when two of $Y_1$ to $Y_{16}$ that are adjacent to each other are C—R, may be separate or may be combined to form a cyclic structure; $L_1$ to $L_{12}$ may each independently be a single bond or a connecting group; $X_1$ may be carbon or silicon; $R_1$ and $R_2$ may each independently be or include a hydrogen atom, a substituted or unsubstituted aromatic hydrocarbon group having 6 to 30 ring carbon atoms, a substituted or unsubstituted aromatic heterocyclic group having 1 to 30 ring carbon atoms, or a substituted or unsubstituted alkyl group having 1 to 30 carbon atoms, $R_1$ and $R_2$ being separate or bonded together to form a cyclic structure; and $X_2$ may be boron, phosphorus, or P=O.

The compound represented by Chemical Formula 1 may be one of the following Compounds 1 to 48:

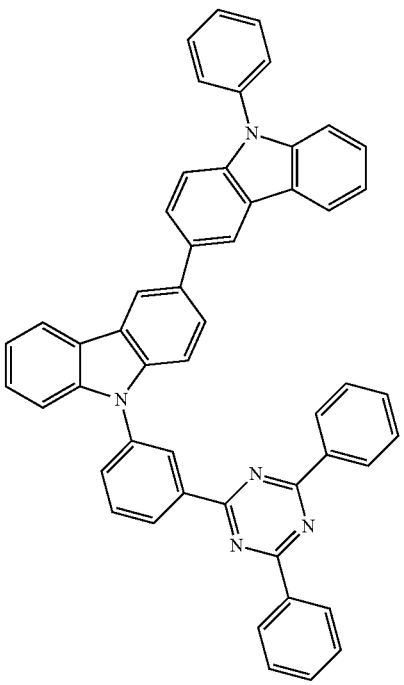

[1]

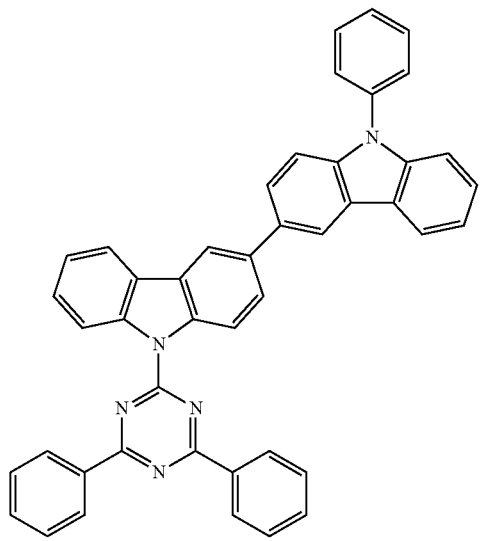

[2]

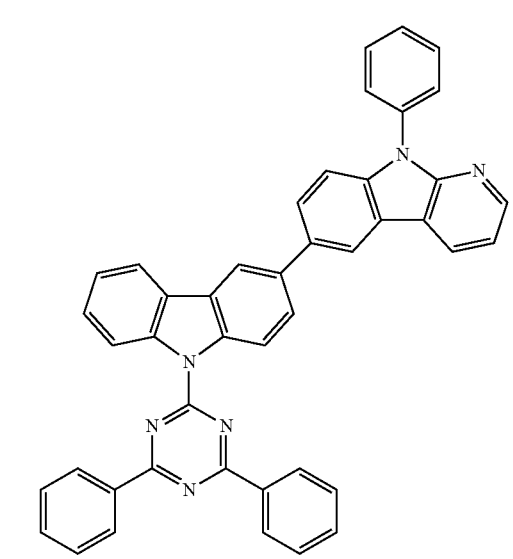

[3]

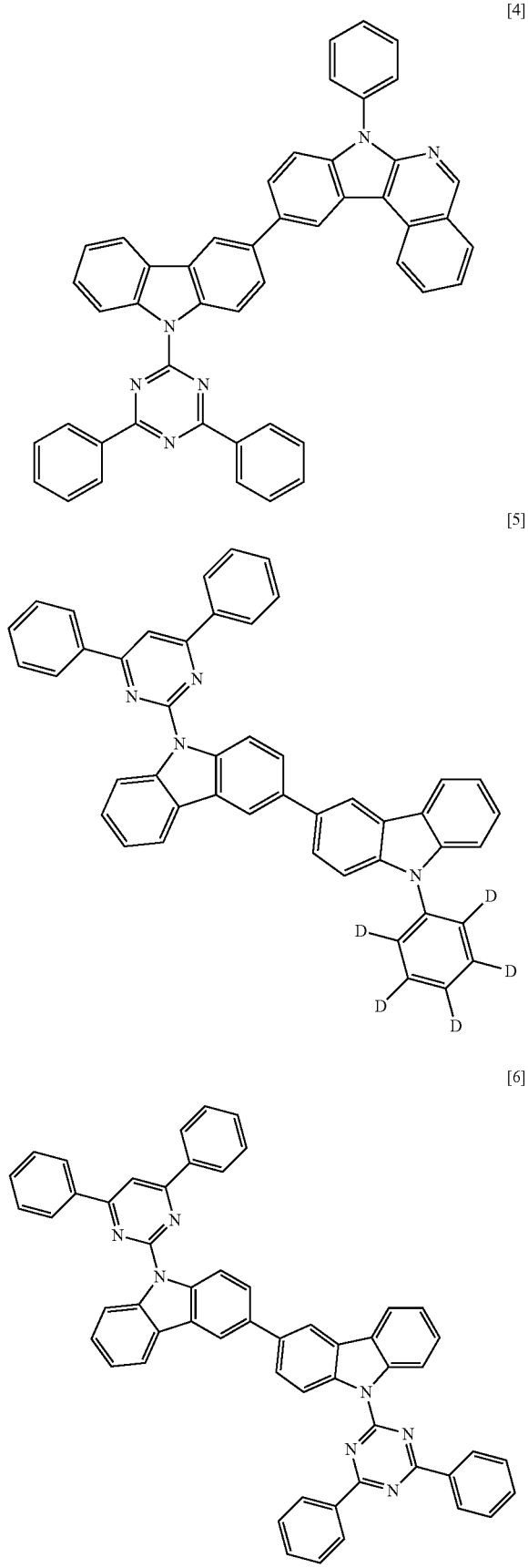 [SMILES: c1ccc(-c2nc(-c3ccccc3)nc(-n3c4ccccc4c4cc(-c5ccc6c(c5)c5c7ccccc7cnc5n6-c5ccccc5)ccc43)n2)cc1 ; [2H]c1c([2H])c([2H])c(-n2c3ccccc3c3cc(-c4ccc5c(c4)c4ccccc4n5-c4nc(-c5ccccc5)cc(-c5ccccc5)n4)ccc32)c([2H])c1[2H] ; c1ccc(-c2cc(-c3ccccc3)nc(-n3c4ccccc4c4cc(-c5ccc6c(c5)c5ccccc5n6-c5nc(-c6ccccc6)nc(-c6ccccc6)n5)ccc43)n2)cc1]
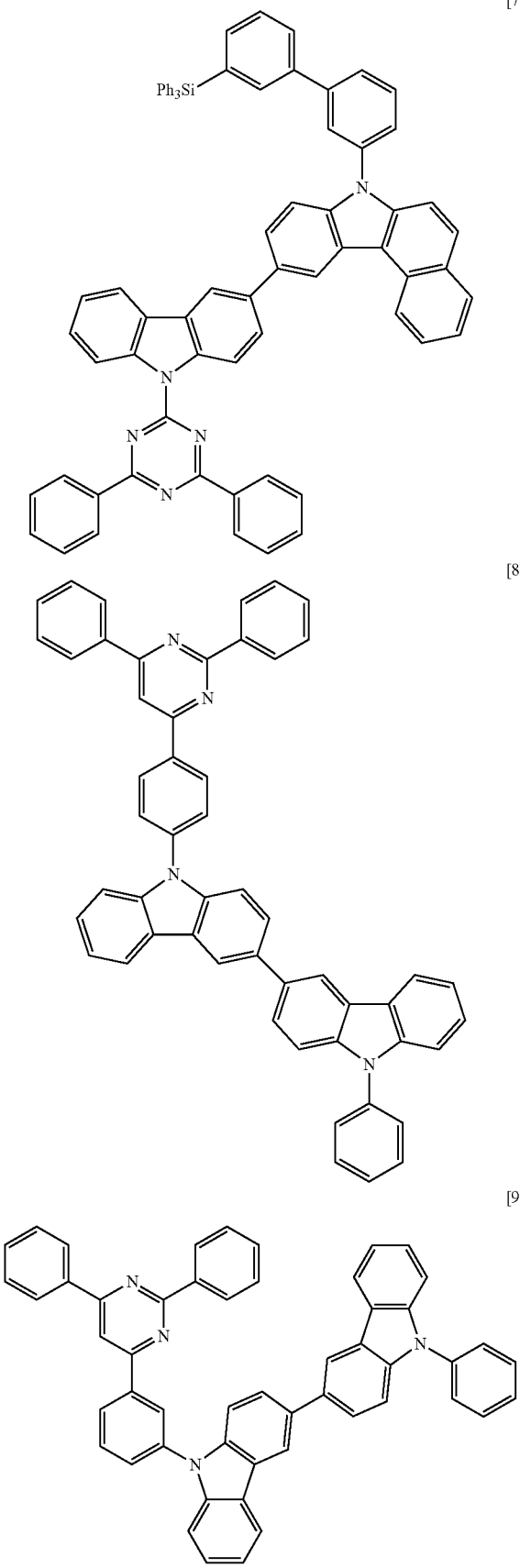

[10]
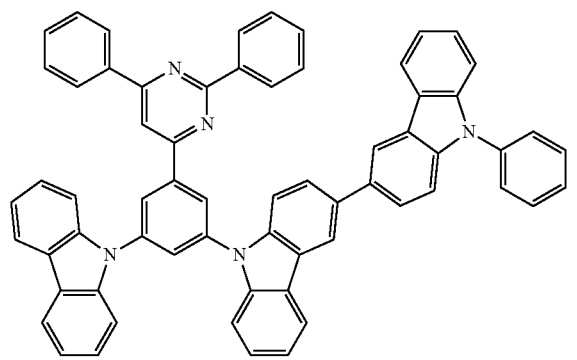
[11]
[12]
[13]
[14]
[15]

[16]
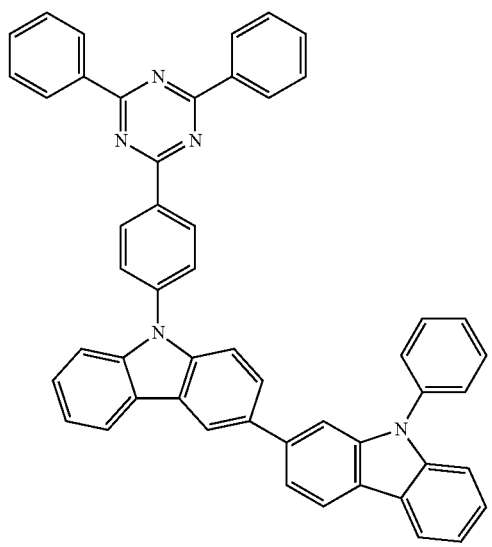
[17]
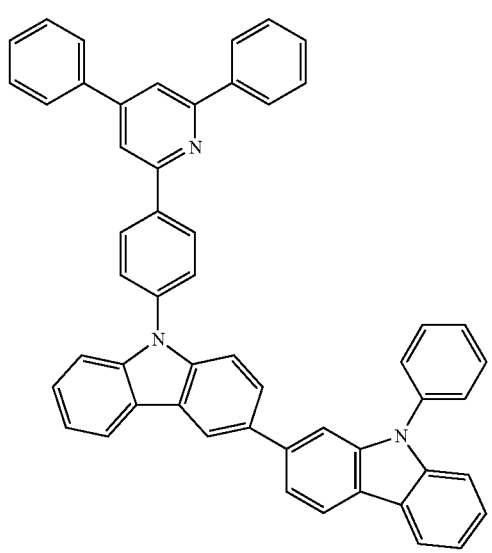
[18]
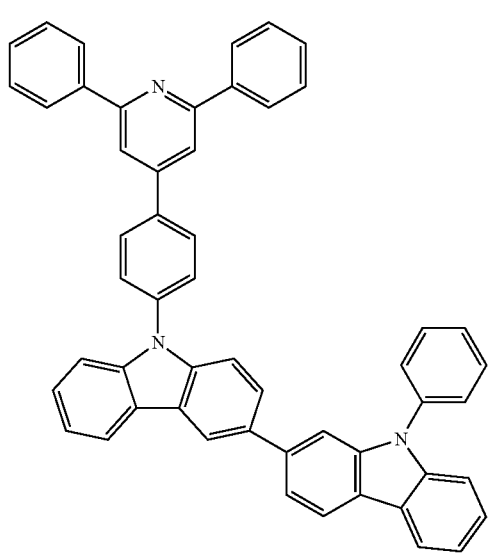
[19]
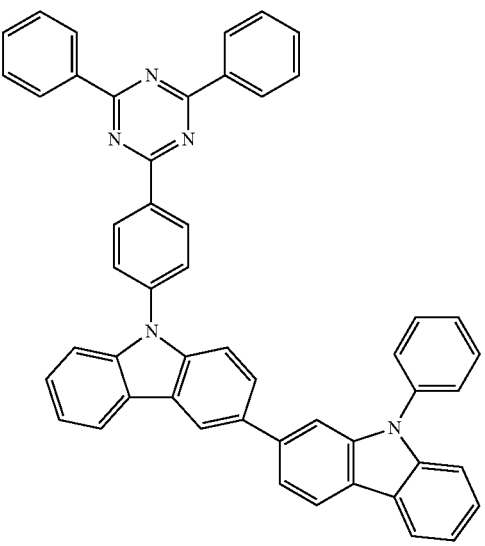
[20]
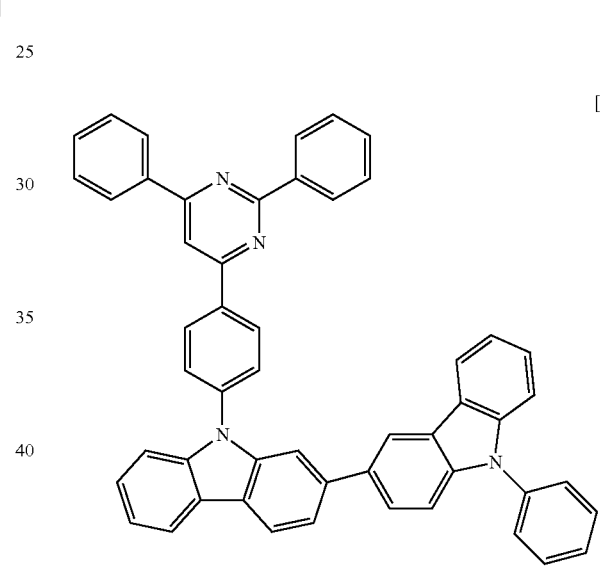
[21]
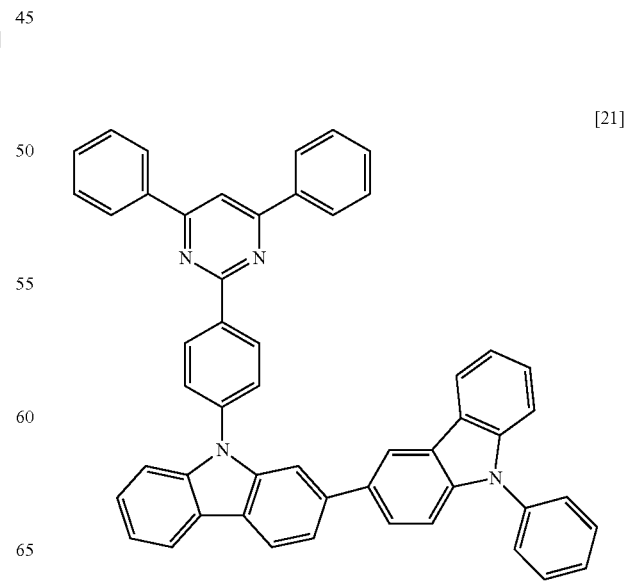

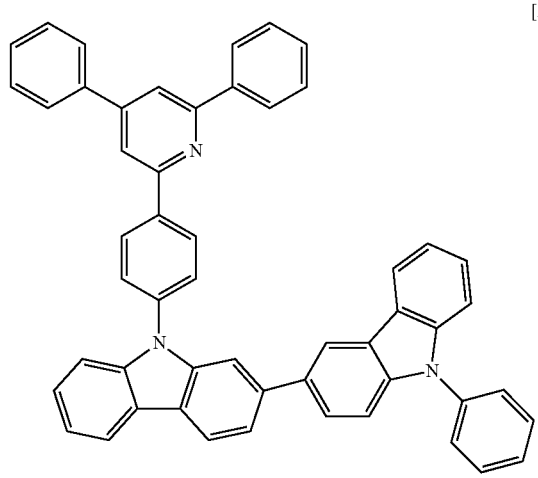
[22]
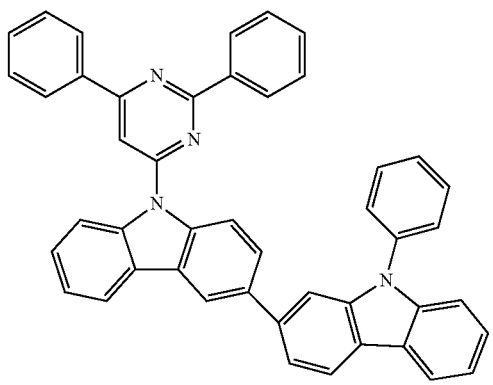
[25]
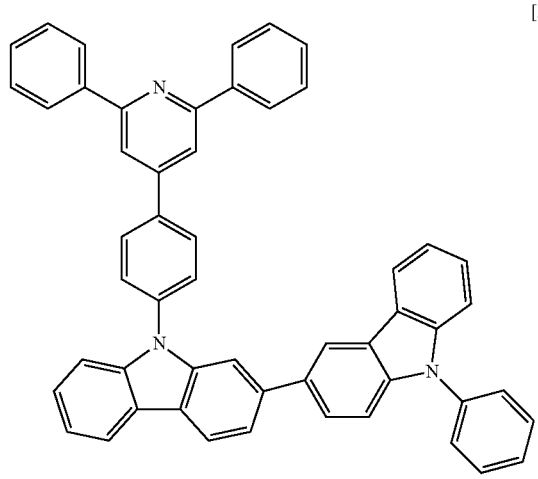
[23]
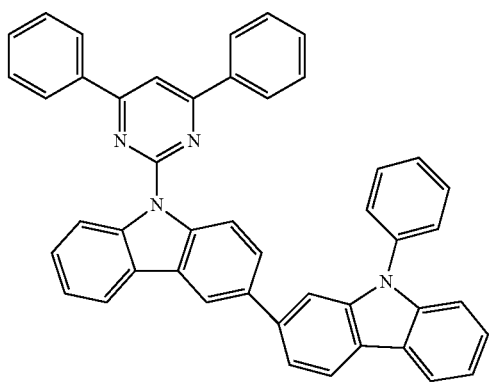
[26]
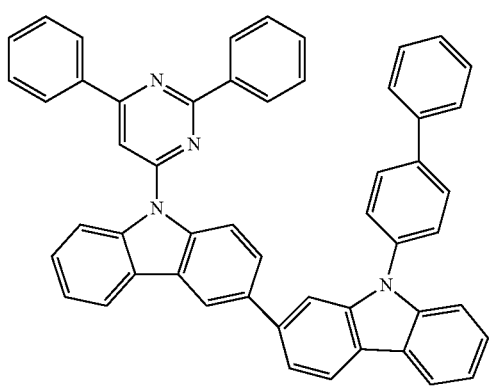
[27]
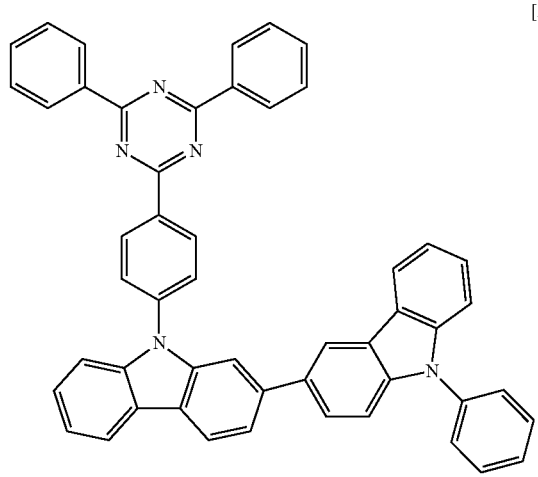
[24]
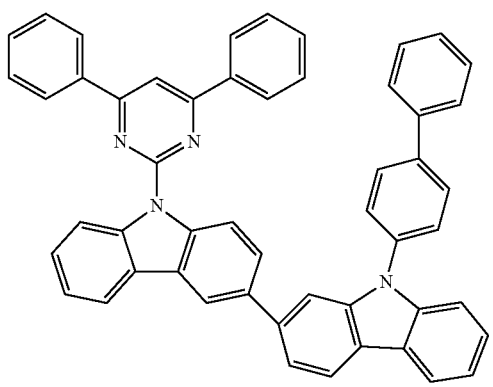
[28]

[29]
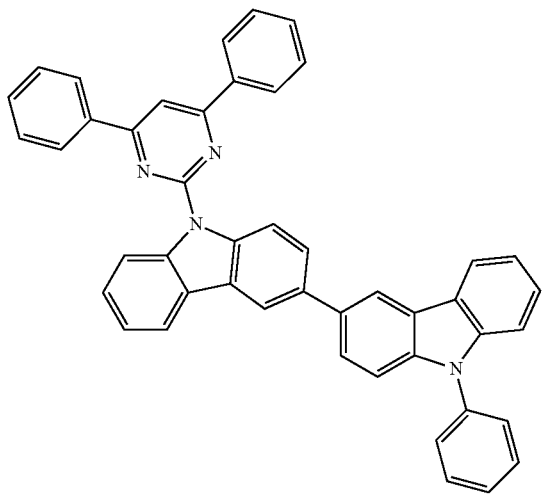
[30]
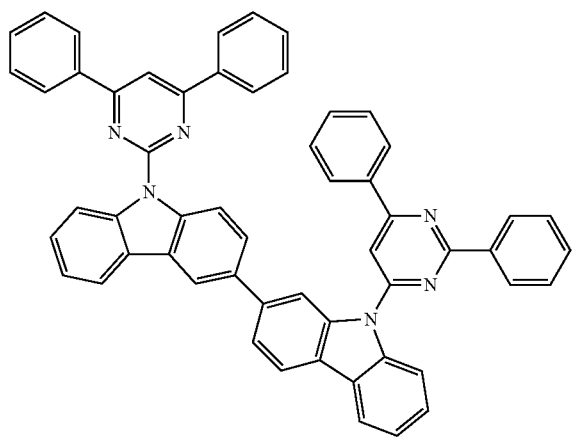
[31]
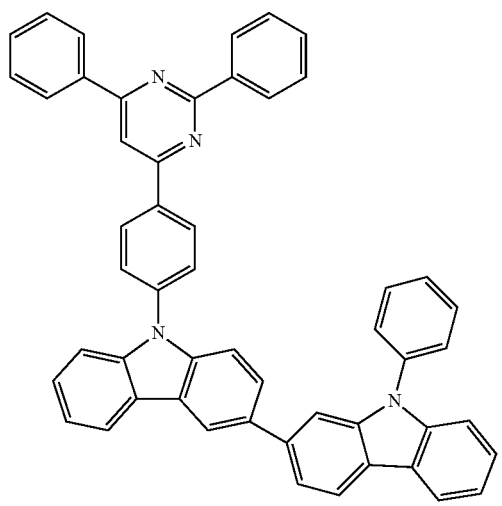
[32]
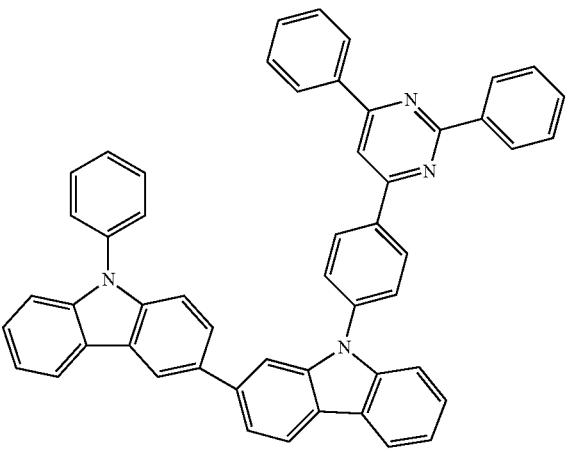
[33]
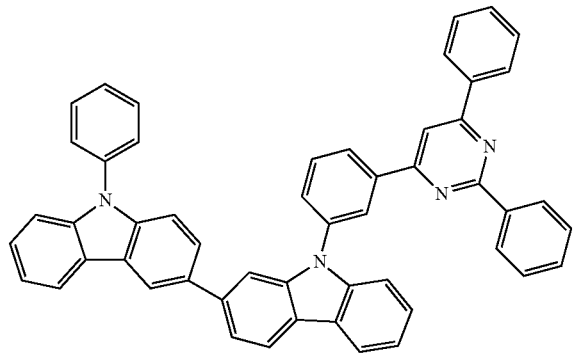
[34]

[35]
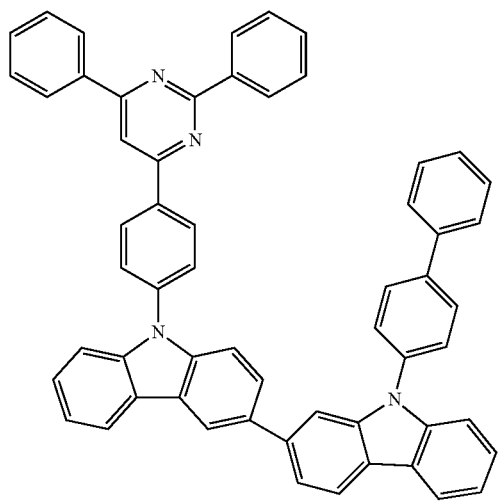
[36]
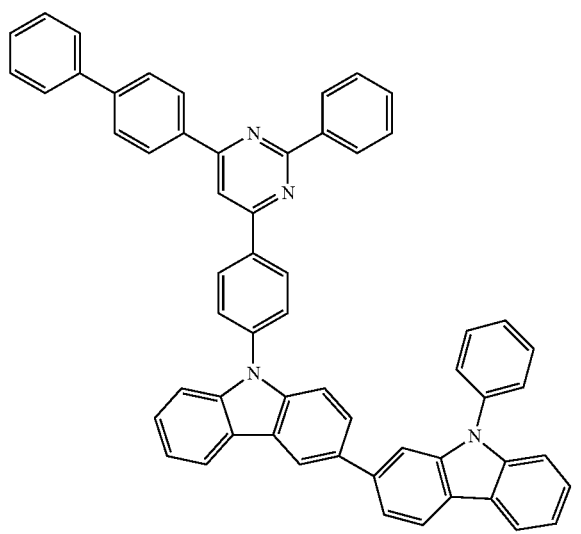
[37]
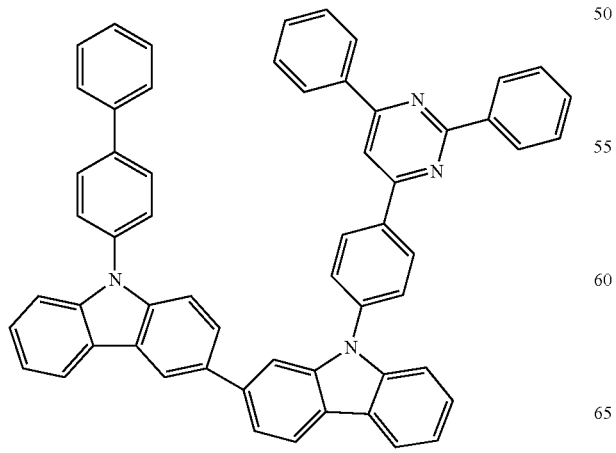
[38]
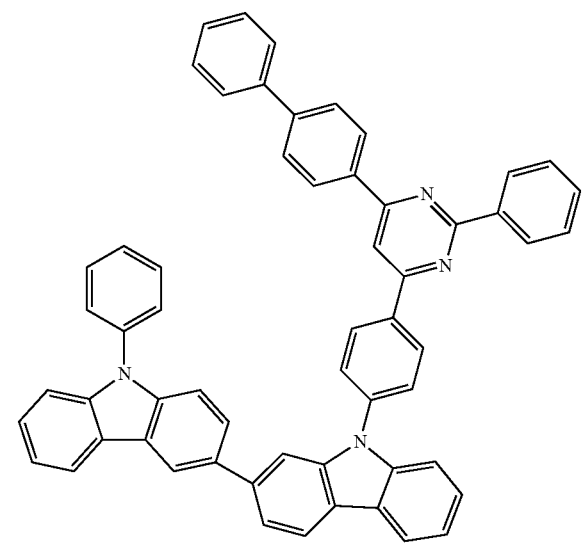
[39]
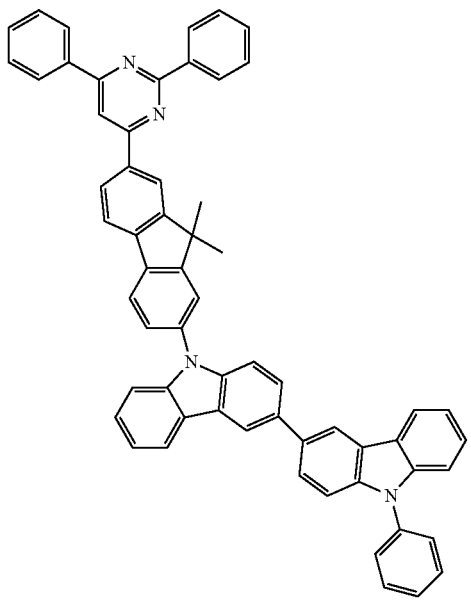

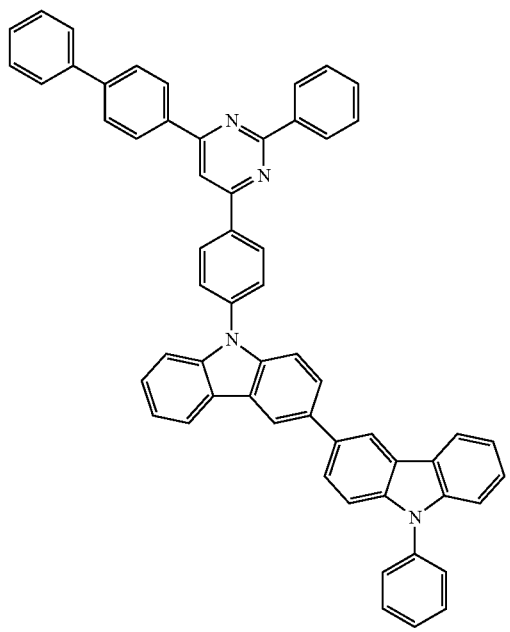
[40]
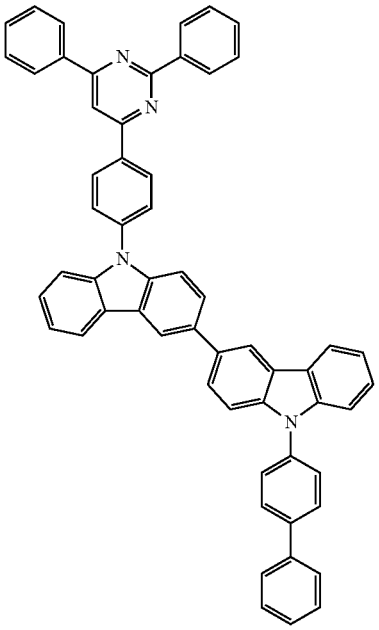
[42]
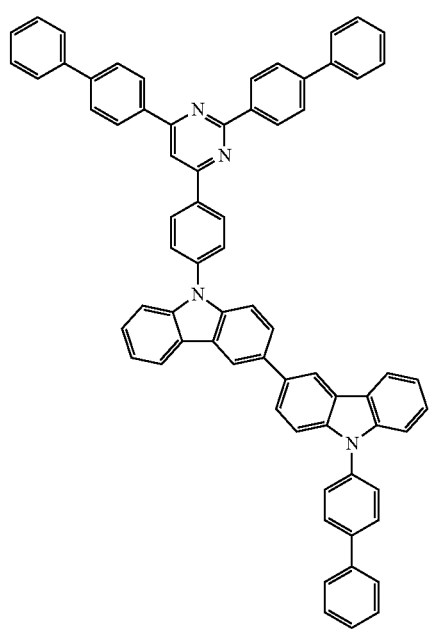
[41]
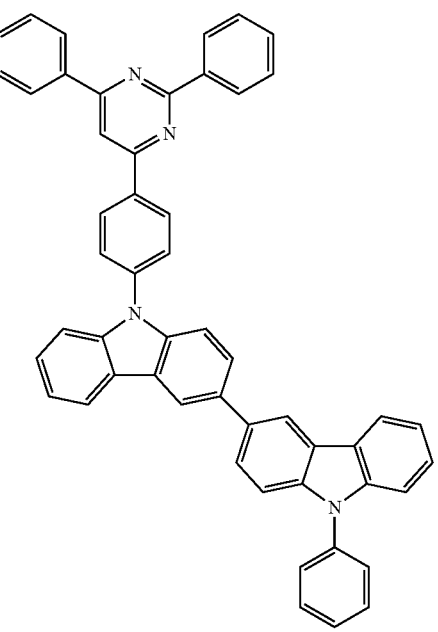
[43]

[44]
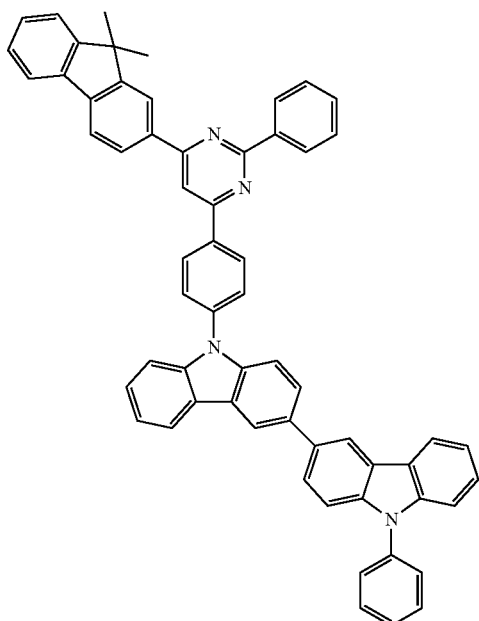
[45]
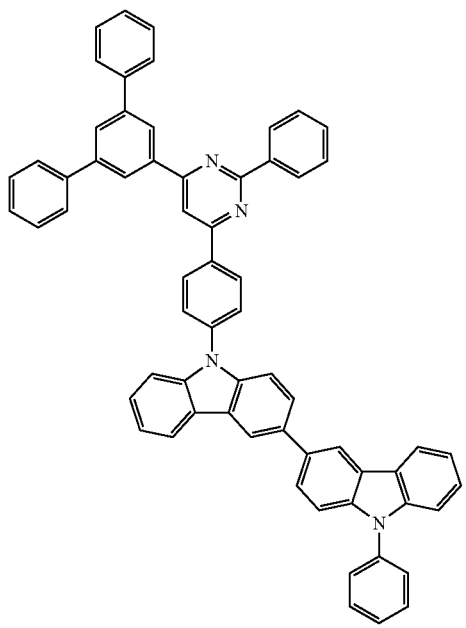
[46]
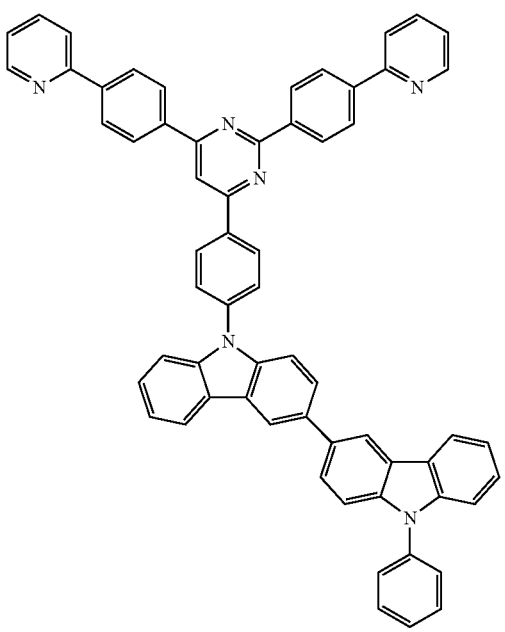
[47]
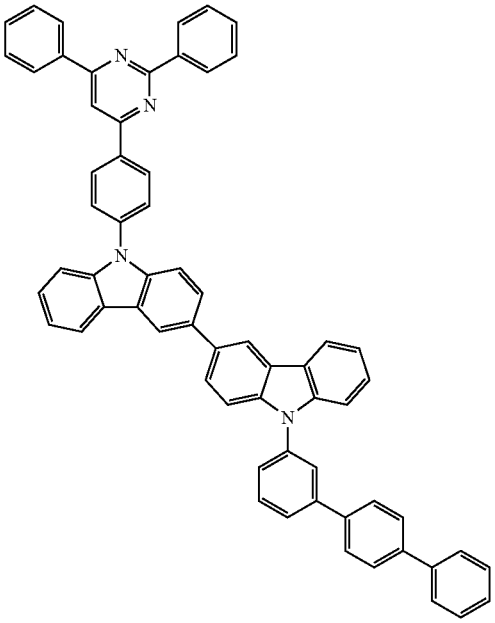

[48]
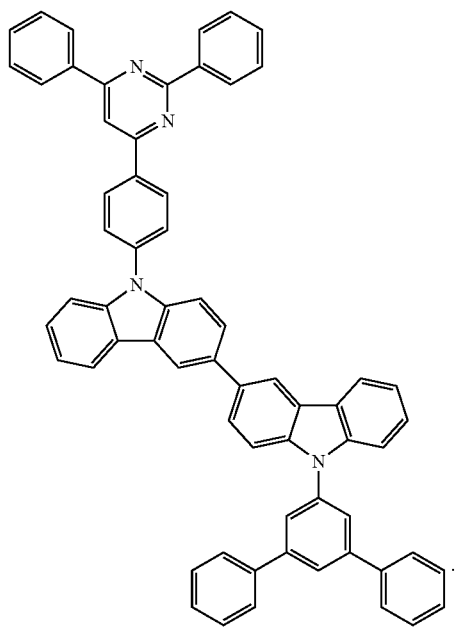
[51]
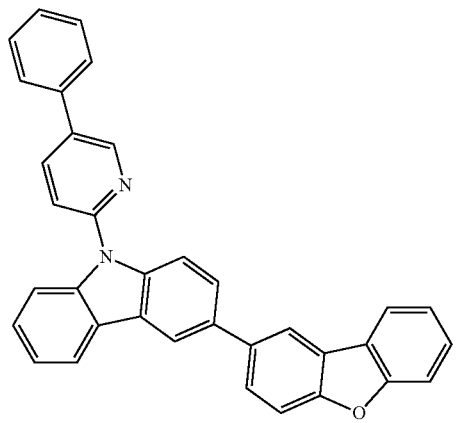
The compound represented by Chemical Formula 2 may be one of the following Compounds 49 to 73.
[49]
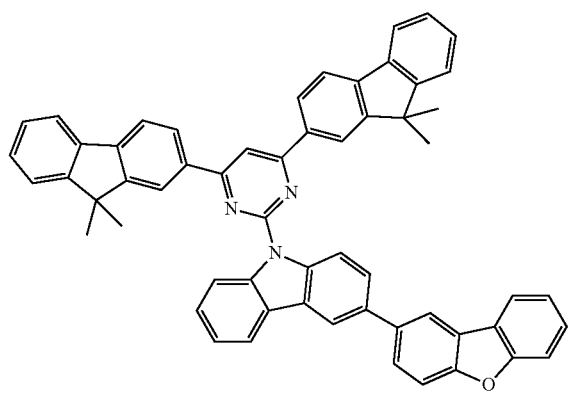
[52]
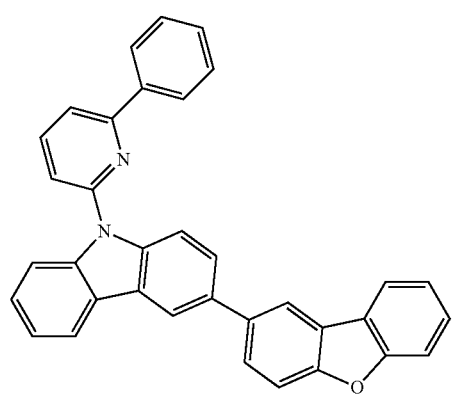
[53]
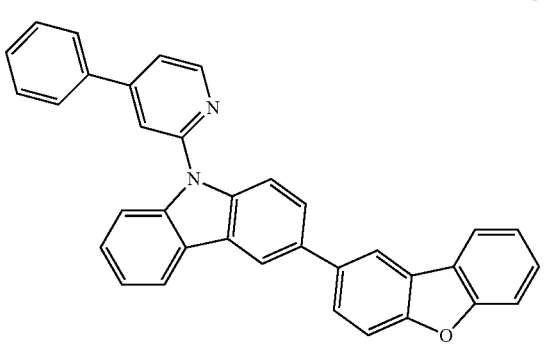
[50]
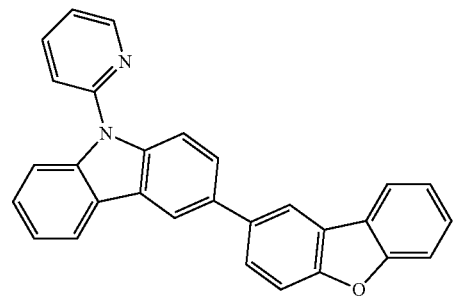
[54]
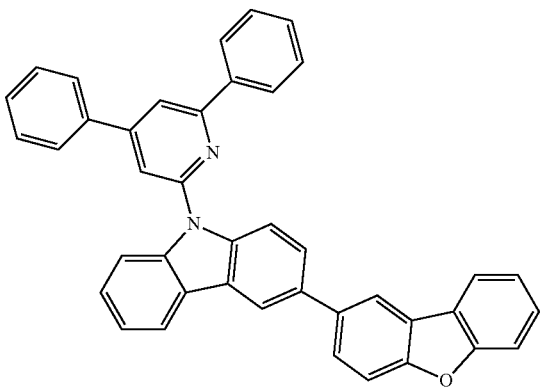

[55]
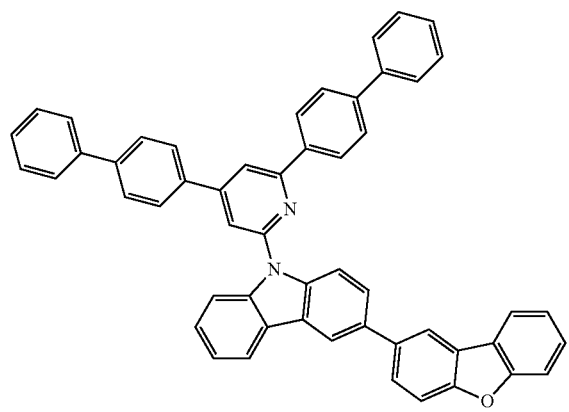
[56]
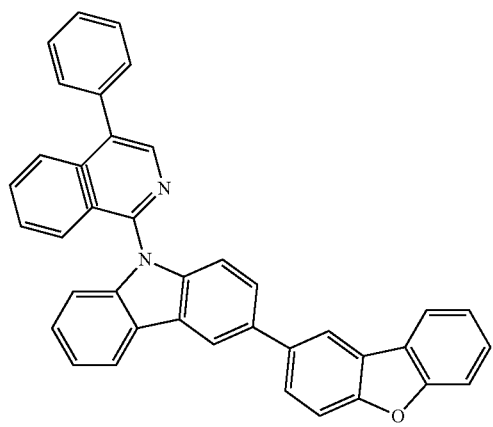
[57]
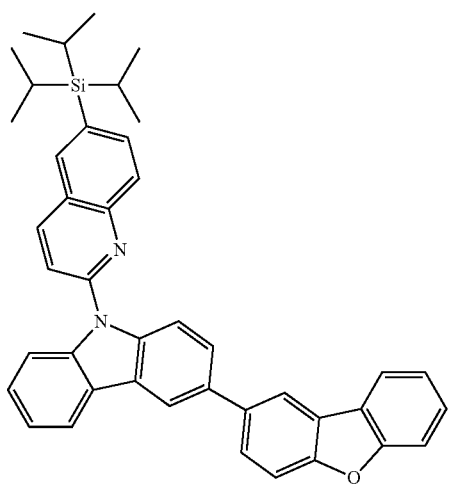
[58]
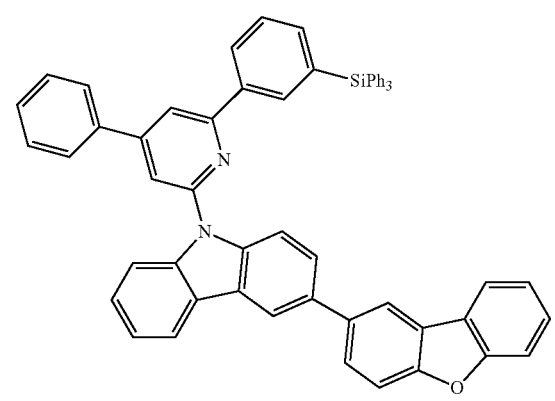
[59]
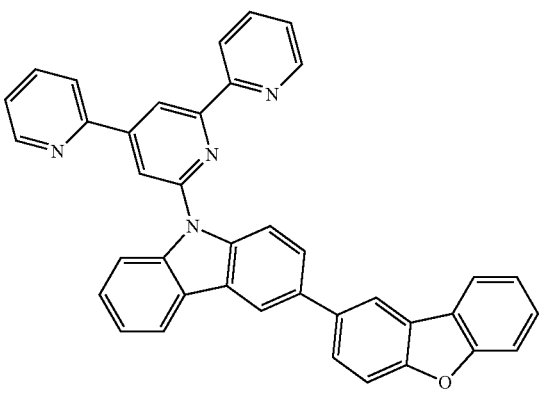
[60]
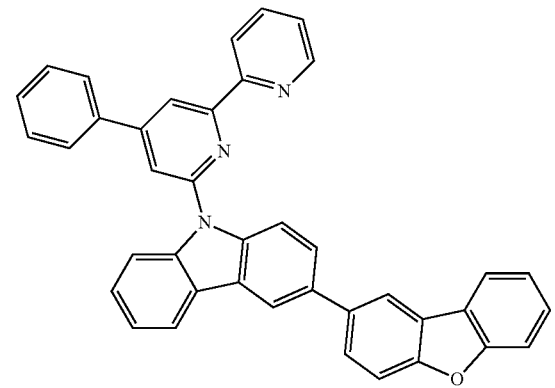

[61]
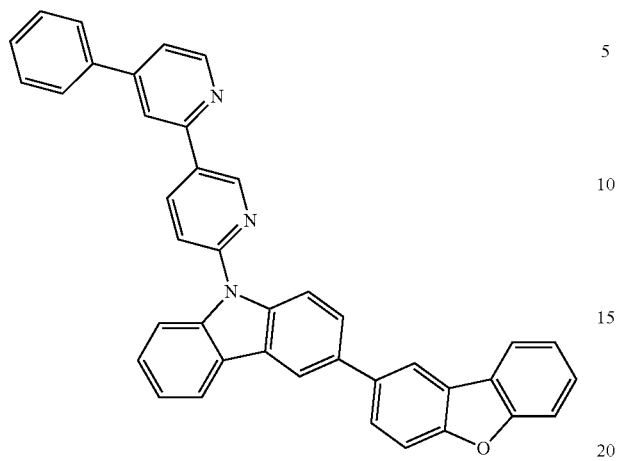
[62]
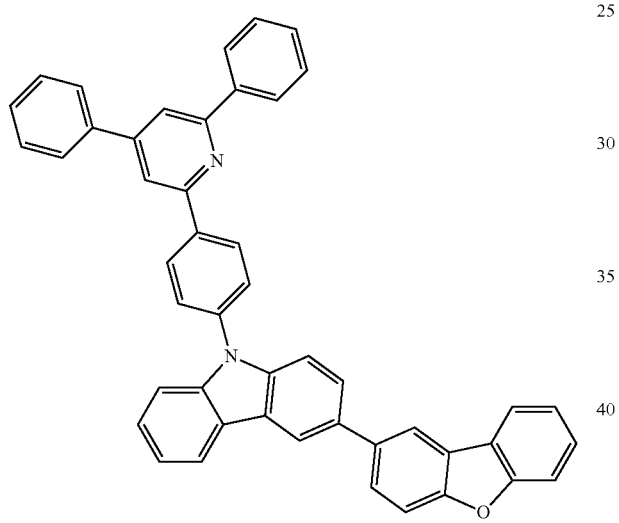
[63]
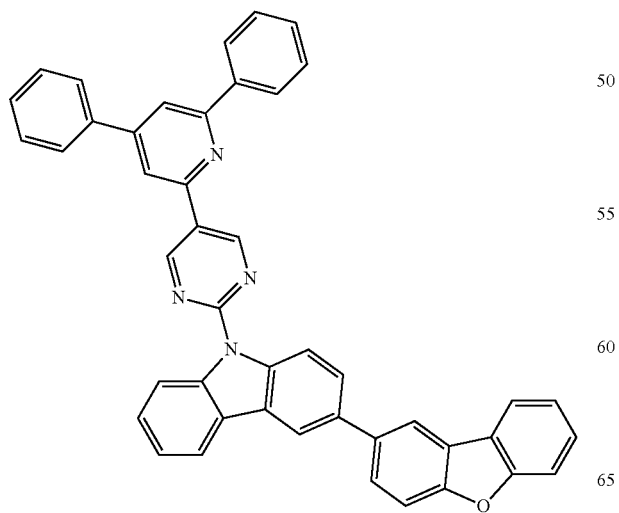
[64]
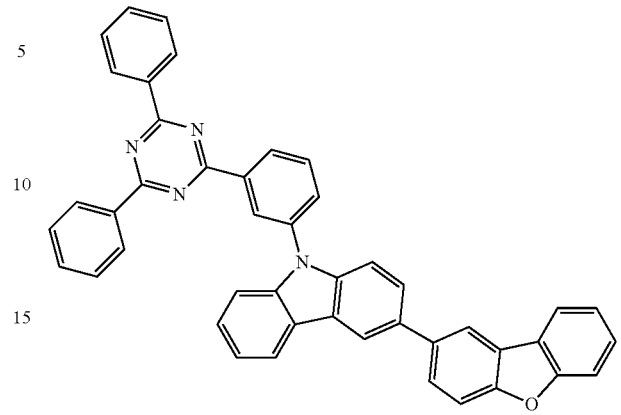
[65]
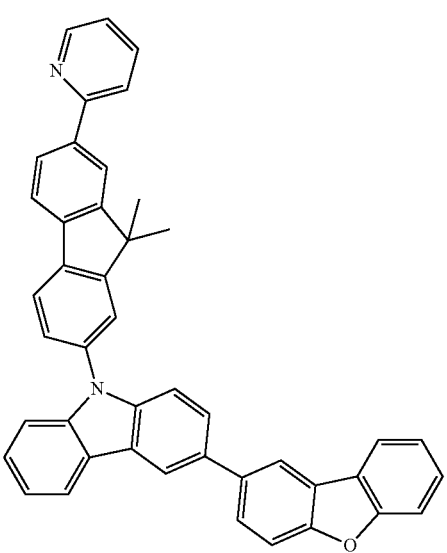
[66]

-continued
[67]
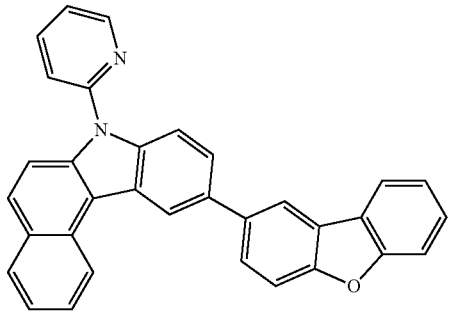
[68]
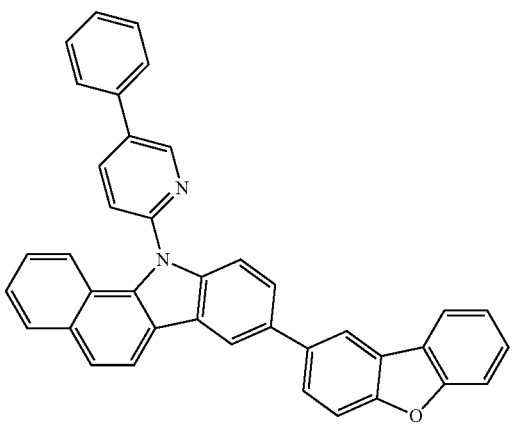
[69]
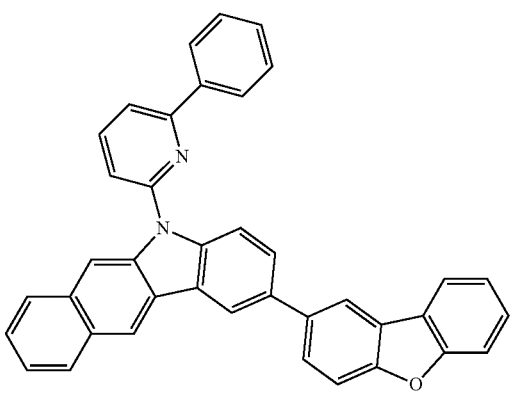
[70]
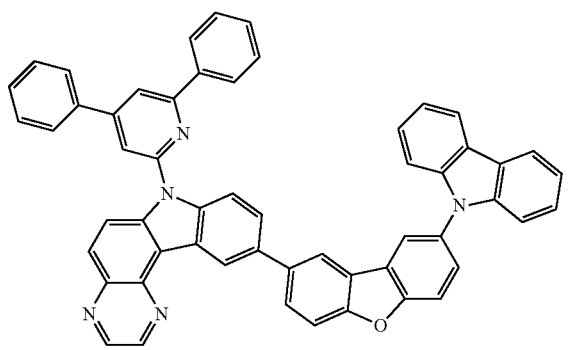
-continued
[71]
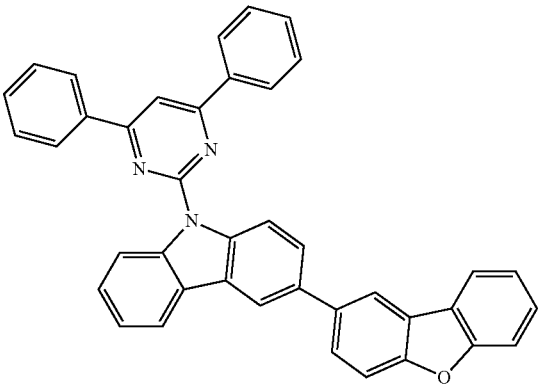
[72]
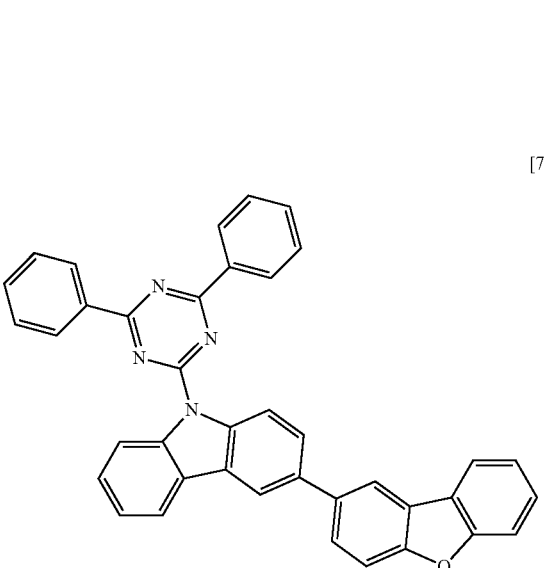
[73]
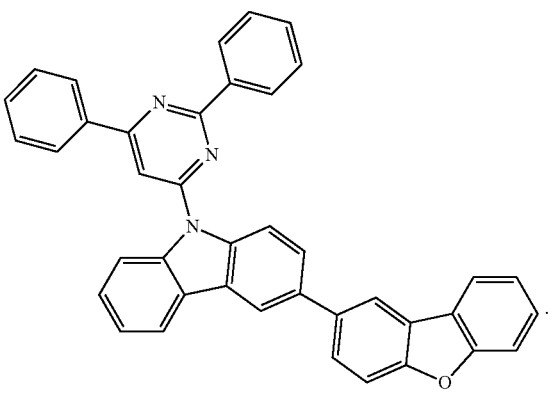

The compound represented by Chemical Formula 3 may be one of the following Compounds 74 to 78.
[74]
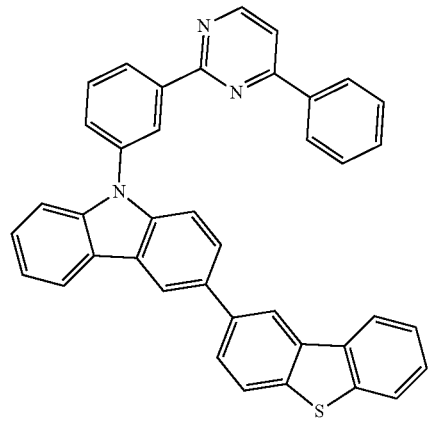
[75]
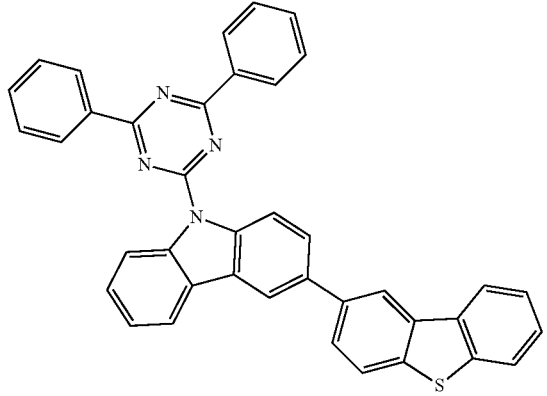
[76]
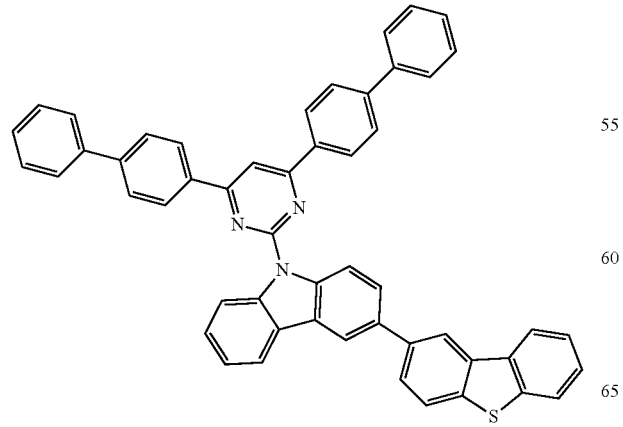
[77]
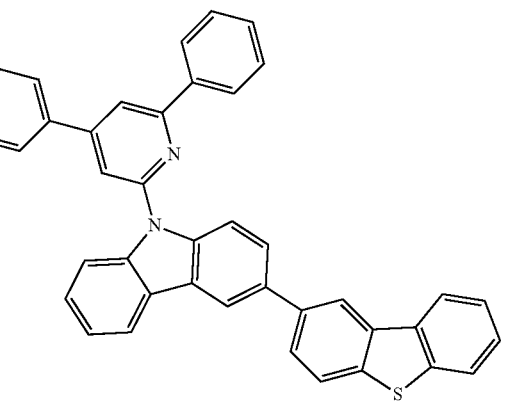
[78]
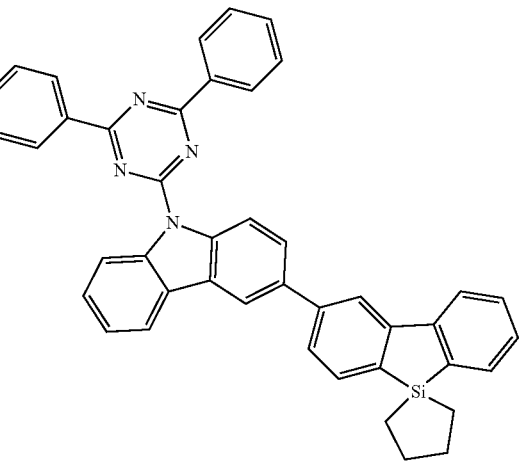
The compound represented by Chemical Formula 4 may be one of the following Compounds 79 to 84.
[79]

[80]
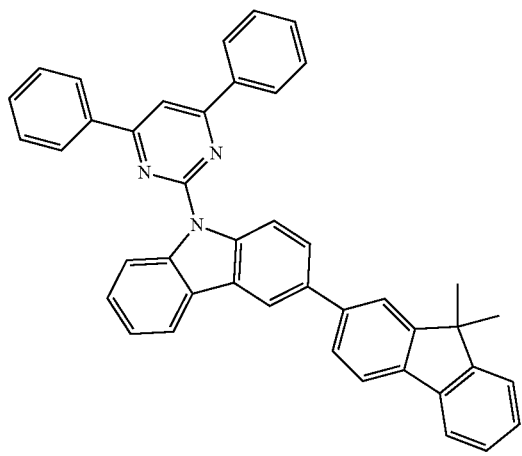
[81]
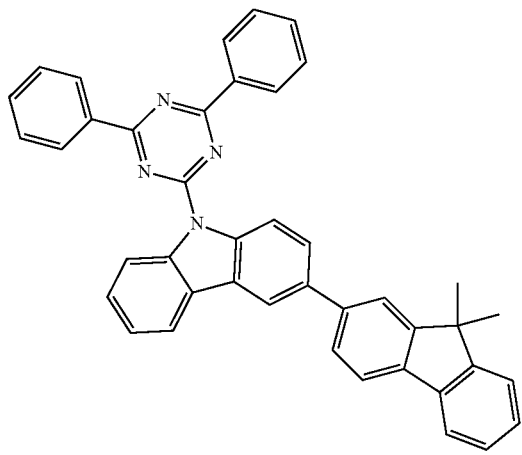
[82]
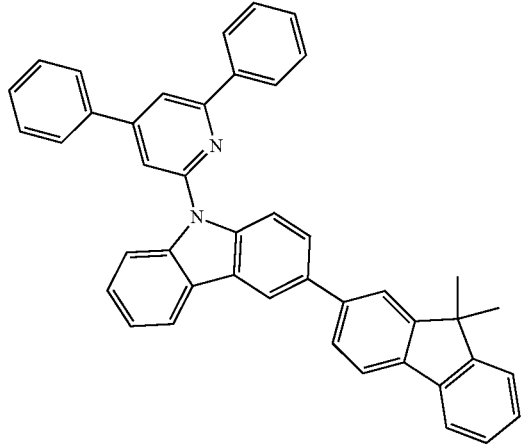
[83]
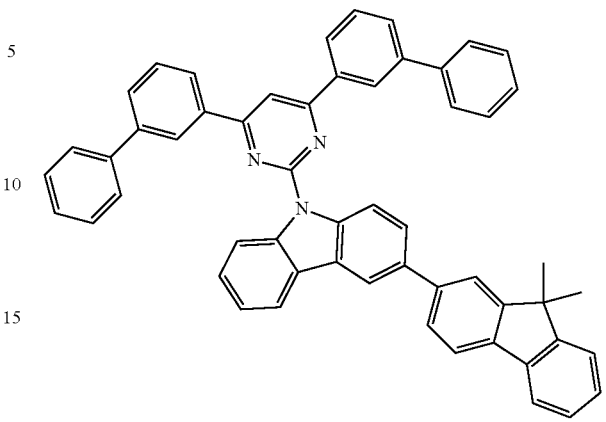
[84]
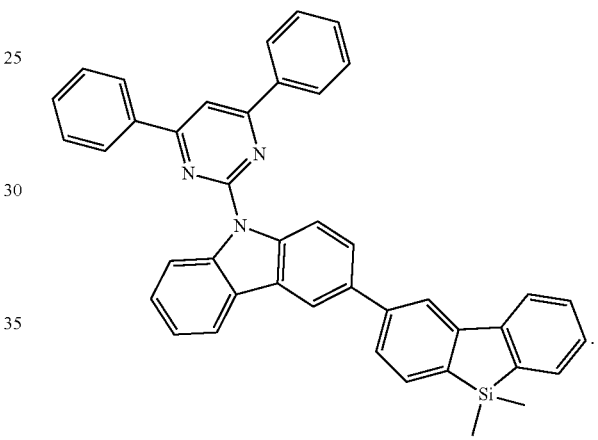
The compound represented by Chemical Formula 5 may be one of the following Compounds 85 to 88.
[85]
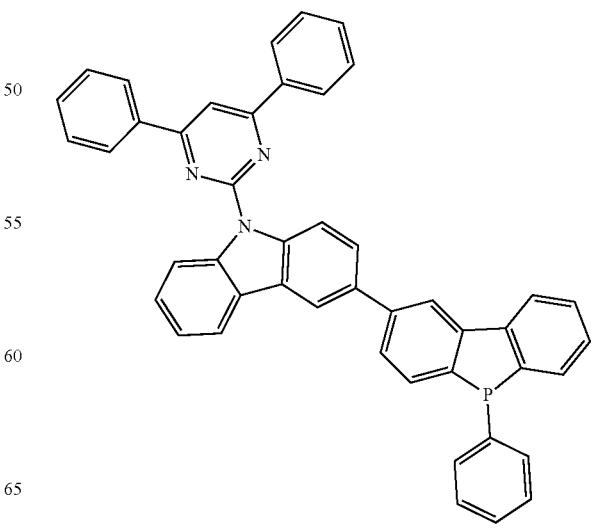

-continued

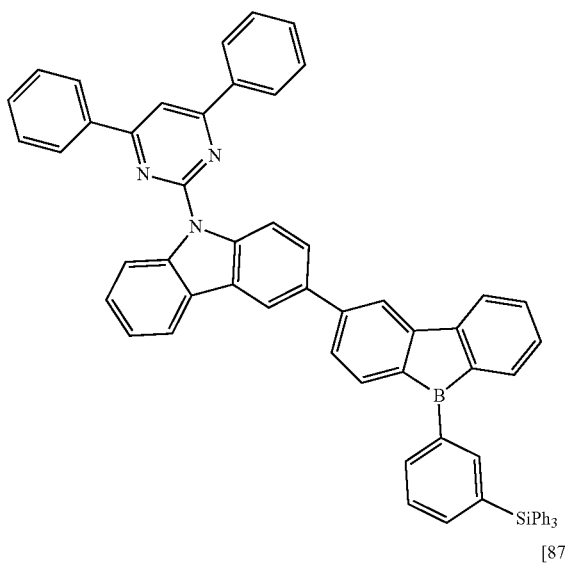

[87]

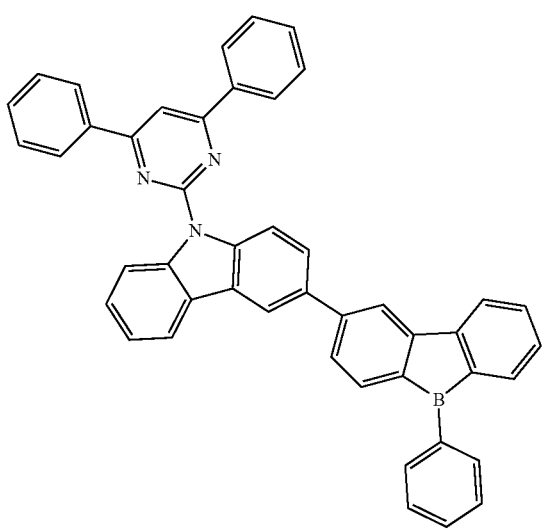

[88]

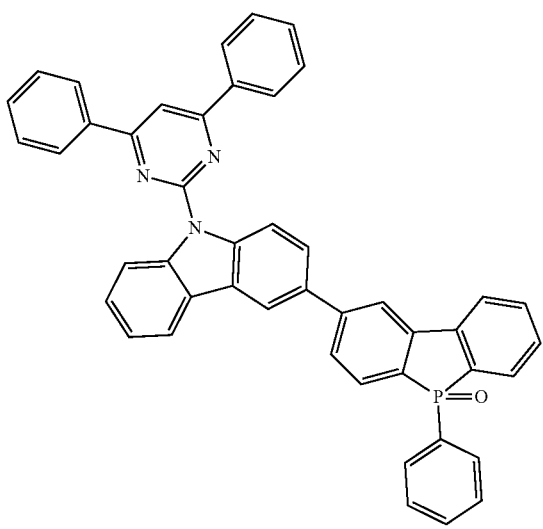

The capping layer may have a refractive index of about 1.9 or higher.

The capping layer may have a refractive index of about 1.9 to about 3.0.

The capping layer may have a thickness of about 80 nm to about 900 nm.

The organic light emitting diode display may further include at least one of a hole injection layer and a hole transporting layer between the first electrode and the organic light emitting layer.

The organic light emitting diode display may further include at least one of an electron transporting layer and an electron injection layer between the organic light emitting layer and the second electrode.

The organic light emitting diode display may further include a second substrate on the capping layer, the second substrate being spaced apart from the capping layer.

The organic light emitting diode display may further include an air layer in a space between the capping layer and the second substrate.

The organic light emitting diode display may further include a filling member in a space between the capping layer and the second substrate.

The organic light emitting diode display may further include a thin film encapsulation layer on the capping layer.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
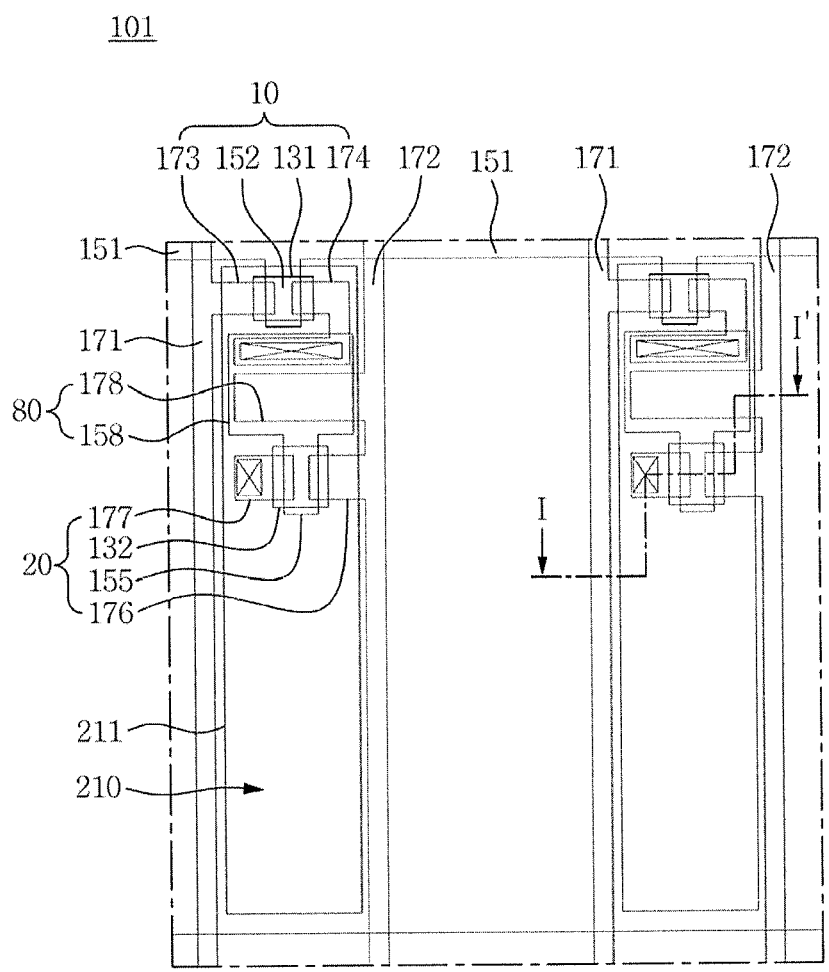
FIG. 1 illustrates a plan view of an organic light emitting diode display (OLED display) according to a first exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. In addition, it will also be understood that when an element is referred to as being "between" two elements, it can be the only element between the two elements, or one or more intervening elements may also be present. Like reference numerals refer to like elements throughout.

All terminologies used herein are merely used to describe embodiments and may be modified according to the relevant art and the intention of an applicant. Therefore, the terms used herein should be interpreted as having a meaning that is consistent with their meanings in the context of the present disclosure, and is not intended to limit the present disclosure.

In addition, when a layer or element is referred to as being "on" another layer or element, the layer or element may be directly on the other layer or element, or one or more intervening layers or elements may be interposed therebetween.

Hereinafter, a first exemplary embodiment will be described with reference to FIGS. 1 and 2.

FIG. 1 illustrates a plan view of an organic light emitting diode display (OLED display) 101 according to the first exemplary embodiment. FIG. 2 illustrates a cross-sectional view taken along line I-I' of FIG. 1.

Figure 2:
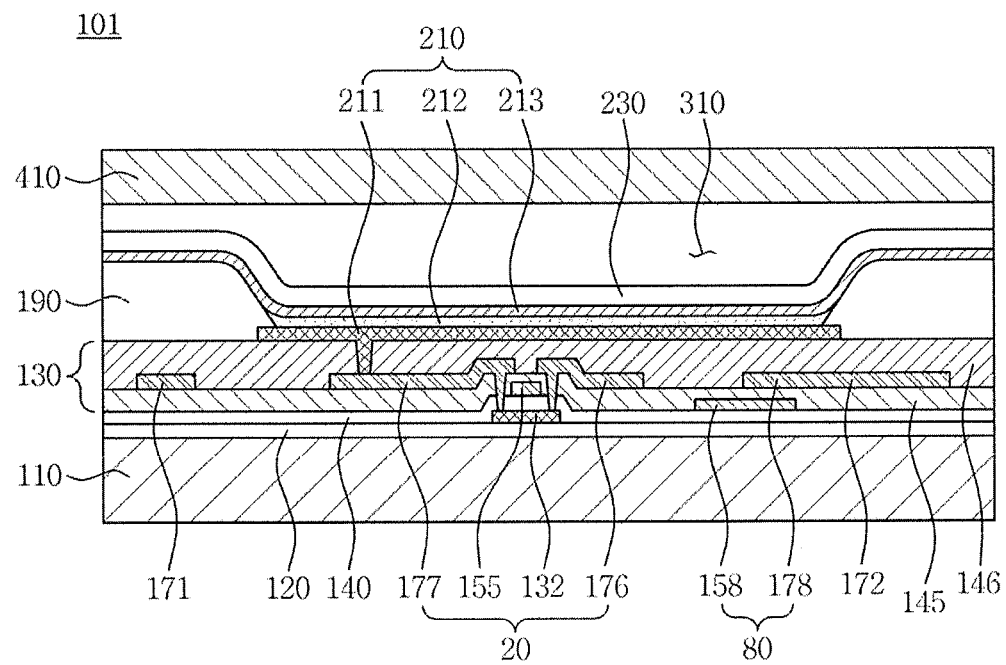
FIG. 2 illustrates a cross-sectional view taken along line I-I' of FIG. 1.

As illustrated in FIGS. 1 and 2, the OLED display 101 according to the first exemplary embodiment may include a first substrate 110, a wiring unit 130, an organic light emitting diode (OLED) 210, a capping layer 230, and a second substrate 410.

The first substrate 110 may include an insulating material of, e.g., glass, quartz, ceramic, plastic, or the like. In an implementation, the first substrate 110 may include a metal material such as stainless steel and the like.

A buffer layer 120 may be disposed on the first substrate 110. The buffer layer 120 may include at least one layer of various inorganic and organic layers. The buffer layer 120 may help prevent or efficiently reduce infiltration of undesirable elements, such as moisture, into the wiring unit 130 and the OLED 210, and may planarize the surface of the first substrate 110. In an implementation, the buffer layer 120 may be omitted.

The wiring unit 130 may be disposed on the buffer layer 120. The wiring unit 130 may refer to a structure including a switching thin film transistor (TFT) 10, a driving TFT 20, and a capacitor 80, and may drive the OLED 210. The OLED 210 may emit light according to a driving signal supplied from the wiring unit 130 to thereby display images.

FIGS. 1 and 2 illustrate an active-matrix (AM)-type OLED display 101 having a 2Tr-1Cap structure. For example, the 2Tr-1Cap structure may include two TFTs 10 and 20 and a capacitor 80 in each pixel. In an implementation, the display according to an exemplary embodiment may include three or more TFTs and two or more capacitors 80 in one pixel, and may further include additional lines. Herein, the term "pixel" refers to the smallest unit for displaying an image, and the OLED display 101 displays an image using a plurality of pixels.

Each pixel may include the switching TFT 10, the driving TFT 20, the capacitor 80, and the OLED 210. Further, a gate line 151 disposed along one direction, a data line 171 and a common power line 172 insulated from and intersecting the gate line 151 may be further disposed on the wiring unit 130. Herein, each pixel may be defined by the gate line 151, the data line 171, and the common power line 172, but is not limited thereto. In an implementation, pixels may be defined by a black matrix and/or a pixel defining layer (PDL).

The OLED 210 may include a first electrode 211, an organic light emitting layer 212 on the first electrode 211, and a second electrode 213 on the organic light emitting layer 212. A hole and an electron may be respectively supplied from the first electrode 211 and the second electrode 213 into the organic light emitting layer 212, and then combined with each other therein to form an exciton. The OLED may emit light by energy generated when the exciton falls from an excited state to a ground state.

The capacitor 80 may include a pair of capacitor plates 158 and 178 with an interlayer insulating layer 145 interposed therebetween. Herein, the interlayer insulating layer 160 may be a dielectric. Capacitance of the capacitor 80 may be determined by electric charges accumulated in the capacitor 80 and voltage across the pair of capacitor plates 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177. Further, a gate insulating layer 140 may be further provided to insulate the semiconductor layers 131 and 132 and the gate electrodes 152 and 155.

The switching TFT 10 may function as a switching element which selects a pixel to perform light emission. The switching gate electrode 152 may be connected to the gate line 151, and the switching source electrode 173 may be connected to the data line 171. The switching drain electrode 174 may be spaced apart from the switching source electrode 173 and connected to a capacitor plate 158.

The driving TFT 20 may apply a driving power, which allows the organic light emitting layer 212 of the OLED 210 in a selected pixel to emit light, to the first electrode 210 serving as a pixel electrode. The driving gate electrode 155 may be connected to the capacitor plate 158 that is connected to the switching drain electrode 174. The driving source electrode 176 and the other capacitor plate 178 may be respectively connected to the common power line 172. The driving drain electrode 177 may be connected to the first electrode 211 of the OLED 210 through a contact hole.

With the aforementioned structure, the switching TFT 10 may be operated by a gate voltage applied to the gate line 151 and may function to transmit a data voltage applied to the data line 171 to the driving TFT 20. A voltage equivalent to a difference between a common voltage applied from the common power line 172 to the driving TFT 20 and the data voltage transmitted by (or from) the switching TFT 10 may be stored in the capacitor 80, and a current corresponding to the voltage stored in the capacitor 80 may flow to the OLED 200 through the driving TFT 20, so that the OLED 210 may emit light.

According to the first exemplary embodiment, the first electrode 211 may serve as an anode to inject holes, and the second electrode 213 may serve as a cathode to inject electrons. In an implementation, the first electrode 211 may serve as a cathode and the second electrode 213 may serve as an anode.

The planarizing layer 146 may be disposed on an interlayer insulating layer 145. The planarizing layer 146 may include insulating materials and may protect the wiring unit 130. The planarizing layer 146 and the interlayer insulating layer 145 may include the same material.

The drain electrode 177 of the driving TFT 20 may be connected to the first electrode 211 of the OLED 210 through a contact hole formed on the planarizing layer 146.

According to the first exemplary embodiment, the first electrode 211 may be a reflective electrode and the second electrode 213 may be a transflective electrode. Therefore, light generated in the organic light emitting layer 212 may pass through the second electrode 213 for light emission. Accordingly, the OLED display 101 according to the first exemplary embodiment may have a top-emission type structure.

One or more metal of magnesium (Mg), silver (Ag), gold (Au), calcium (Ca), lithium (Li), chromium (Cr), aluminum (Al), and copper (Cu), or a metal alloy thereof may be used to form the reflective electrode and/or the transflective electrode.

For example, the first electrode 211 may include a reflective layer including at least one metal of magnesium (Mg), silver (Ag), gold (Au), calcium (Ca), lithium (Li), chromium (Cr), aluminum (Al), and copper (Cu), and a transparent conductive layer disposed on the reflective layer. Herein, the transparent conductive layer may include a transparent conductive oxide (TCO), e.g., at least one of indium tin oxide (ITO), indium zinc oxide (IZO), zinc oxide (ZnO), aluminum zinc oxide (AZO), and indium oxide ($In_2O_3$). Such transparent conductive layer may have a relatively high work function, thereby allowing more active hole injection through the first electrode 211.

Further, the first electrode 211 may have a triple-layer structure including a transparent conductive layer, a reflective layer, and a transparent conductive layer that are sequentially laminated.

In an implementation, the second electrode 213 may be formed of a transflective layer including one or more metal of magnesium (Mg), silver (Ag), gold (Au), calcium (Ca), lithium (Li), chromium (Cr), aluminum (Al), and copper (Cu).

In an implementation, at least one of a hole injection layer HIL and a hole transporting layer HTL may be further disposed between the first electrode 211 and the organic light emitting layer 212. In an implementation, at least one of an electron transporting layer ETL and an electron injection layer EIL may be further disposed between the organic light emitting layer 212 and the second electrode 213.

A structure including the organic light emitting layer 212, the hole injection layer HIL, the hole transporting layer HTL, the electron transporting layer ETL, and the electron injection layer EIL may be referred to as an organic layer. The organic layer may include a low molecular weight organic material or a high molecular weight organic material.

The pixel defining layer 190 may have an aperture, and the first electrode 211 may be at least partially exposed through the aperture of the pixel defining layer 190. The first electrode 211, the organic light emitting layer 212, and the second electrode 213 may be sequentially laminated within the aperture of the pixel defining layer 190. In an implementation, the second electrode 213 may be also disposed on the pixel defining layer 190 as well as on the organic light emitting layer 212. The pixel defining layer 190 may define a light emission area.

The capping layer 230 may be disposed on the OLED 210. The capping layer 230 may basically protect the OLED 210, and may also allow light emitted in the organic light emitting layer 212 to be efficiently directed outwards.

The capping layer 230 may include a compound that includes a carbazole group or moiety. For example, the capping layer 230 according to the first exemplary embodiment may include at least one heterocyclic compound that includes a carbazole group or moiety and a heterocyclic group or moiety bonded with the carbazole group or moiety.

For example, the heterocyclic group may function as an electron withdrawing group, and the carbazole group may function as an electron donation group. Accordingly, the heterocyclic compound including both the carbazole group and the heterocyclic group bonded with the carbazole group may have dipole moments. The capping layer 230 including such a heterocyclic compound may have a high refractive index, e.g., of higher than about 1.9. For example, the capping layer 230 may have a refractive index of about 1.9 to about 3.0. When the capping layer 230 has a high refractive index, light may be reflected from an interlayer of the capping layer 230 or may be reflected at an interface of the capping layer 230 and another layer or space, such that light resonance may occur.

The heterocyclic compound that includes a carbazole group and a heterocyclic group bonded with a carbazole group may be represented by one of the following Chemical Formulae 1 to 5.

[Chemical Formula 1]

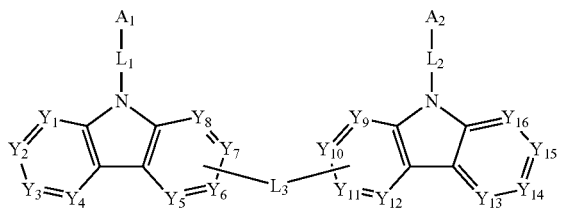

[Chemical Formula 2]

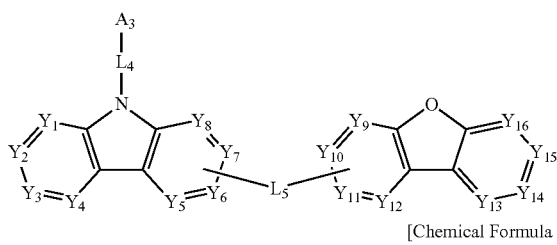

[Chemical Formula 3]

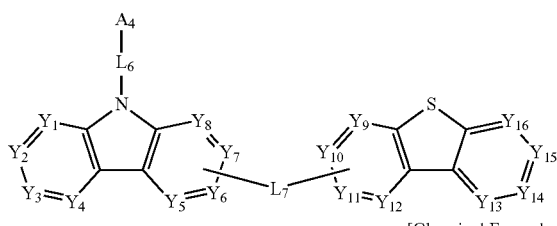

[Chemical Formula 4]

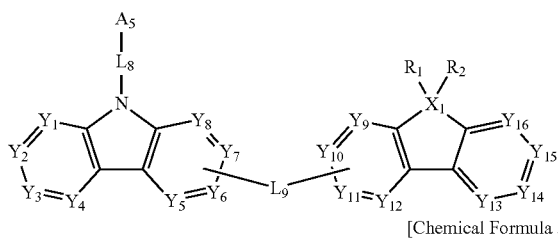

[Chemical Formula 5]

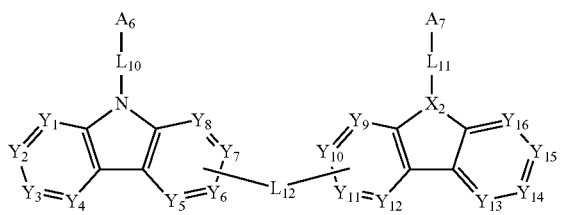

$A_1$ to $A_7$ may each independently be or include, e.g., a substituted or unsubstituted aromatic hydrocarbon group having 6 to 30 ring carbon atoms or a substituted or unsubstituted aromatic heterocyclic group having 1 to 30 ring carbon atoms. In an implementation, one of $A_1$ and $A_3$ to $A_6$ may be or include, e.g., the substituted or unsubstituted aromatic heterocyclic group having 1 to 30 ring carbon atoms.

$Y_1$ to $Y_{16}$ may each independently be C—R or a nitrogen atom.

Each R (of C—R) may independently be or include, e.g., a hydrogen atom, a substituted or unsubstituted aromatic hydrocarbon group having 6 to 30 ring carbon atoms, a substituted or unsubstituted aromatic heterocyclic group having 1 to 30 ring carbon atoms, a substituted or unsubstituted alkyl group having 1 to 30 carbon atoms and forming a linear, branched, or cyclic structure, a substituted or unsubstituted alkoxy group having 1 to 30 carbon atoms, a substituted or unsubstituted aryloxy group having 6 to 30 ring carbon atoms, a substituted or unsubstituted aralkyl group having 7 to 30 carbon atoms, a substituted or unsubstituted haloalkyl group having 1 to 30 carbon atoms, a substituted or unsubstituted haloalkoxy group having 1 to 30 carbon atoms, a substituted or unsubstituted alkylsilyl group having 3 to 30 carbon atoms, a substituted or unsubstituted dialkylarylsilyl group having 8 to 40 carbon atoms, a substituted or unsubstituted alkyldiarylsilyl group having 13 to 50 carbon atoms, a substituted or unsubstituted triarylsilyl group having 18 to 60 carbon atoms, a substituted or unsubstituted alkenyl group having 2 to 30 carbon atoms, a substituted or unsubstituted alkynyl group having 2 to 30 carbon atoms, a halogen atom, a cyano group, a hydroxyl group, a nitro group, or a carboxyl group.

When R is provided in plural, each R may be identical to or different from each other. In an implementation, when two elements of $Y_1$ through $Y_{16}$ adjacent to each other are C—R, R of the adjacent C—R may be separate or may be combined to form a cyclic structure.

$L_1$ to $L_{12}$ may each independently be, e.g., a single bond or a connecting group. In an implementation, the connecting group may include, e.g., an arylene group (such as a phenylene group, a biphenylene group, a terphenylene group, a fluorenylene group, or the like) or a heteroarylene group (such as a pyridine group, a diazine group, a triazine group, a quioline group, an isoquinoline group, or the like).

$X_1$ may be, e.g., carbon (C) or silicon (Si).

$R_1$ and $R_2$ may each independently be or include, e.g., a hydrogen atom, a substituted or unsubstituted aromatic hydrocarbon group having 6 to 30 ring carbon atoms, a substituted or unsubstituted aromatic heterocyclic group having 1 to 30 ring carbon atoms, or a substituted or unsubstituted alkyl group having 1 to 30 carbon atoms. In an implementation, $R_1$ and $R_2$ may be separate or may be bonded together to form a cyclic structure.

$X_2$ may be, e.g., boron (B), phosphorus (P), or P=O.

In an implementation, the compound represented by Chemical Formula 1 may be one of the following Compounds 1 to 48.

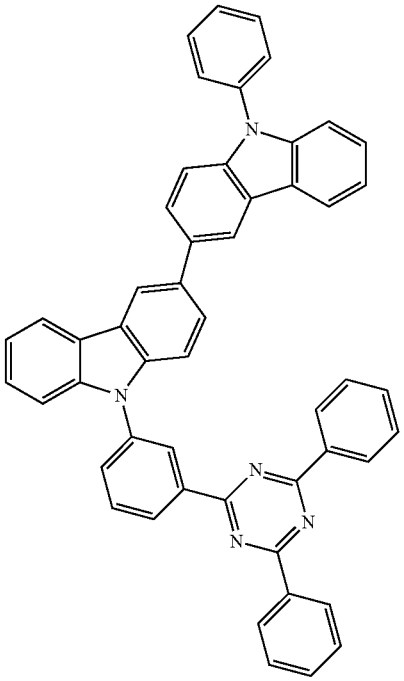

[1]

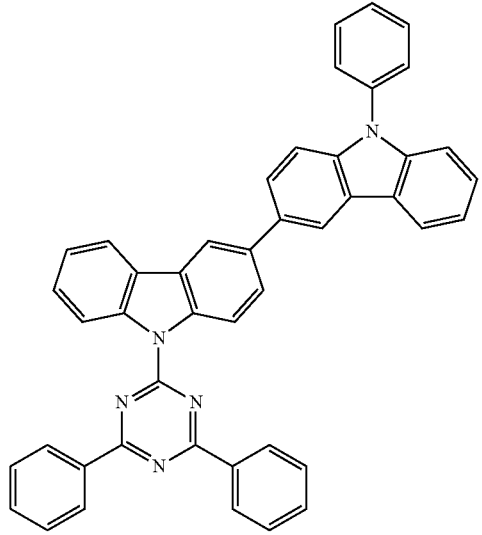

[2]

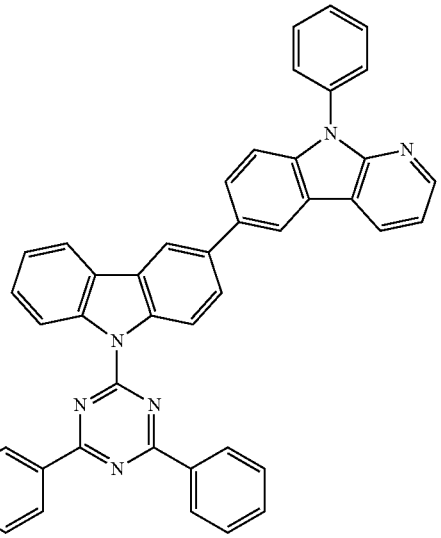

[3]

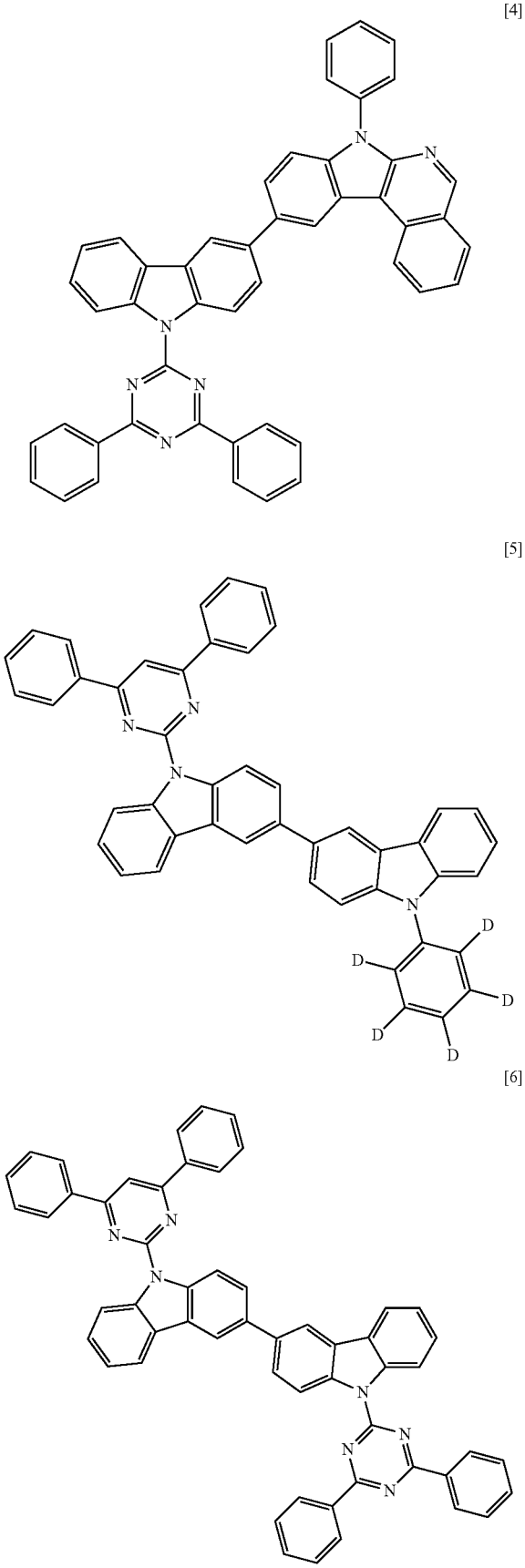 [SMILES: c1ccc(-c2nc(-c3ccccc3)nc(-n3c4ccccc4c4cc(-c5ccc6c(c5)c5c7ccccc7cnc5n6-c5ccccc5)ccc43)n2)cc1 ; [2H]c1c([2H])c([2H])c(-n2c3ccccc3c3cc(-c4ccc5c(c4)c4ccccc4n5-c4nc(-c5ccccc5)cc(-c5ccccc5)n4)ccc32)c([2H])c1[2H] ; c1ccc(-c2cc(-c3ccccc3)nc(-n3c4ccccc4c4cc(-c5ccc6c(c5)c5ccccc5n6-c5nc(-c6ccccc6)nc(-c6ccccc6)n5)ccc43)n2)cc1]
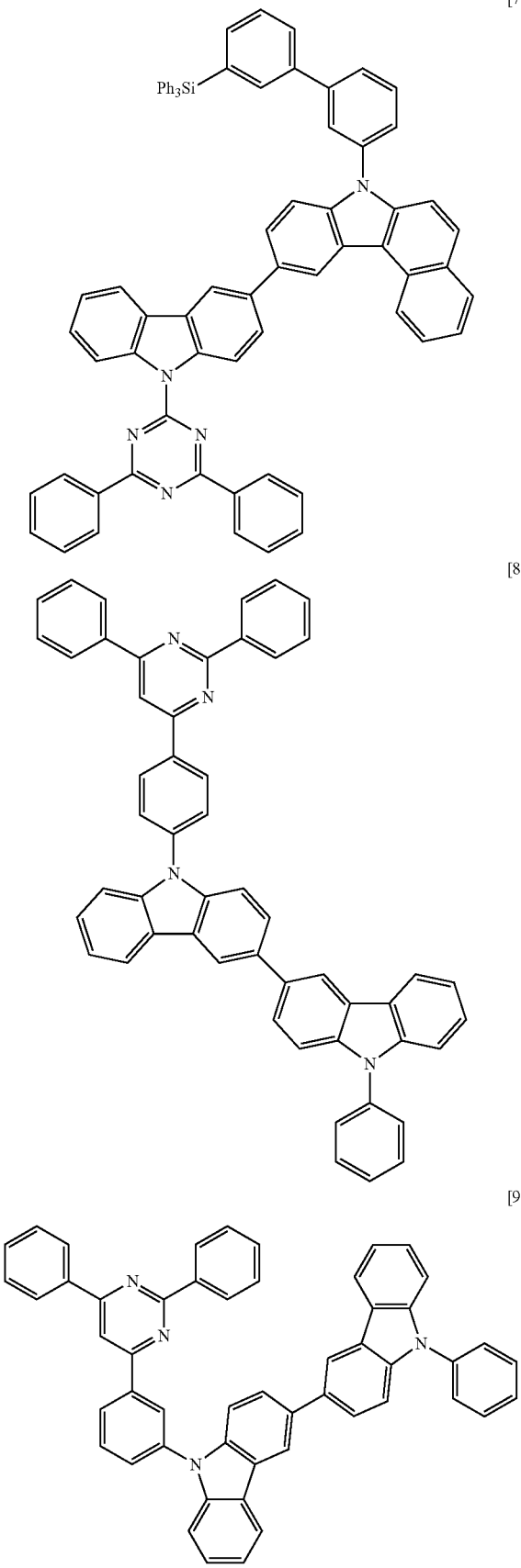

[10]
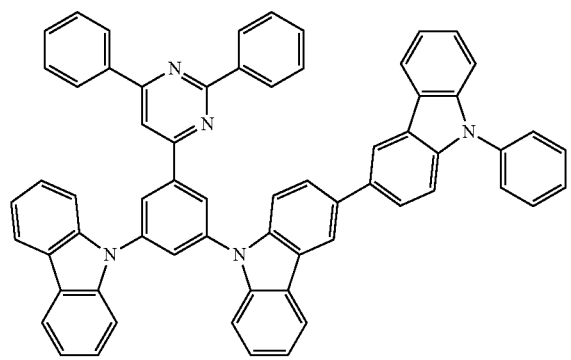
[11]
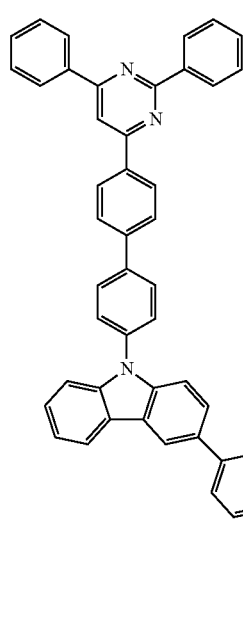
[12]
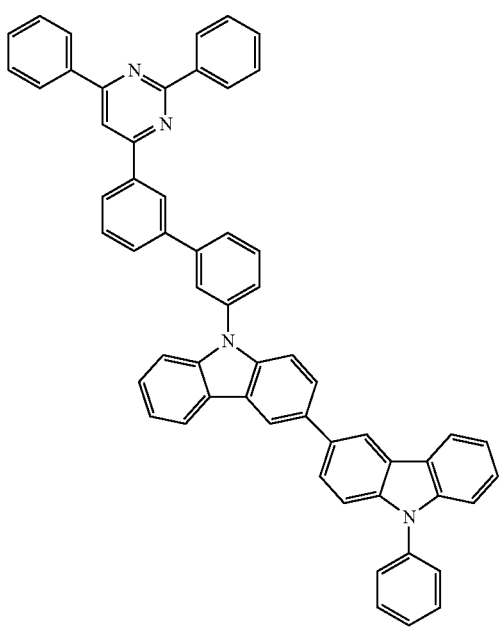
[13]
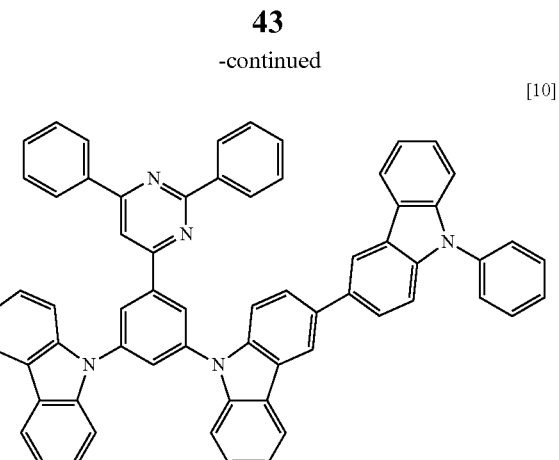
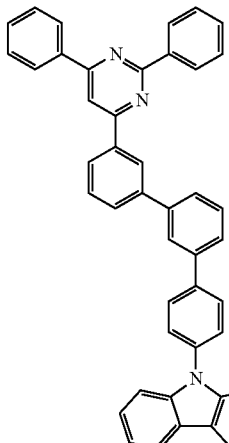
[14]
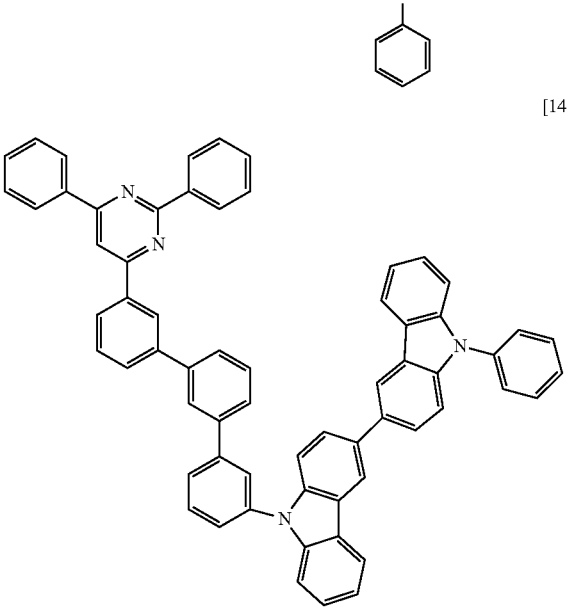
[15]
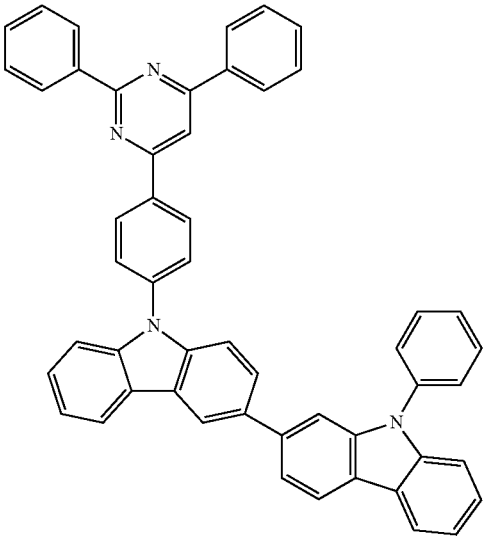

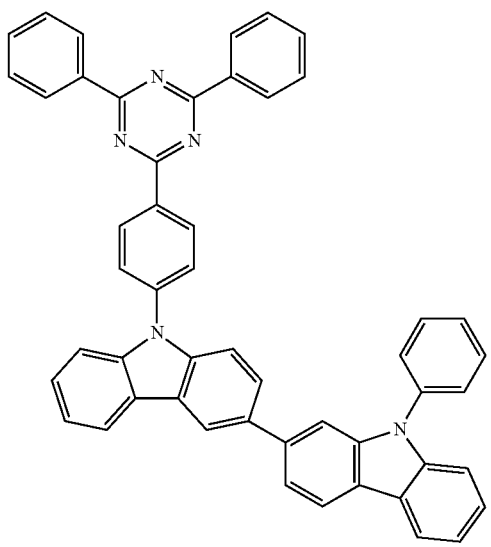
[16]
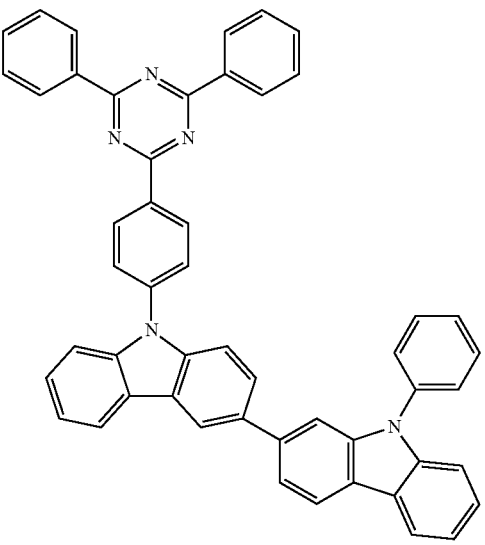
[19]
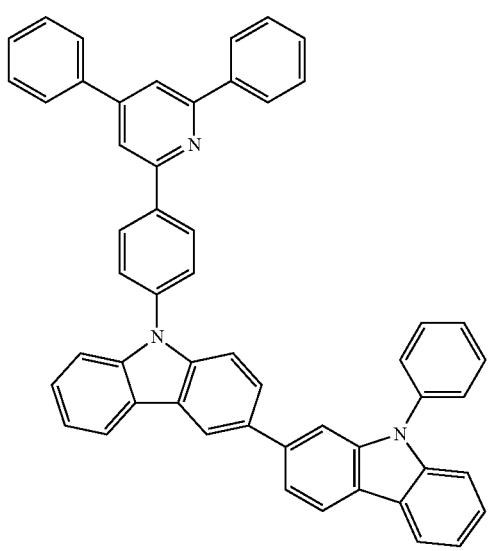
[17]
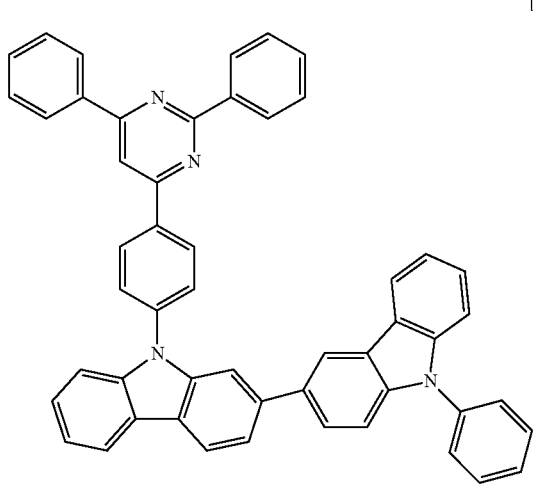
[20]
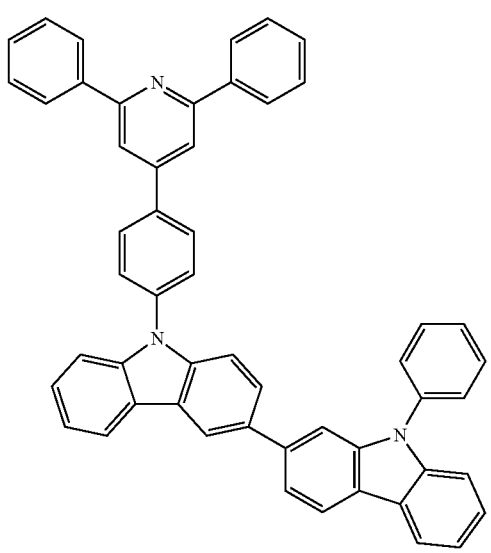
[18]
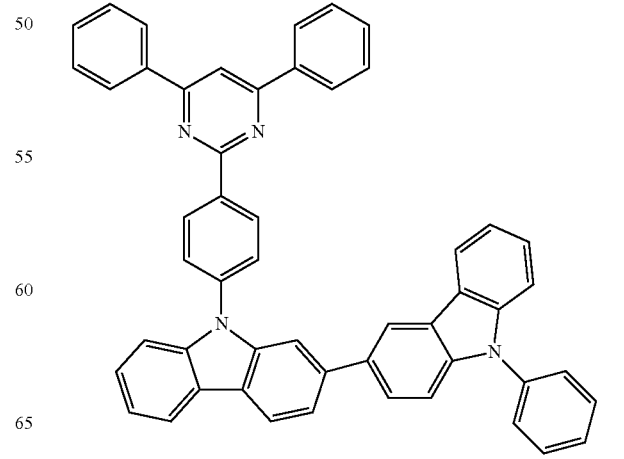
[21]

[22]
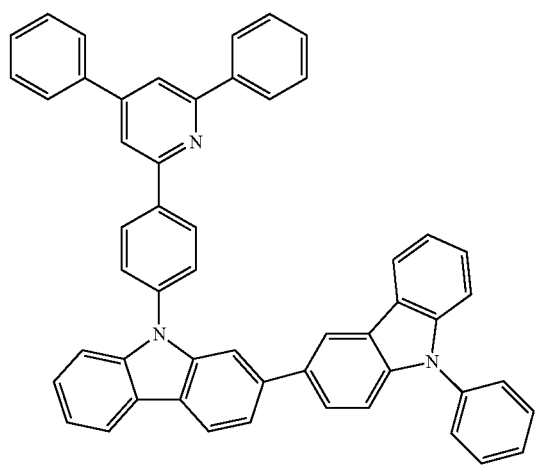
[23]
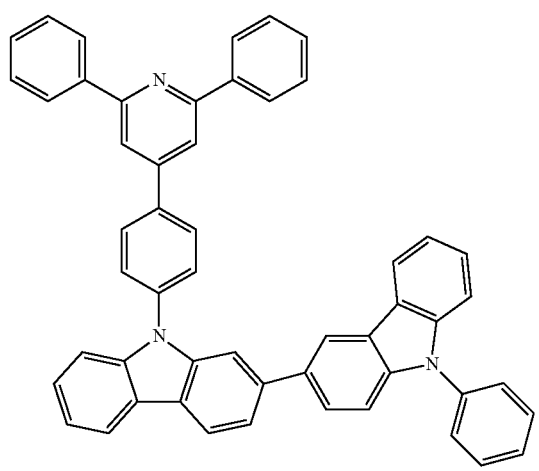
[24]
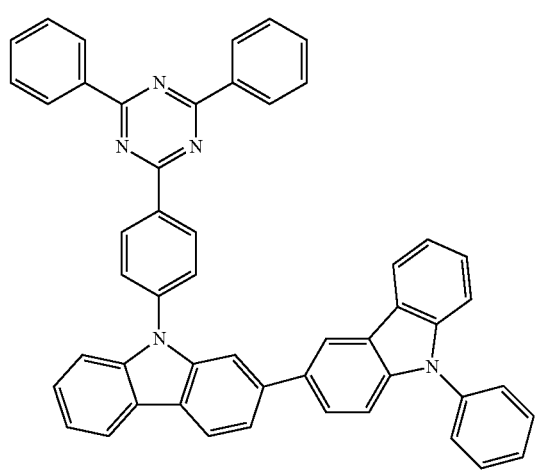
[25]
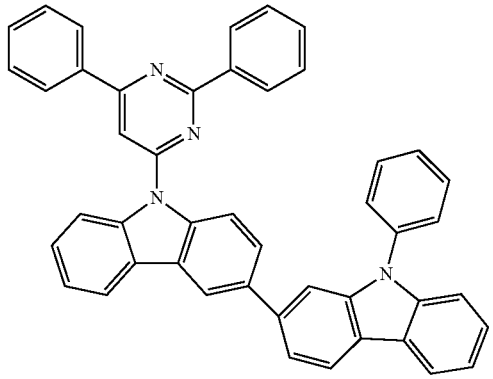
[26]
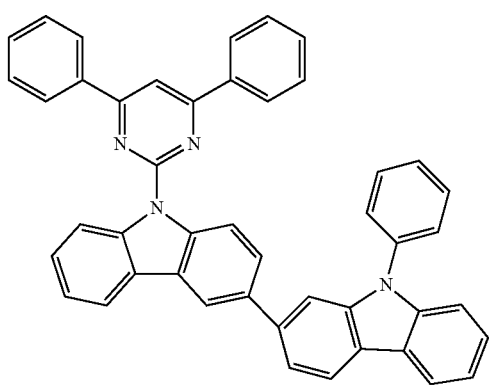
[27]
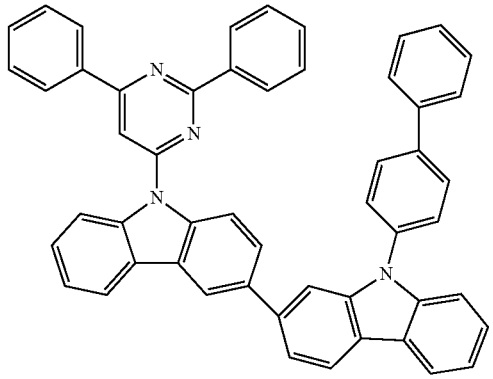
[28]
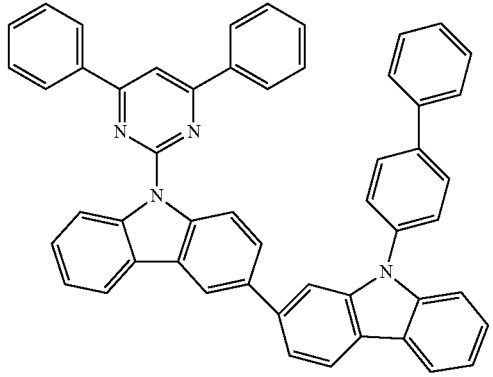

-continued
[29]
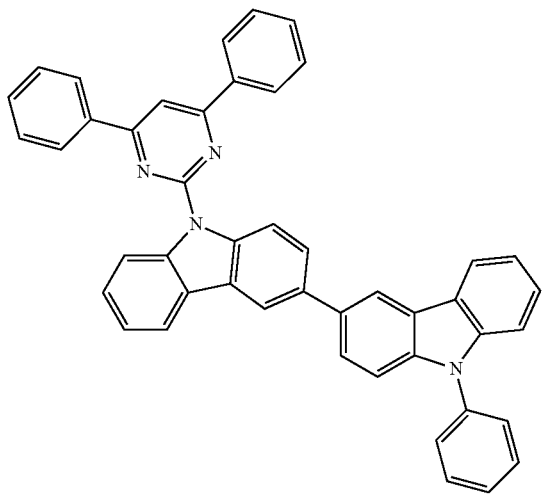
[30]
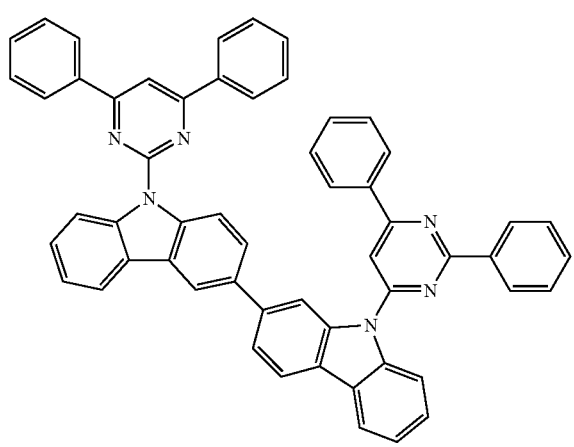
[31]
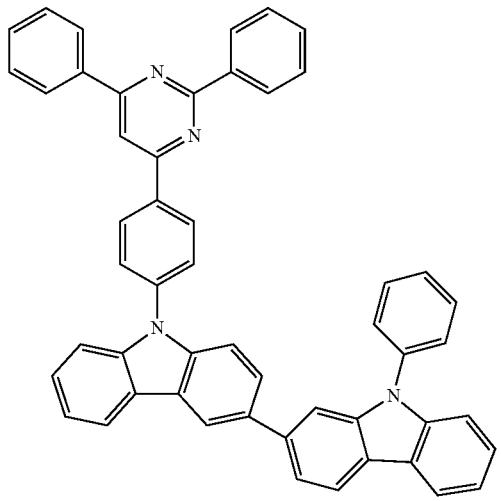
-continued
[32]
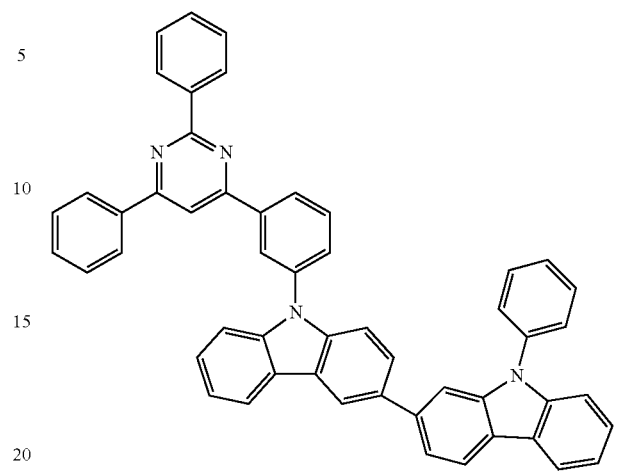
[33]
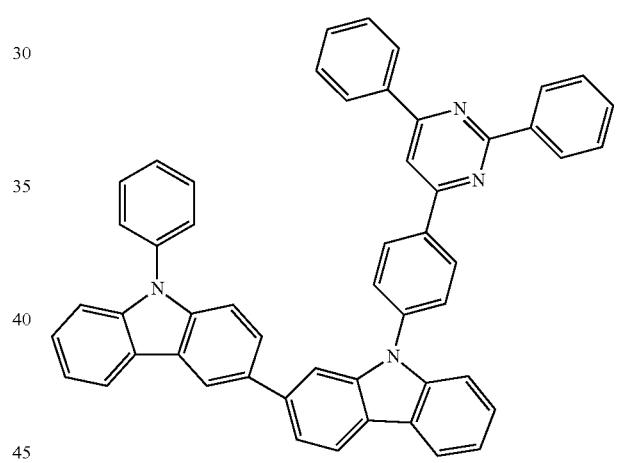
[34]
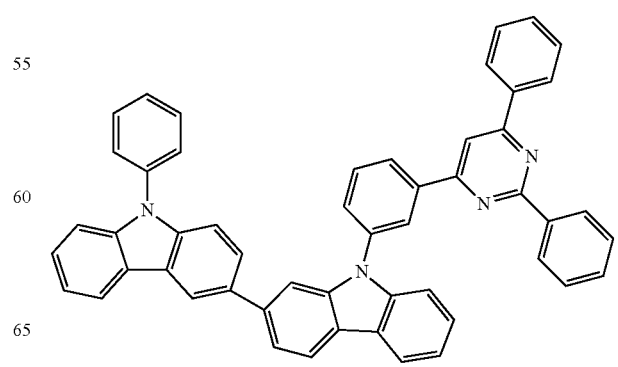

51
-continued
[35]
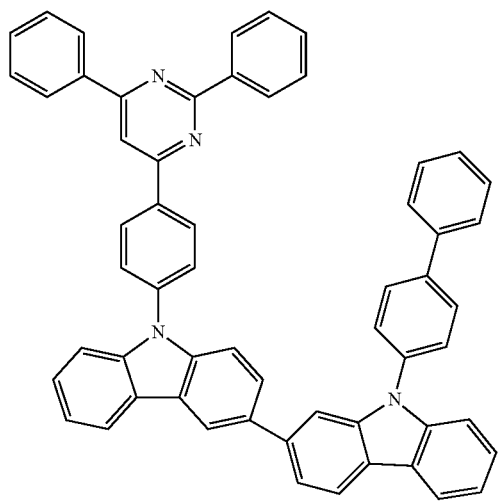
[36]
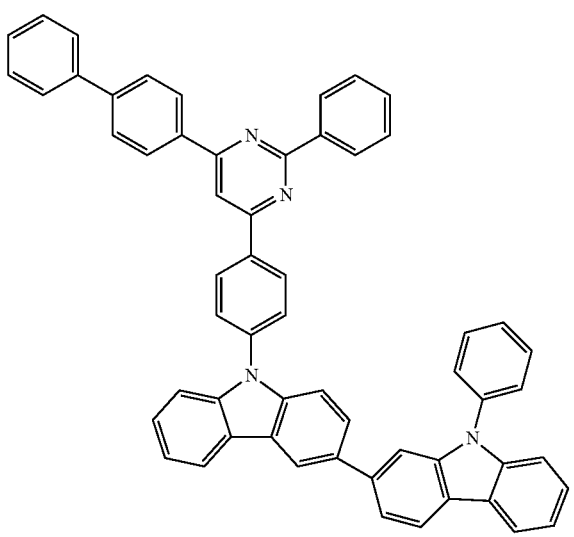
[37]
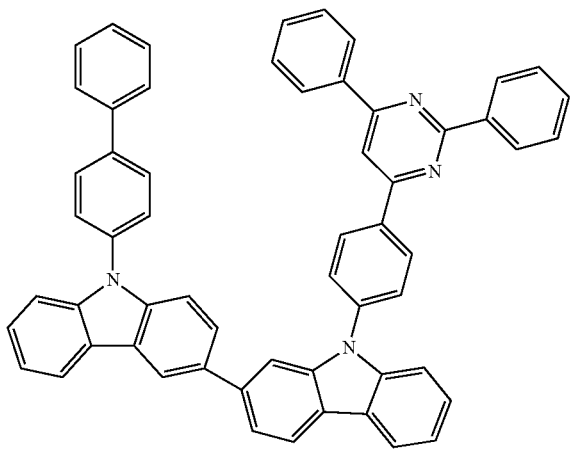
52
-continued
[38]
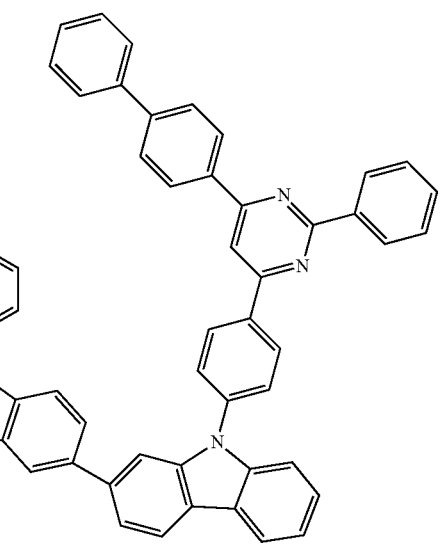
[39]
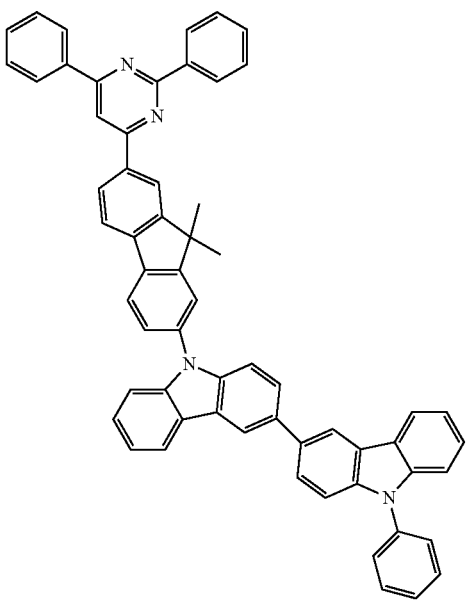

53
-continued
[40]
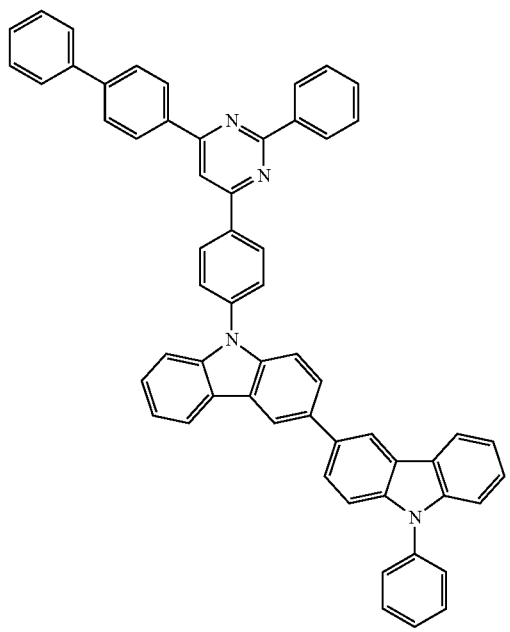
[41]
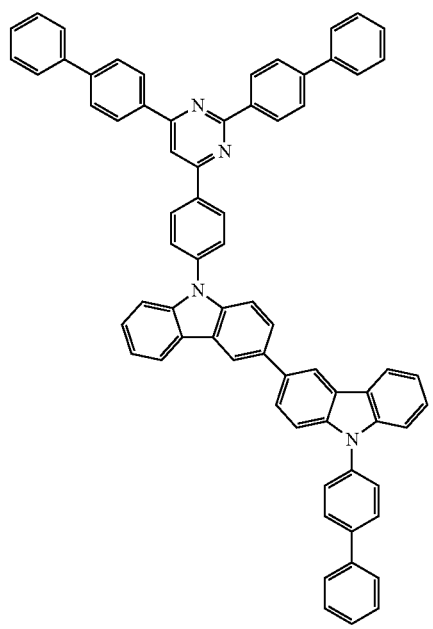
54
-continued
[42]
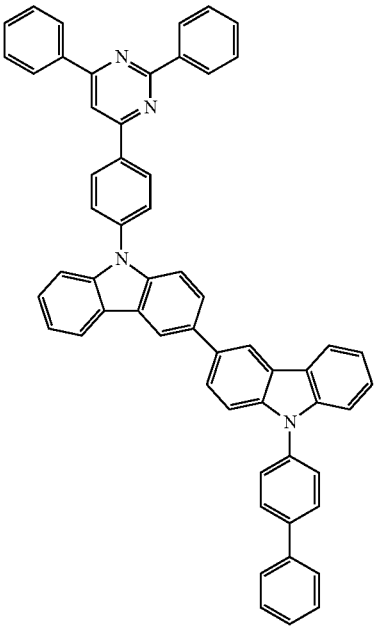
[43]
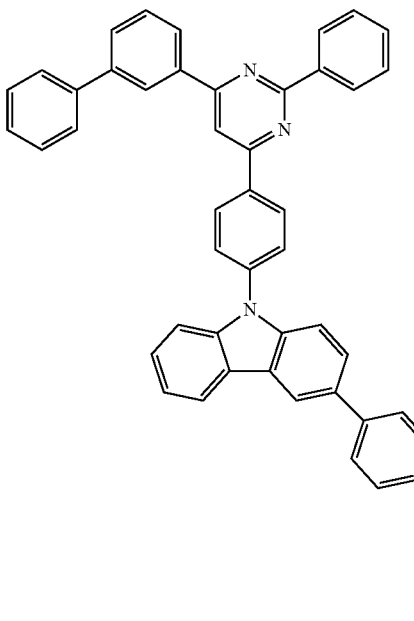

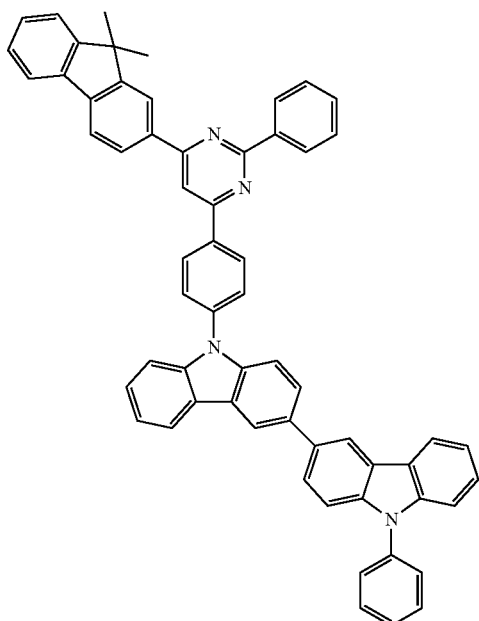
[44]
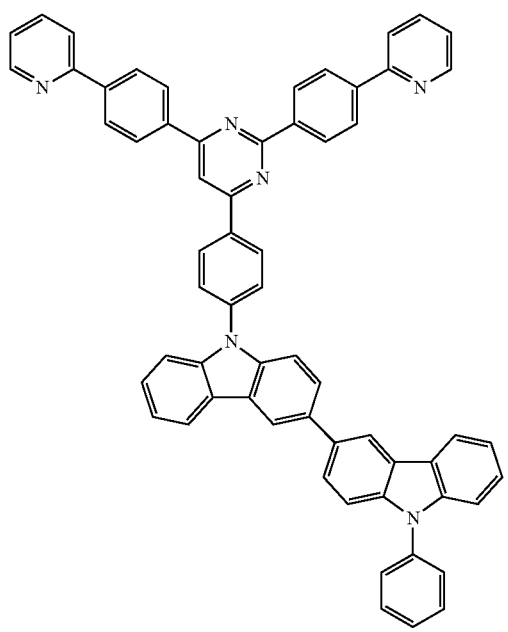
[46]
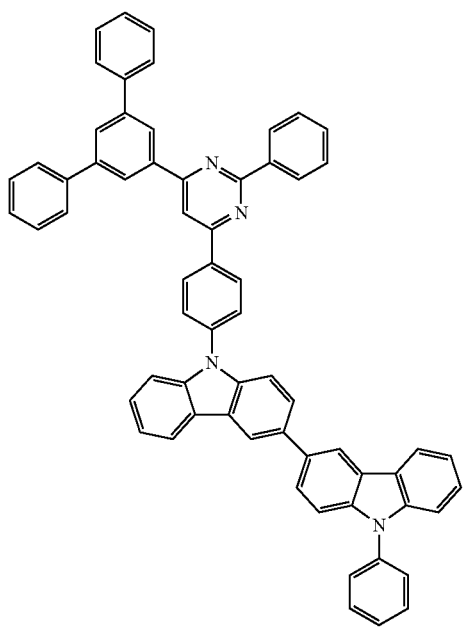
[45]
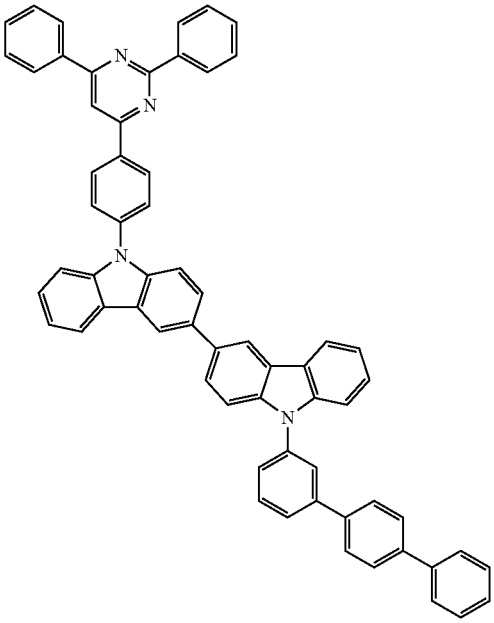
[47]

[48]
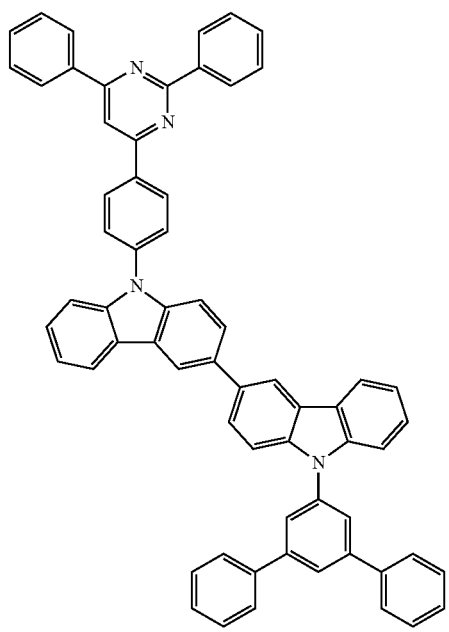
In an implementation, the compound represented by Chemical Formula 2 may be one of the following Compounds 49 to 73.
[49]
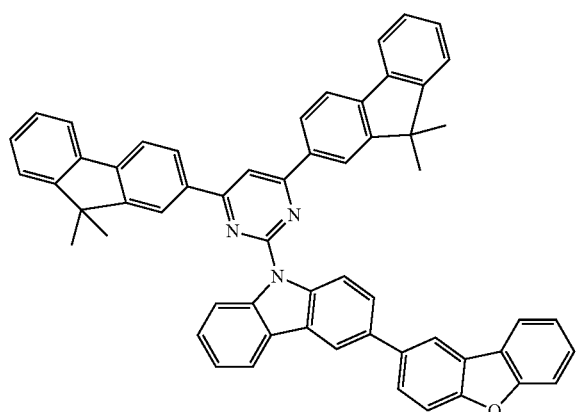
[50]
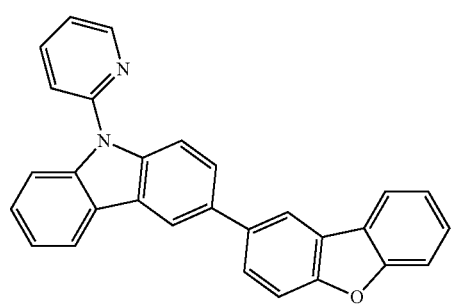
[51]
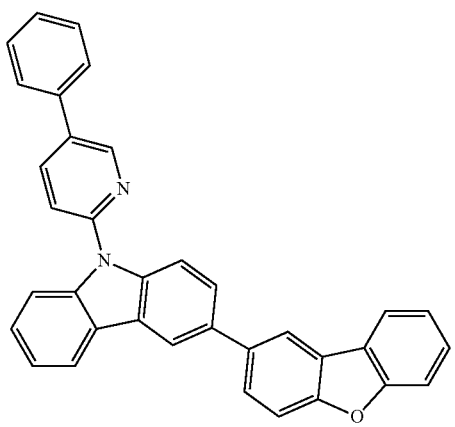
[52]
[53]
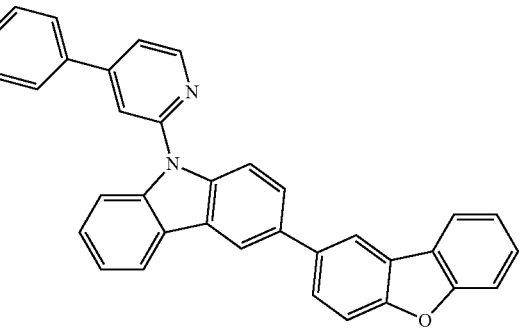
[54]
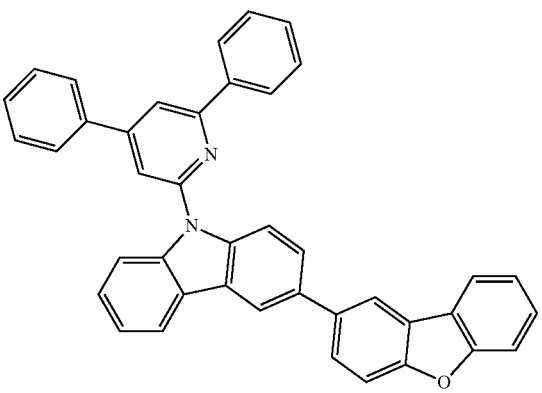

[55]
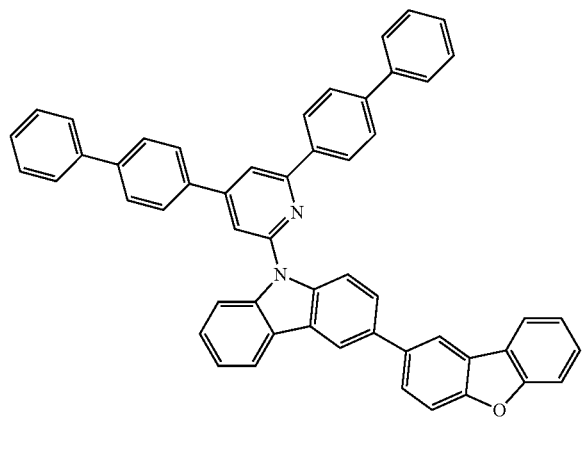
[56]
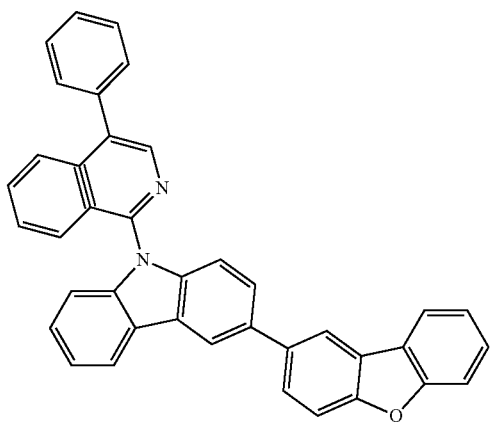
[57]
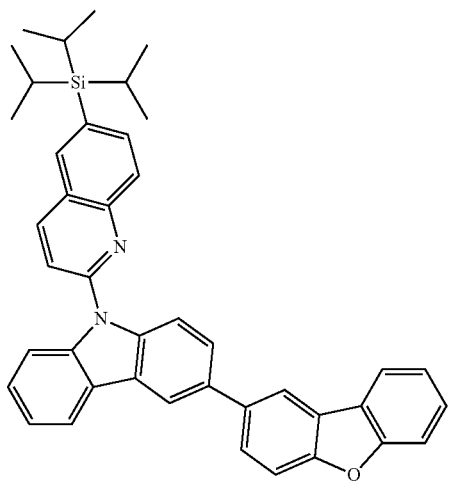
[58]
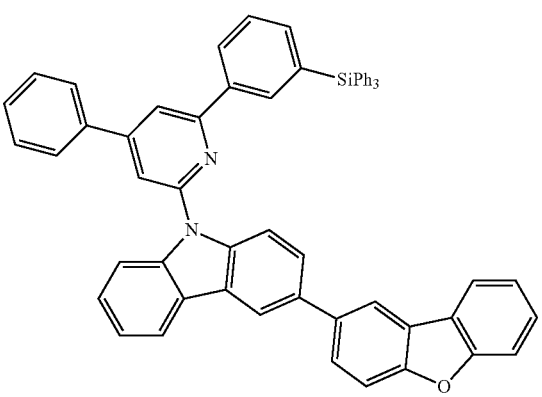
[59]
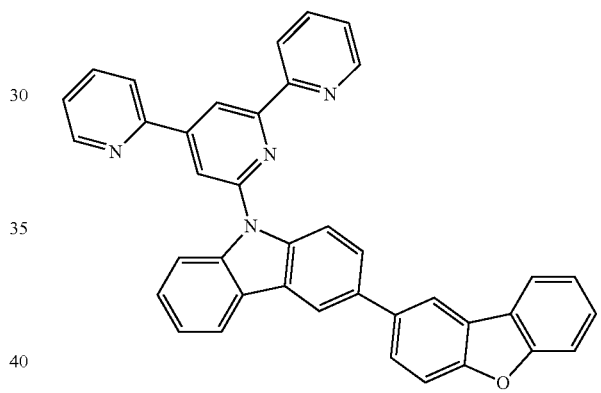
[60]
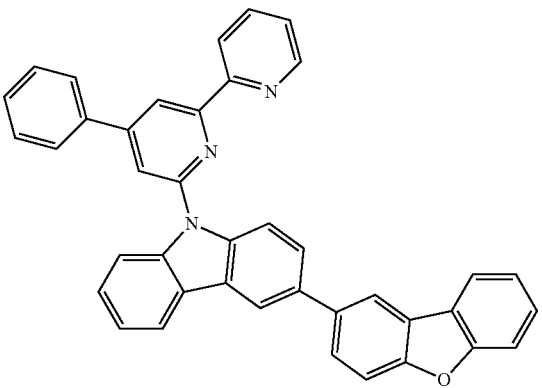

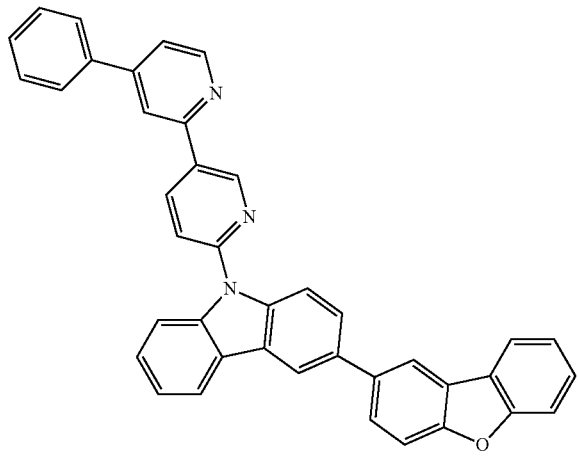
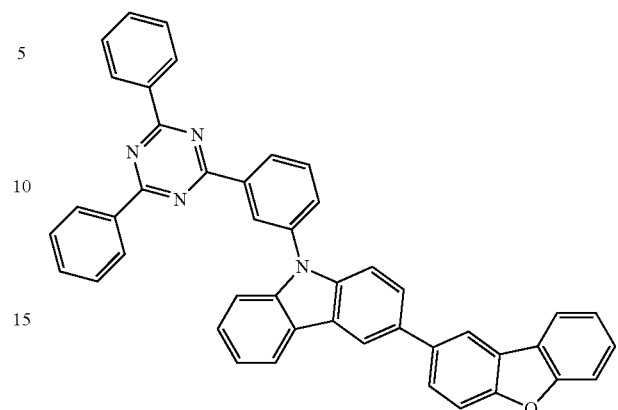
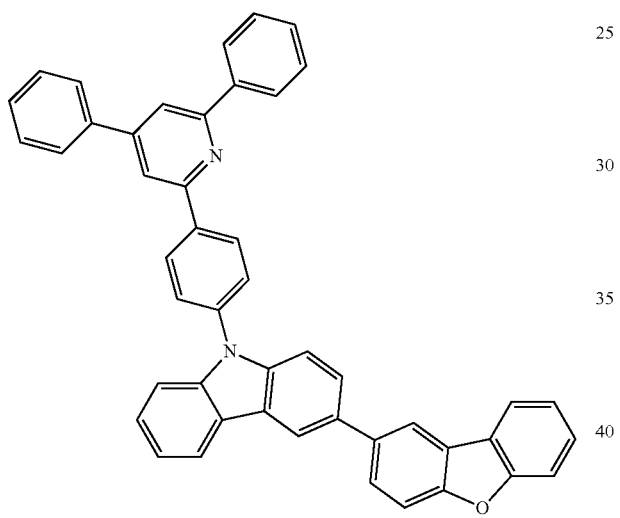
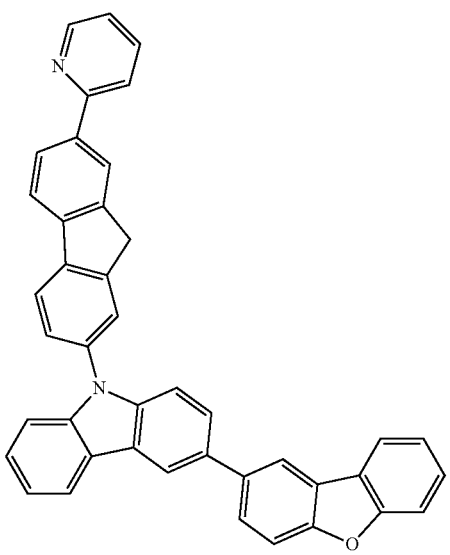
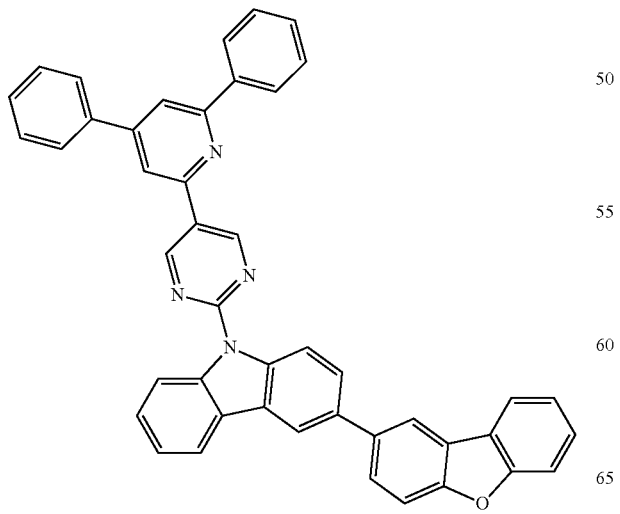

[67]
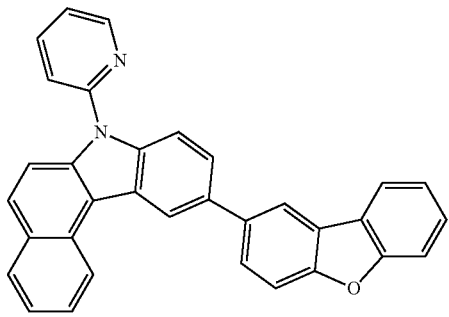
[68]
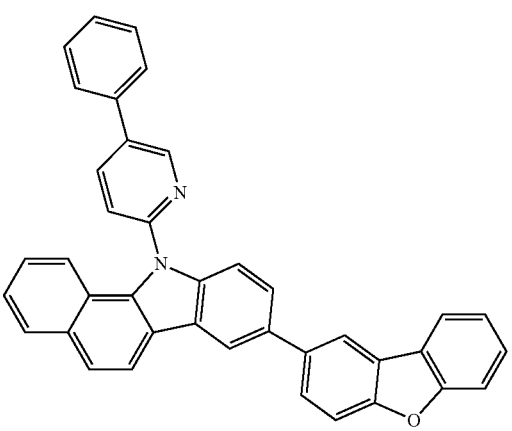
[69]
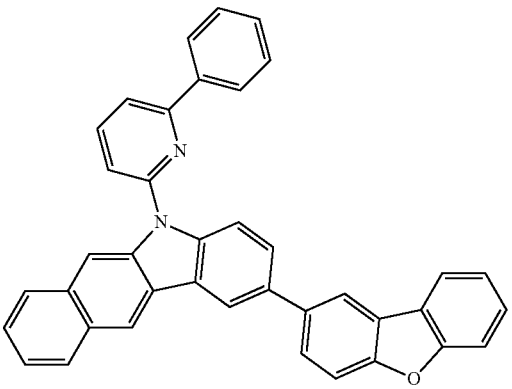
[70]
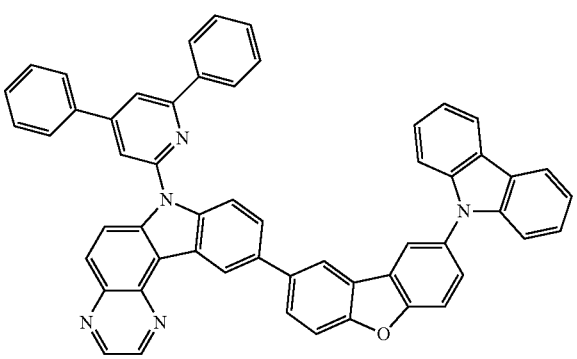
[71]
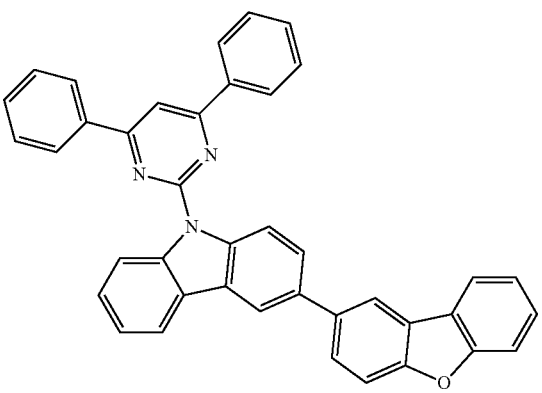
[72]
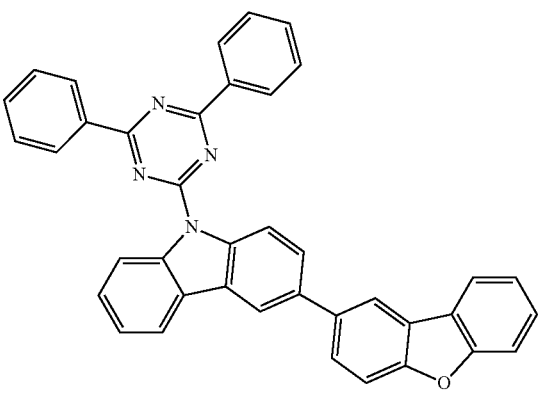
[73]
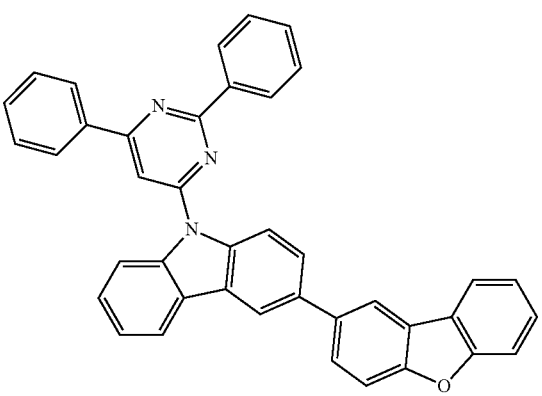
In an implementation, the compound represented by Chemical Formula 3 may be one of the following Compounds 74 to 78.

[74]
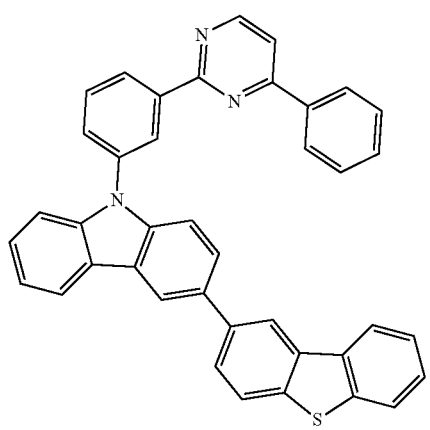
[77]
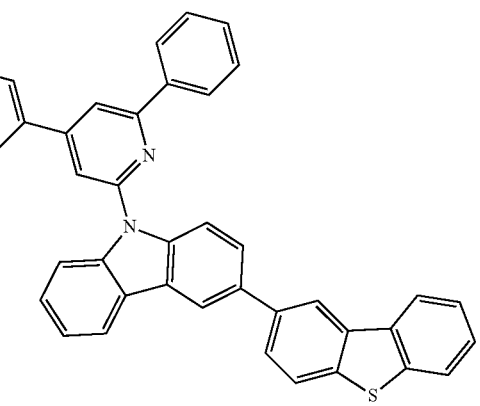
[75]
[78]
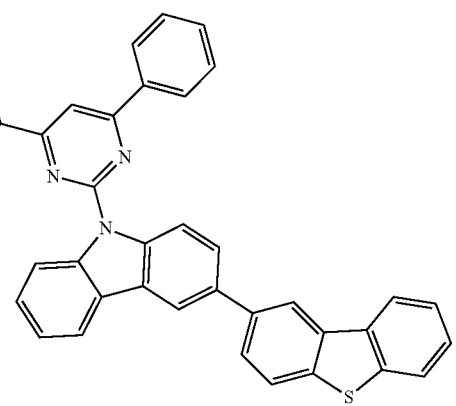
In an implementation, the compound represented by Chemical Formula 4 may be one of the following Compounds 79 to 84.
[76]
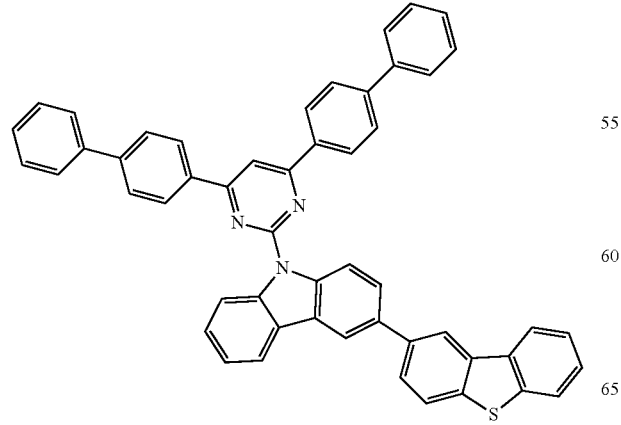
[79]
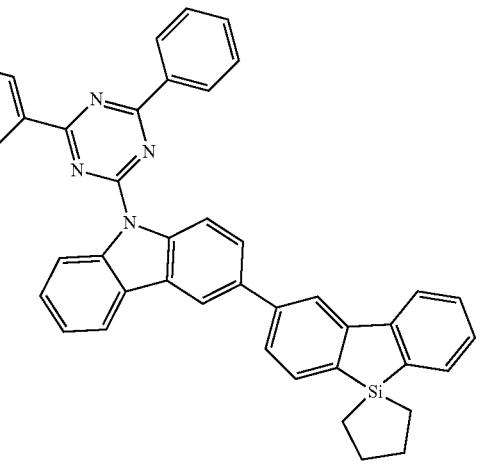

[80]
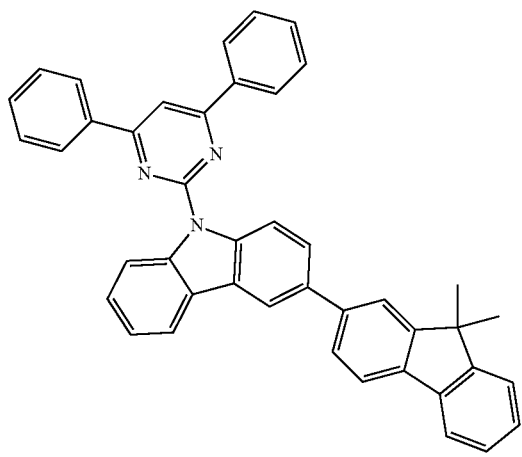
[81]
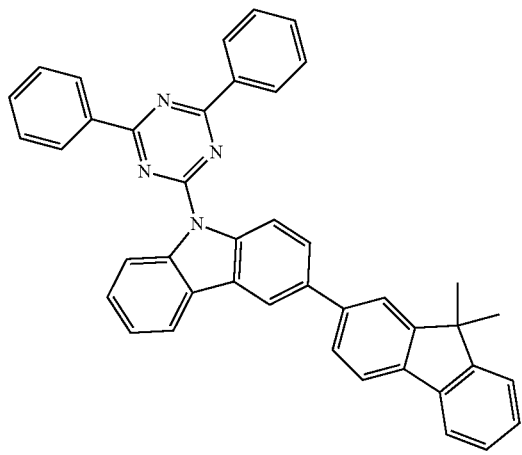
[82]
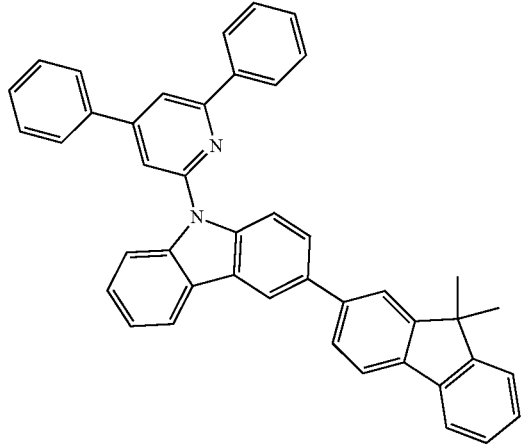
[83]
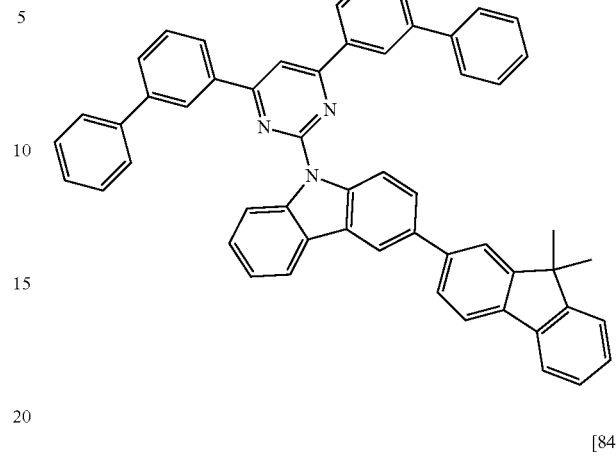
[84]
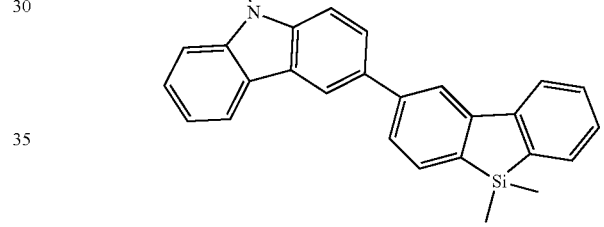
In an implementation, the compound represented by Chemical Formula 5 may be one of the following Compounds 85 to 88.
[85]
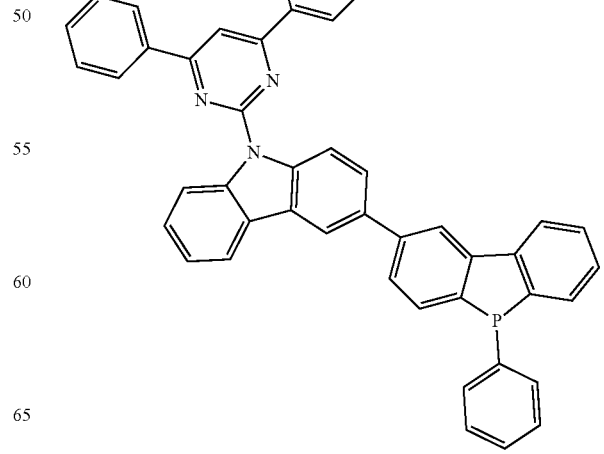

-continued

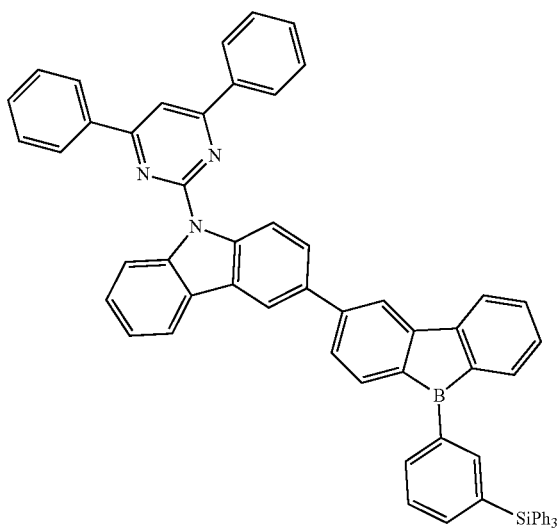

In an implementation, the capping layer 230 may include one or more of an inorganic material or an organic material having optical transmittance, apart from or in addition to the compound represented by one of Chemical Formulae 1 through 5. For example, the capping layer 230 may include at least one of a low refractive index material having a refractive index of about 1.3 to about 1.9, and a high refractive index material having a refractive index of about 1.9 to about 3.0.

The low refractive index materials and high refractive index materials may include, e.g., an organic or organometallic material or an inorganic material.

In an implementation, the inorganic material having the low refractive index may include, e.g., silicon oxide or magnesium fluoride.

In an implementation, the organic or organometallic material having the low refractive index may include, e.g., acrylic, polyimide, polyamide, Alq$_3$ [tris(8-hydroxyquinolinato)aluminum], or the like.

In an implementation, the inorganic material having the high refractive index may include, e.g., zinc oxide, titanium oxide, zirconium oxide, niobium oxide, tantalum oxide, tin oxide, nickel oxide, silicon nitride, indium nitride, and/or gallium nitride.

In an implementation, the organic or organometallic material having the high refractive index may include, e.g., poly(3,4-ethylenedioxythiophene) (PEDOT), 4,4'-bis[N-(3-methylphenyl-N-phenylamino]biphenyl (TPD), 4,4',4"-tris[N-3-methylphenyl-N-phenylamino]triphenylamine (m-MTDATA), 1,3,5-tris[N,N-bis(2-methylphenyl-amino]-benzene(o-MTDAB), 1,3,5-tris[N,N-bis(3-methylphenyl-amino]-benzene (m-MTDAB), 1,3,5-tris[N,N-bis(4-methylphenyl)-amino]-benzene (p-MTDAB), 4,4'-bis[N,N-bis(3-methylphenyl)-amino]-diphenylmethane (BPPM), 2,2',2"-(1,3,5-benzentolyl)tris-[1-phenyl-1H-benzoimidazol] (TPBI), and/or 3-(4-biphenyl)-4-phenyl-5-t-butylphenyl-1,2,4-triazole (TAZ).

In an implementation, the capping layer 230 may include various suitable materials.

In an implementation, the capping layer 230 may have a thickness of, e.g., about 10 nm to about 300 nm. In an implementation, the capping layer 230 may have a thickness of, e.g., 300 nm or more, or about 300 nm to about 600 nm, in order to fully protect the OLED 210. In an implementation, the capping layer 230 may have a thickness of, e.g., greater than 600 nm.

The capping layer 230 may be manufactured by a suitable method, e.g., it may be formed by deposition.

A second substrate 410 may be disposed on the capping layer 230.

The second substrate 410 may be a transparent insulating substrate including, e.g., glass, quartz, ceramic, and/or plastic. The second substrate 410 may be bonded and sealed to the first substrate 100 to as to cover the OLED 210.

Referring to FIG. 2, an air layer 310 may be formed in a space between the second substrate 410 and the capping layer 230. The air layer 310 may have a lower refractive index than that of the capping layer 230.

In an implementation, light generated in the organic light emitting layer 212 of the OLED 210 may pass through the second electrode 213, the capping layer 230, the air layer 310, and the second substrate 410 to be released outwards.

While propagating outwards, the light generated in the organic light emitting layer 212 may arrive at an interlayer interface. The light may pass through the interlayer interface, or may fail to propagate through the interlayer interface and thus may be reflected therefrom.

In an implementation, light generated in the organic emission layer 212 may be reflected from or at an interface between the capping layer 230 and the air layer 310. The reflected light may then be reflected again from or at an interface between the second electrode 213 and the capping layer 230, or may propagate through the second electrode 213 and the organic light emitting layer 212 and may then be reflected from an upper surface of the first electrode 211.

Accordingly, the light may be repeatedly reflected off interfaces between the respective layers or spaces and, during the reflections, light having a predetermined wavelength may be resonated and light having other wavelengths may be dissipated. The resonated light may be amplified and may then be released outwards. By virtue of such resonance, light efficiency of the OLED display 101 may be improved.

Hereinafter, a second exemplary embodiment will be described with reference to FIG. 3.

Figure 3:
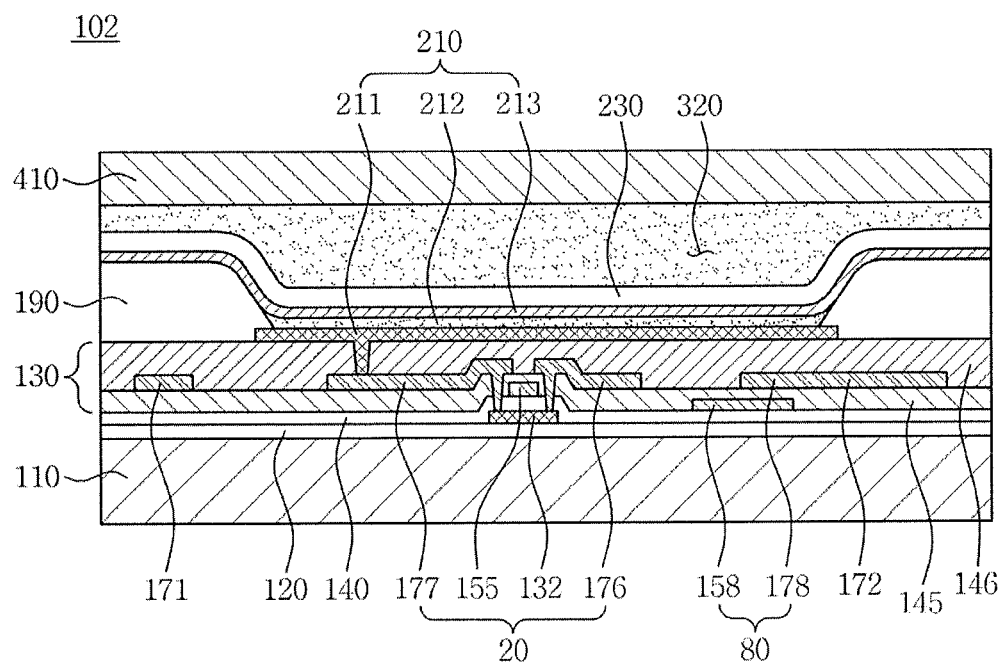
FIG. 3 illustrates a cross-sectional view of an OLED display according to a second exemplary embodiment.

FIG. 3 illustrates a cross-sectional view of an OLED display 102 according to a second exemplary embodiment. Repeated descriptions with regard to configurations identical to those of the first exemplary embodiment may be omitted for brevity.

An OLED display 102 according to the second exemplary embodiment may include a filling member 320 in a space between a capping layer 230 and a second substrate 410. The filling member 320, in place of the air layer 310, may fill the interior space of the OLED display 102.

The filling member 320 may include an organic material, e.g., a polymer. In an implementation, the refractive index of the filling member 320 may be less than or more than (e.g., different from) that of the capping layer 230, or may be equivalent to that of the capping layer 230.

The filling member may be selected according to the refractive index of the capping layer 230 and the second substrate 410. For example, when the second substrate 410 is a glass substrate having a refractive index of about 1.5, a polymer having a refractive index of about 1.5 may be used as a material for the filling member 320. In an implementation, the material for the filling member 320 may include, e.g., poly (methylmethacrylate) (PMMA).

As the filling member 320 fills the empty space of the OLED display 102, the device strength and durability of the OLED display 102 may be improved due to the filling member 320.

Hereinafter, a third exemplary embodiment will be described with reference to FIG. 4.

Figure 4:
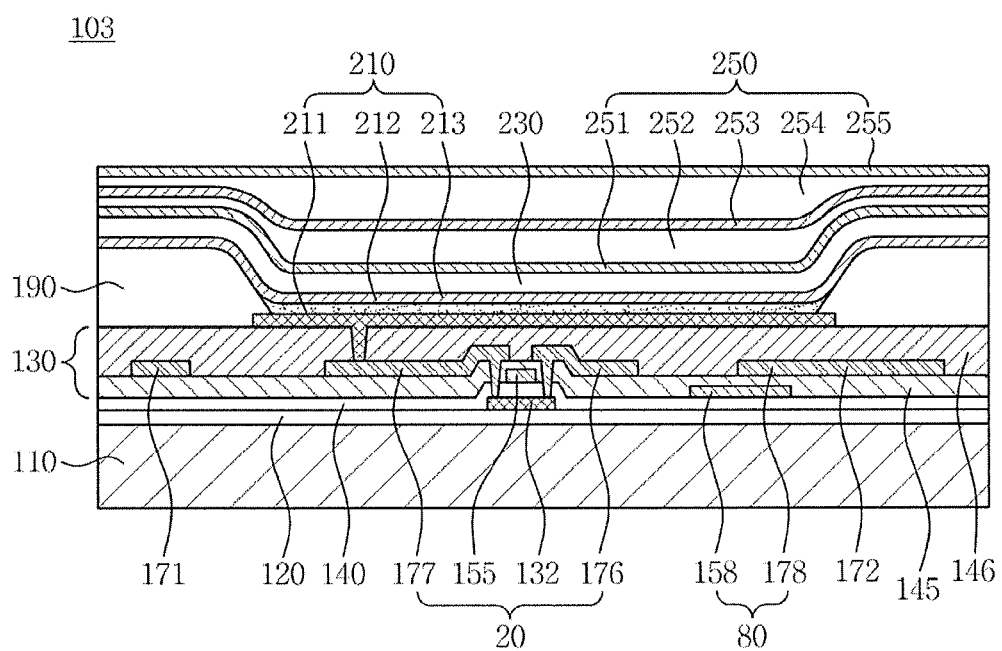
FIG. 4 illustrates a cross-sectional view of an OLED display according to a third exemplary embodiment.

FIG. 4 illustrates a cross-sectional view of an OLED display 103 according to a third exemplary embodiment. Repeated descriptions with regard to configurations identical to those of the first exemplary embodiment may be omitted for brevity.

An OLED display 103 according to the third exemplary embodiment may include a thin film encapsulation layer 250 on a capping layer 230.

The thin film encapsulation layer 250 may include one or more inorganic layers 251, 253, and 255, and one or more organic layers 252 and 254. The thin film encapsulation layer 250 may have a structure where the inorganic layers 251, 253, and 255 and the organic layers 252 and 254 are alternately laminated. In this case, the inorganic layer 251 may be disposed at a lowest portion of the laminated structure. For example, the inorganic layer 251 may be disposed closest to the OLED 210. In an implementation, the thin film encapsulation layer 250, as illustrated in FIG. 4, may include three inorganic layers 251, 253, and 255, and two organic layers 252 and 254.

The inorganic layers 251, 253, and 255 may include one or more inorganic materials of, e.g., $Al_2O_3$, $TiO_2$, $ZrO$, $SiO_2$, AlON, AlN, SiON, $Si_3N_4$, ZnO, and $Ta_2O_5$. The inorganic layers 251, 253, and 255 may be formed using methods such as chemical vapor deposition (CVD) or atomic layer deposition (ALD). In an implementation, the inorganic layers 251, 253, and 255 may be formed using suitable methods.

The organic layers 252 and 254 may include, e.g., polymer-based materials. In an implementation, the polymer-based materials may include, e.g., acrylic resins, epoxy resins, polyimide, and polyethylene. The organic layers 252 and 254 may be formed by, e.g., a thermal deposition process. The thermal deposition process for forming the organic layers 252 and 254 may be performed in a range of temperatures that may not damage the OLED 210. In an implementation, the organic layers 252 and 254 may be formed using suitable methods.

The inorganic layers 251, 253, and 255 having a high density of thin films may help prevent or efficiently reduce infiltration of, e.g., moisture or oxygen. For example, most infiltration of moisture and oxygen into the OLED 210 may be prevented by the inorganic layers 251, 253, and 255.

Moisture and oxygen that passes through the inorganic layers 251, 253, and 255 may be further blocked by the organic layers 252 and 254. The organic layers 252 and 254 may show a relatively low moisture-infiltration preventing efficacy compared to the inorganic layers 251, 253, and 255. However, the organic layers 252 and 254 may also serve as a buffer layer to reduce stress between the respective layers of the inorganic layers 251, 253, and 255 and the organic layers 252 and 254, apart from preventing of moisture infiltration. Further, the organic layers 252 and 254 may have planarizing properties, and an uppermost surface of the thin film encapsulation layer 250 may be planarized.

The thin film encapsulation layer 250 may have a thickness of about 10 μm or less. For example, the OLED display 103 may be formed to have an overall thickness significantly small.

A second substrate may be disposed on the thin film encapsulation layer 250, and the second substrate 410 may be omitted. In the case where the second substrate is omitted, flexible properties of the OLED display 103 may be enhanced.

By way of summation and review, in order to enhance applicability of the OLED displays, methods have been considered to effectively protect the OLED and to efficiently extract light generated in the organic light emitting layer and improve light efficiency.

The embodiments may provide an organic light emitting diode display exhibiting improved light efficiency.

According to the embodiments, an OLED display may include a capping layer including a heterocyclic compound that includes a carbazole group and a heterocyclic group, thereby having excellent light efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode display, comprising:
a first substrate;
a first electrode on the first substrate;
an organic light emitting layer on the first electrode;
a second electrode on the organic light emitting layer; and
a capping layer on the second electrode,
wherein:
the capping layer includes at least one heterocyclic compound, the heterocyclic compound including a carbazole group and a heterocyclic group bonded with the carbazole group, and
the heterocyclic compound is represented by one of the following Chemical Formulae 1 to 5:

[Chemical Formula 1]

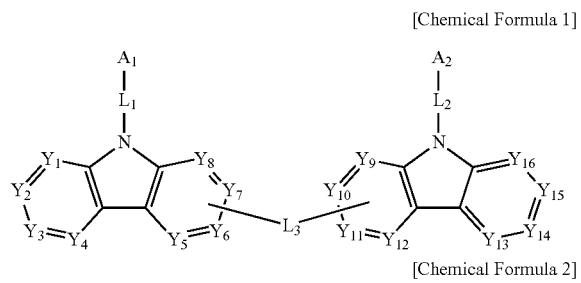

[Chemical Formula 2]

[Chemical Formula 3]

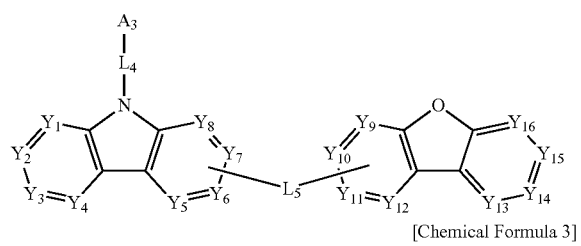

[Chemical Formula 4]

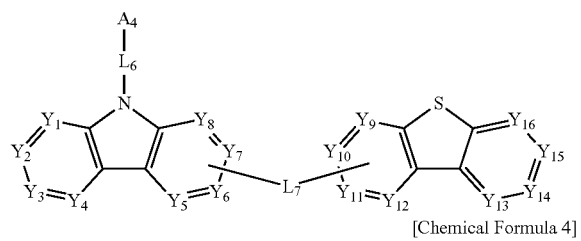

[Chemical Formula 5]

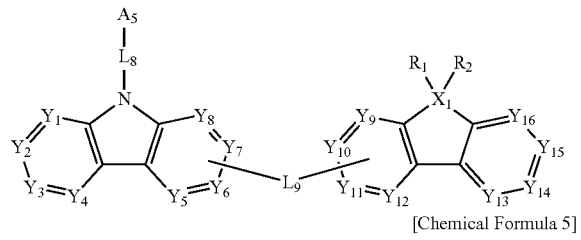

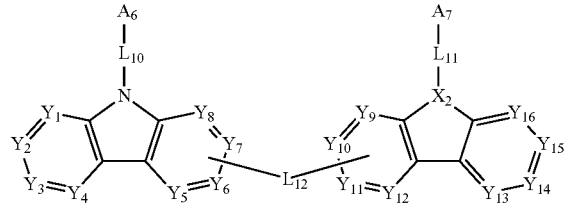

wherein, in Chemical Formulae 1 to 5, $A_1$ to $A_7$ are each independently a substituted or unsubstituted aromatic hydrocarbon group having 6 to 30 ring carbon atoms or a substituted or unsubstituted aromatic heterocyclic group having 1 to 30 ring carbon atoms;

$Y_1$ to $Y_{16}$ are each independently C—R or a nitrogen atom, wherein each R of the C—R is independently one of a hydrogen atom, a substituted or unsubstituted aromatic hydrocarbon group having 6 to 30 ring carbon atoms, a substituted or unsubstituted aromatic heterocyclic group having 1 to 30 ring carbon atoms, a substituted or unsubstituted alkyl group having 1 to 30 carbon atoms and having a linear, branched, or cyclic structure, a substituted or unsubstituted alkoxy group having 1 to 30 carbon atoms, a substituted or unsubstituted aryloxy group having 6 to 30 ring carbon atoms, a substituted or unsubstituted aralkyl group having 7 to 30 carbon atoms, a substituted or unsubstituted haloalkyl group having 1 to 30 carbon atoms, a substituted or unsubstituted haloalkoxy group having 1 to 30 carbon atoms, a substituted or unsubstituted alkylsilyl group having 3 to 30 carbon atoms, a substituted or unsubstituted dialkylarylsilyl group having 8 to 40 carbon atoms, a substituted or unsubstituted alkyldiarylsilyl group having 13 to 50 carbon atoms, a substituted or unsubstituted triarylsilyl group having 18 to 60 carbon atoms, a substituted or unsubstituted alkenyl group having 2 to 30 carbon atoms, a substituted or unsubstituted alkynyl group having 2 to 30 carbon atoms, a halogen atom, a cyano group, a hydroxyl group, a nitro group, or a carboxyl group;

R of adjacent C—R, when two of $Y_1$ to $Y_{16}$ that are adjacent to each other are C—R, are separate or are combined to form a cyclic structure;

$L_1$ to $L_{12}$ are each independently a single bond or a connecting group, wherein the connecting group is independently one of an arylene group having 6 to 13 carbon atoms or heteroarylene group having 6 to 10 nuclear atoms;

$X_1$ is carbon or silicon;

$R_1$ and $R_2$ are each independently a hydrogen atom, a substituted or unsubstituted aromatic hydrocarbon group having 6 to 30 ring carbon atoms, a substituted or unsubstituted aromatic heterocyclic group having 1 to 30 ring carbon atoms, or a substituted or unsubstituted alkyl group having 1 to 30 carbon atoms, $R_1$ and $R_2$ being separate or bonded together to form a cyclic structure; and $X_2$ is boron, phosphorus, or P=O, wherein in Chemical Formula 1, when $Y_1$ to $Y_{16}$ are each C—R, and when R of adjacent C—R are separate, $L_1$-$A_1$ and/or $L_2$-$A_2$ comprises a substituted or unsubstituted pyridine group, a substituted or unsubstituted diazine group, a substituted or unsubstituted triazine group, a substituted or unsubstituted quinoline group or a substituted or unsubstituted isoquinoline group.

2. The organic light emitting diode display as claimed in claim 1,
wherein:
the arylene group of $L_1$ to $L_{12}$ is independently one of a phenylene group, a biphenylene group, a terphenylene group or a fluorenylene group; and
the heteroarylene group of $L_1$ to $L_{12}$ is independently one of a pyridine group, a diazine group, a triazine group, a quinoline group or an isoquinoline group.

3. The organic light emitting diode display as claimed in claim 1, wherein the compound represented by Chemical Formula 1 is one of the following Compounds 1 to 48:
[1]
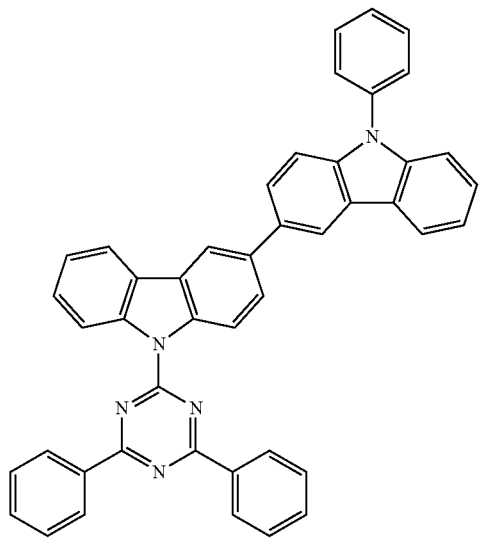
[2]
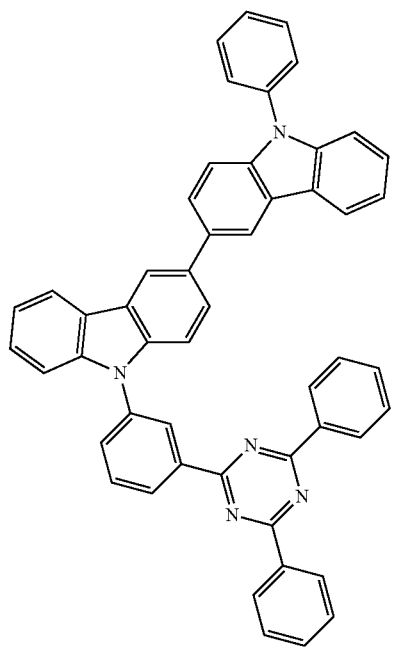
[3]
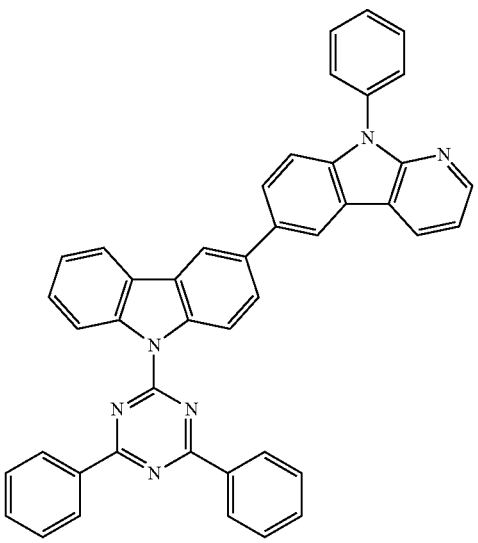
[4]
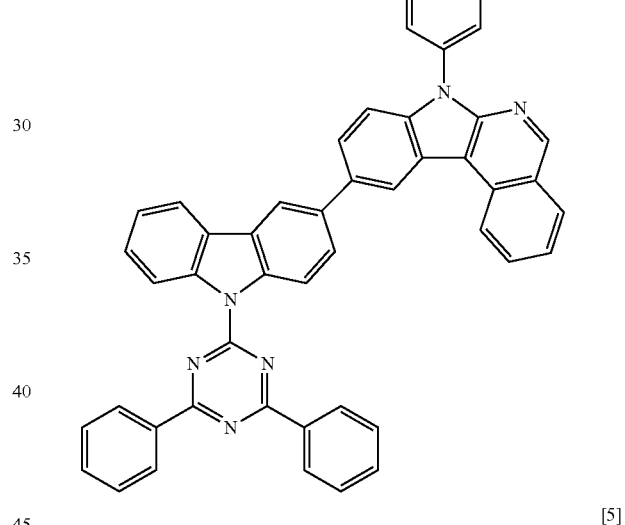
[5]
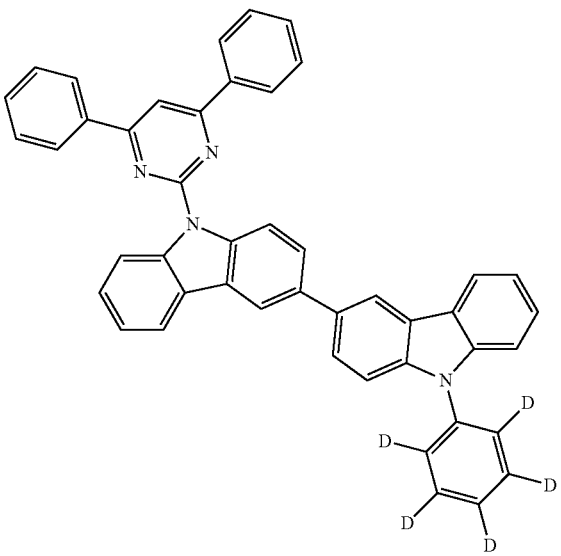

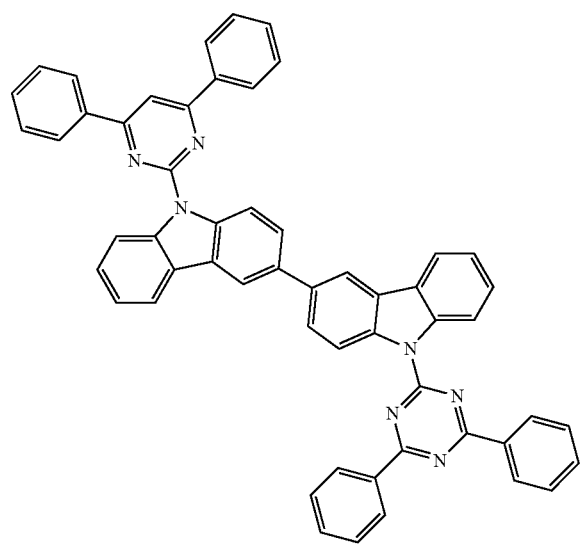
[6]
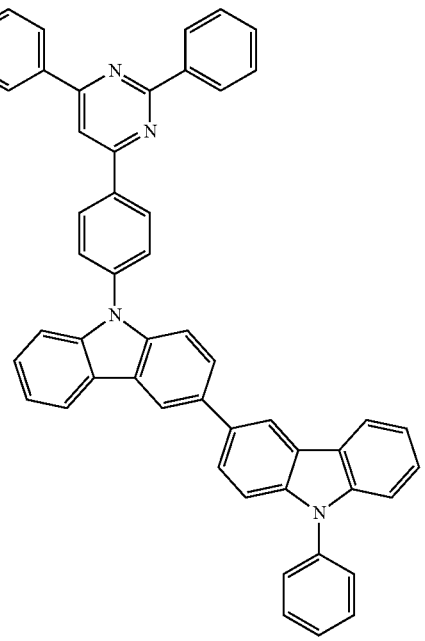
[8]
[7]
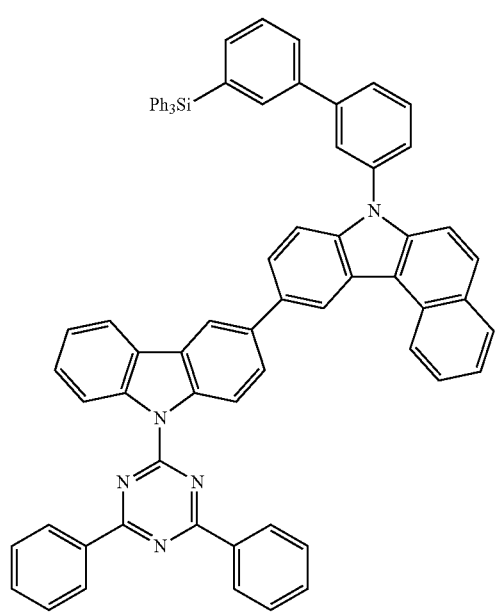
[9]
[10]

[11]
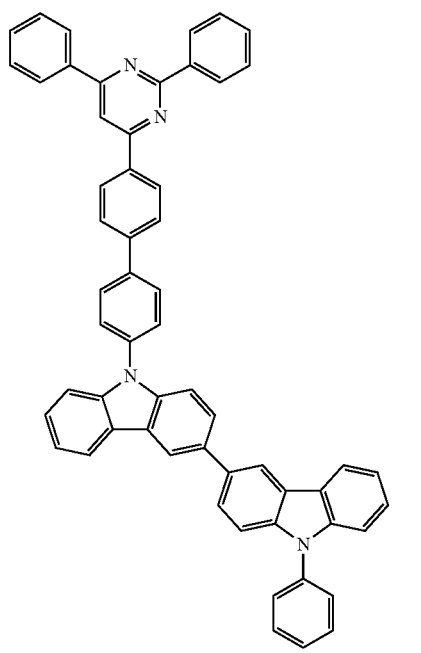
[13]
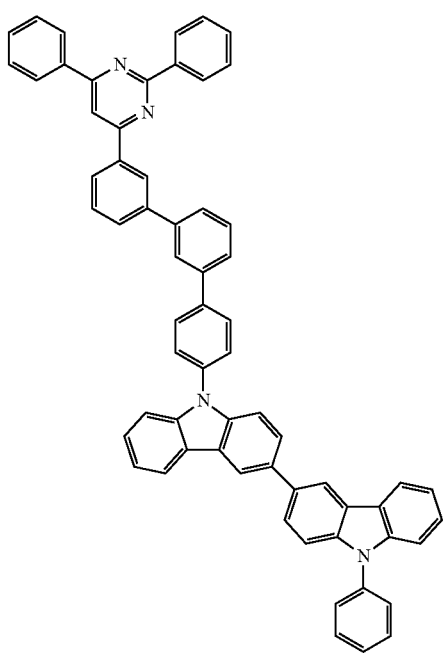
[12]
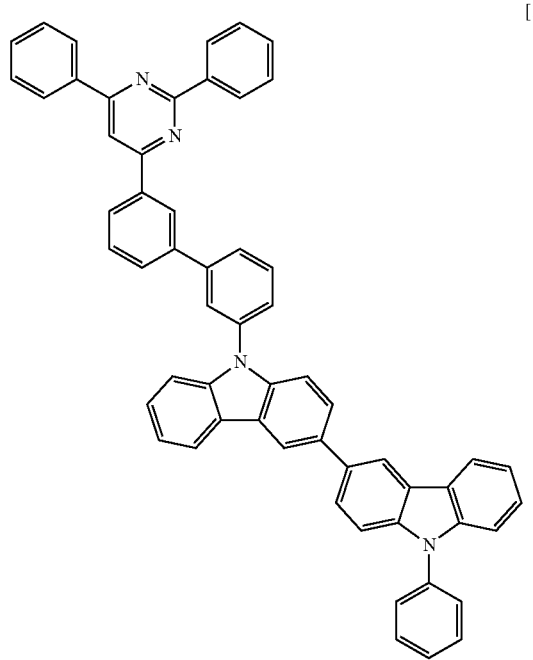
[14]
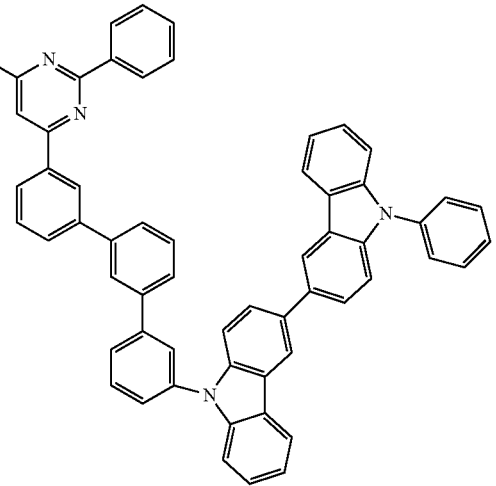

-continued
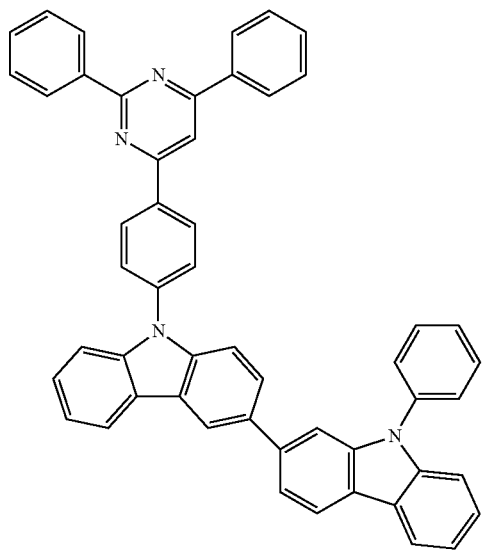
[15]
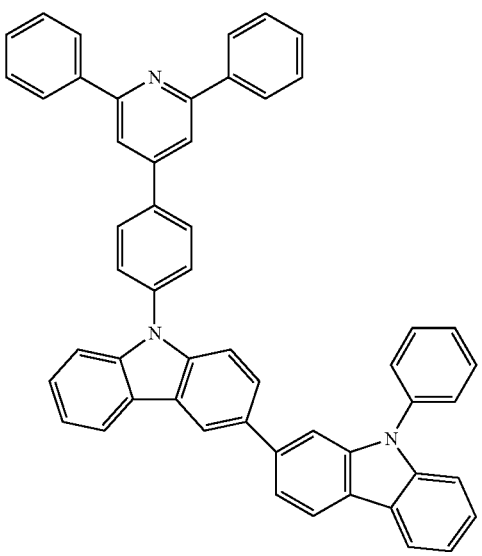
[18]
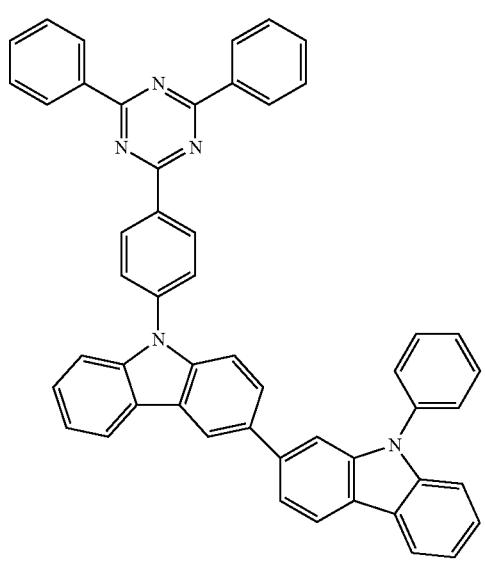
[16]
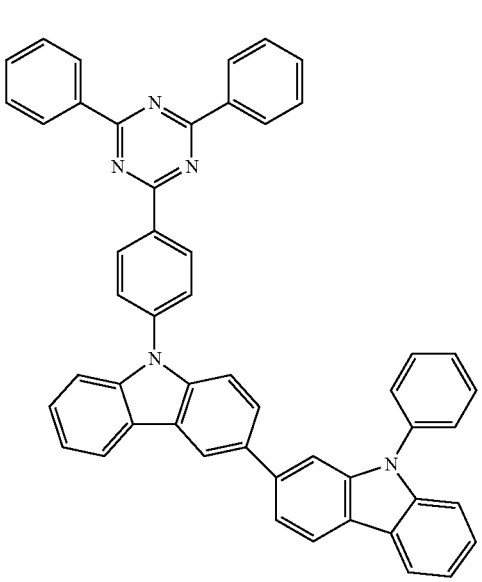
[19]
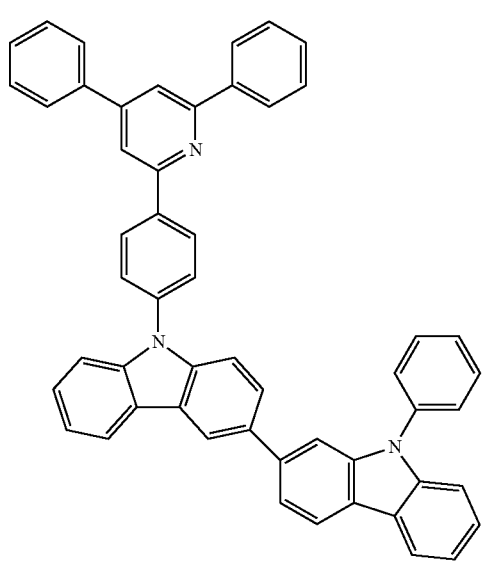
[17]
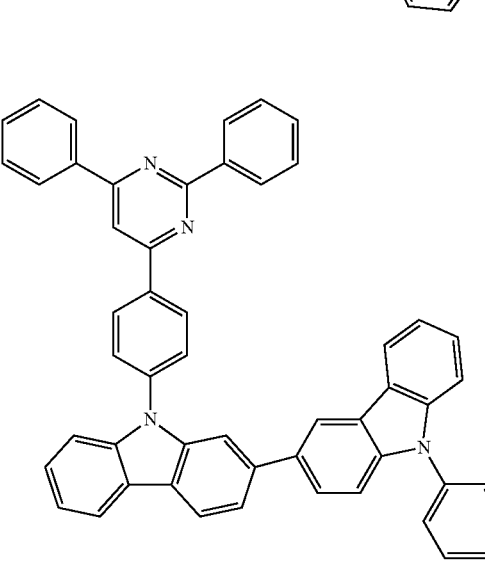
[20]

[21]
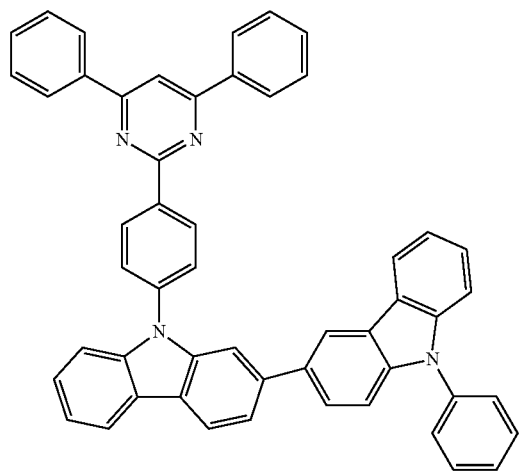
[22]
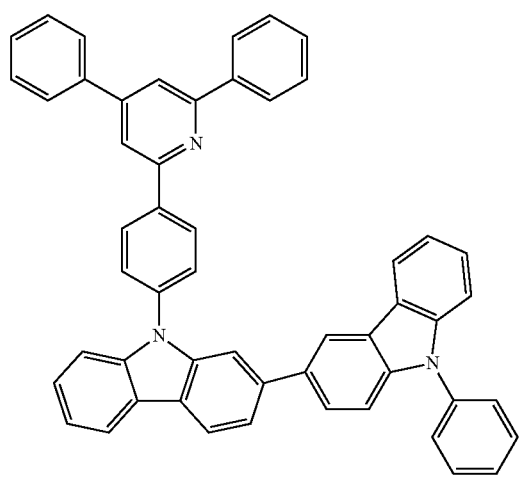
[23]
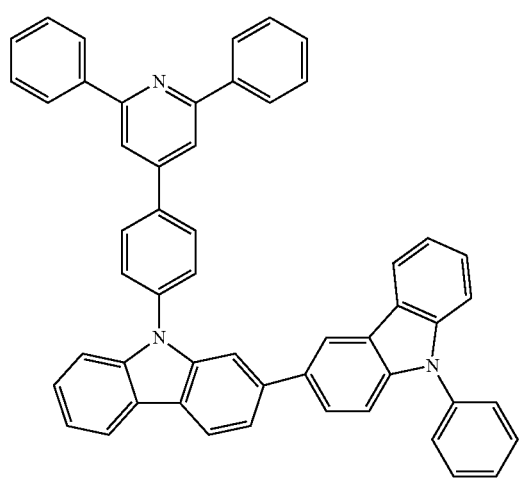
[24]
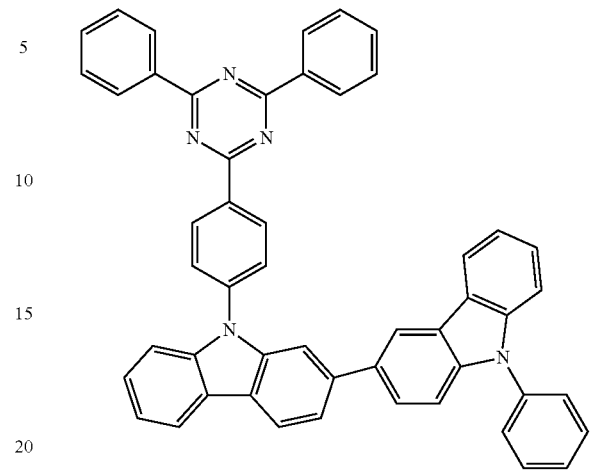
[25]
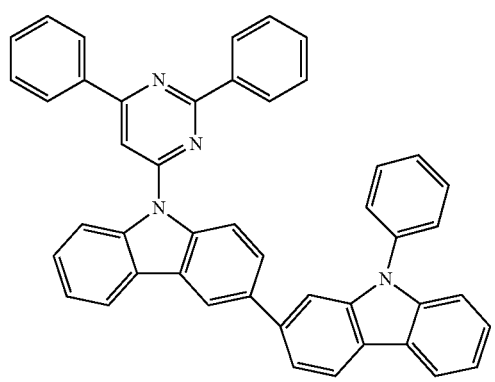
[26]
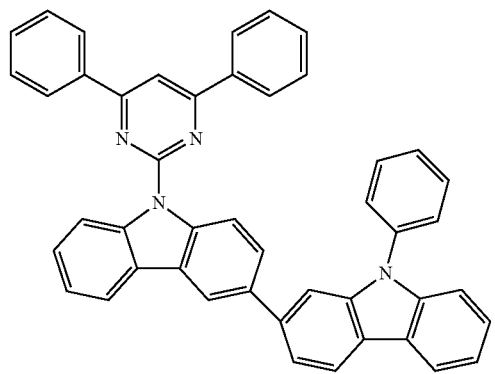
[27]
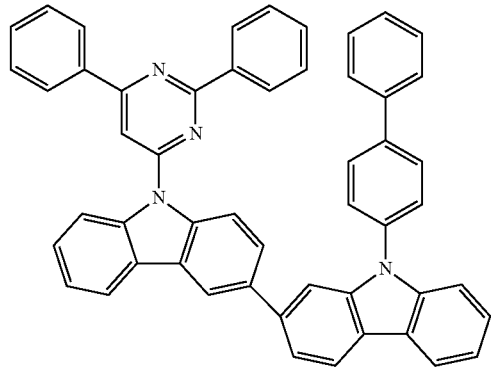

[28]
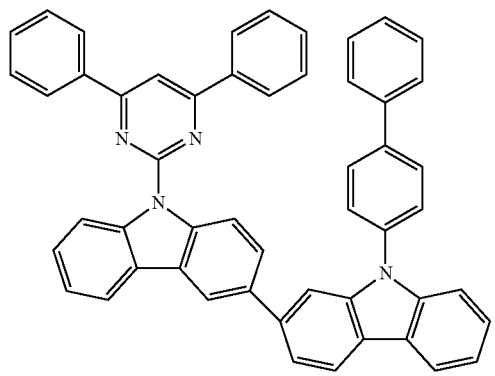
[29]
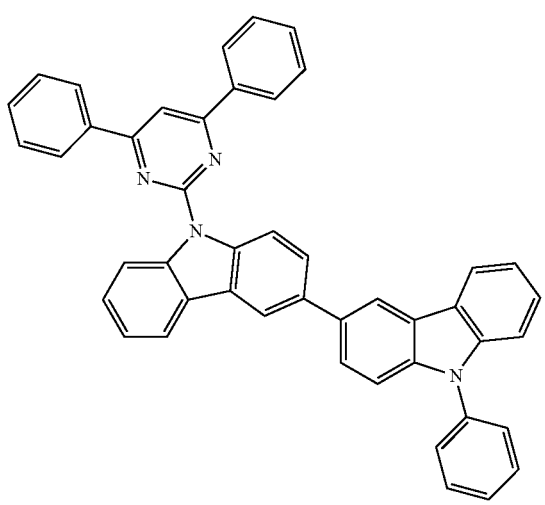
[30]
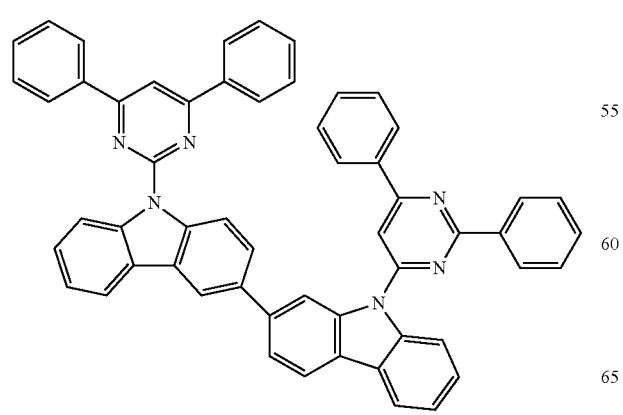
[31]
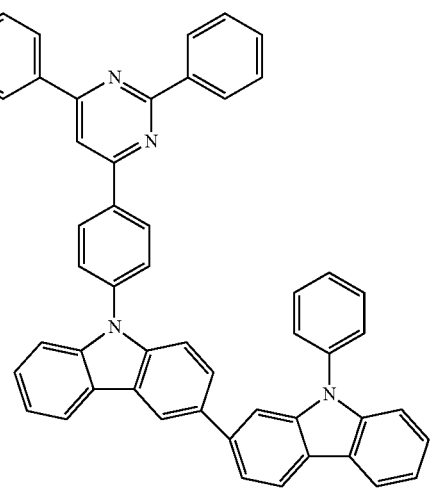
[32]
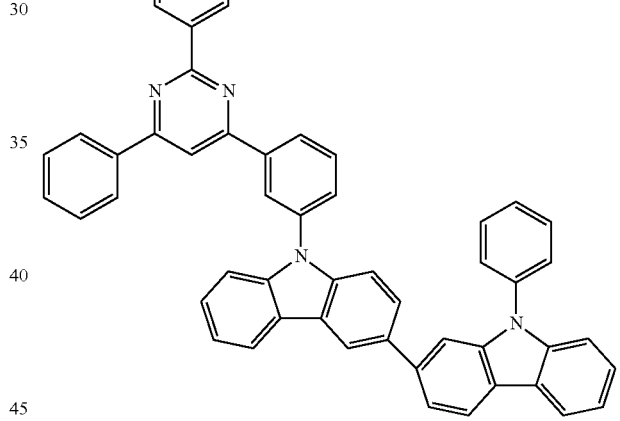
[33]
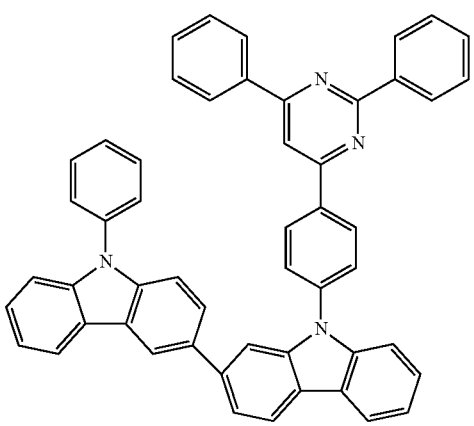

[34]
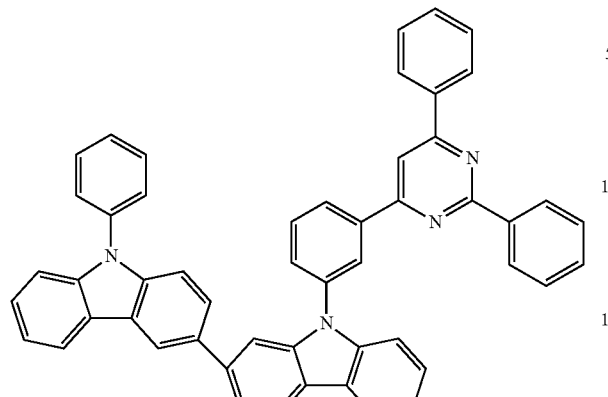
[35]
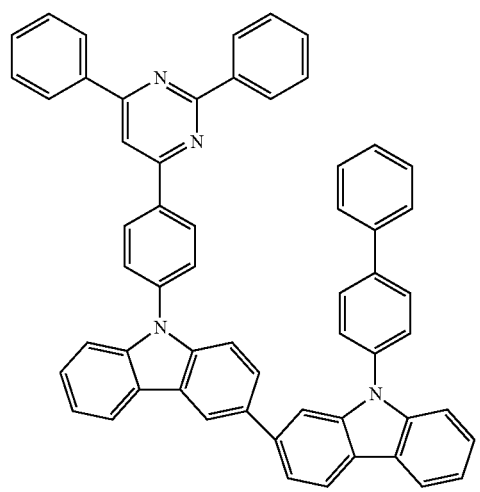
[36]
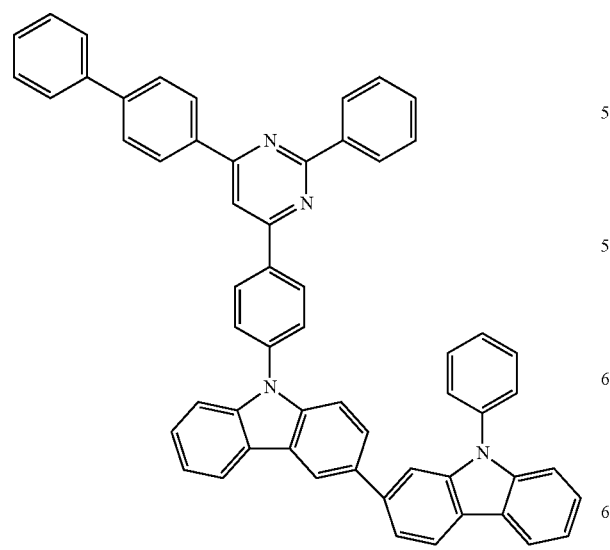
[37]
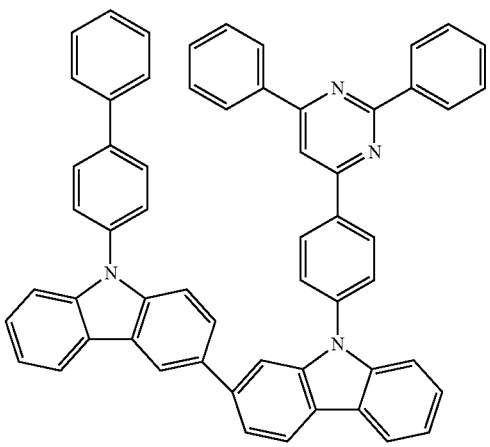
[38]
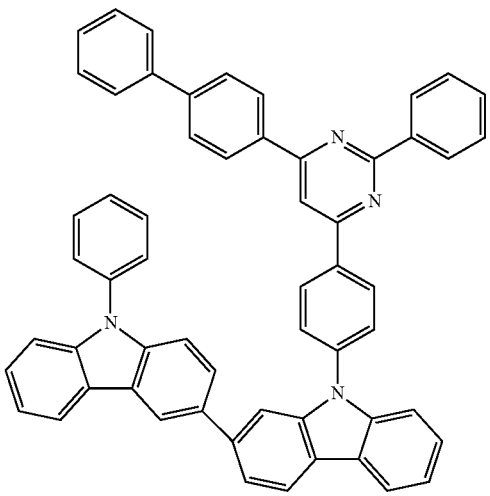
[39]
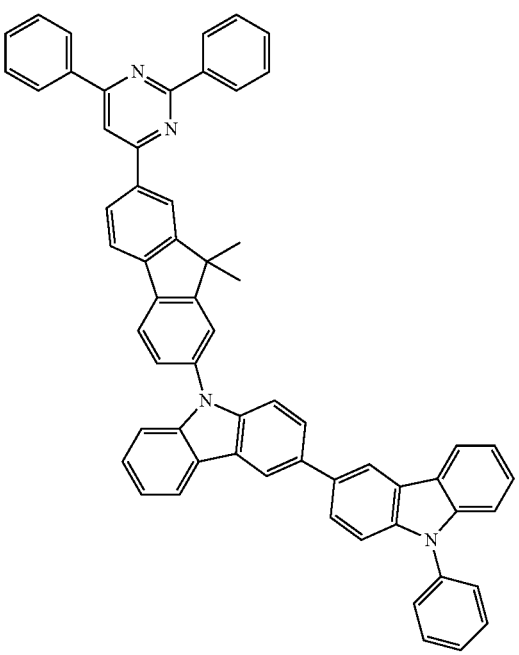

-continued
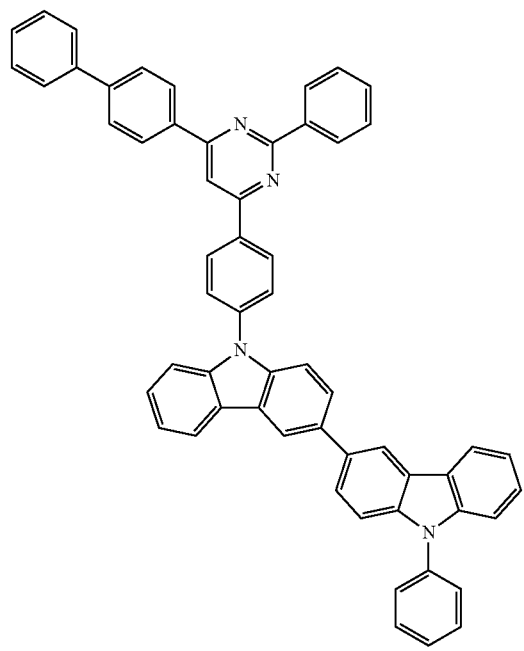
[40]
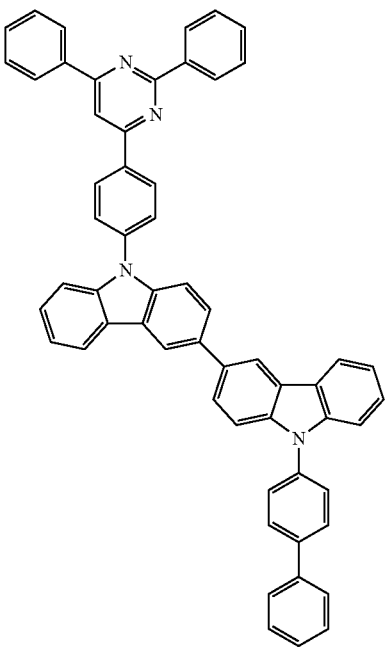
[42]
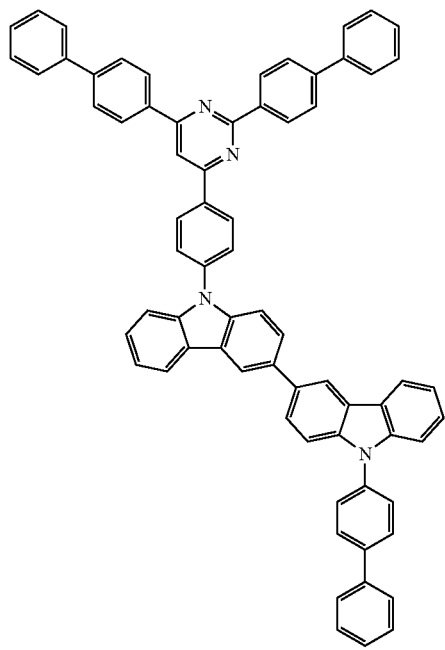
[41]
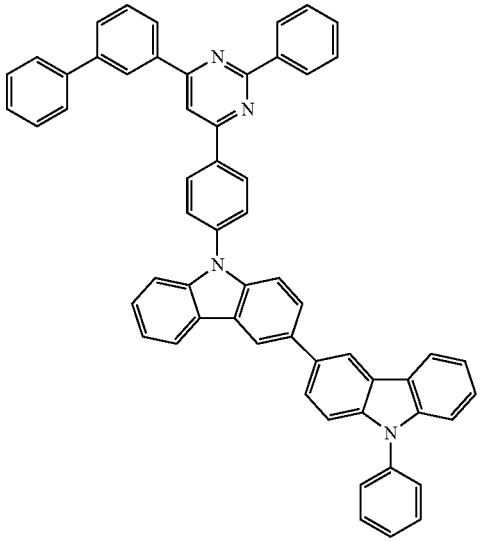
[43]

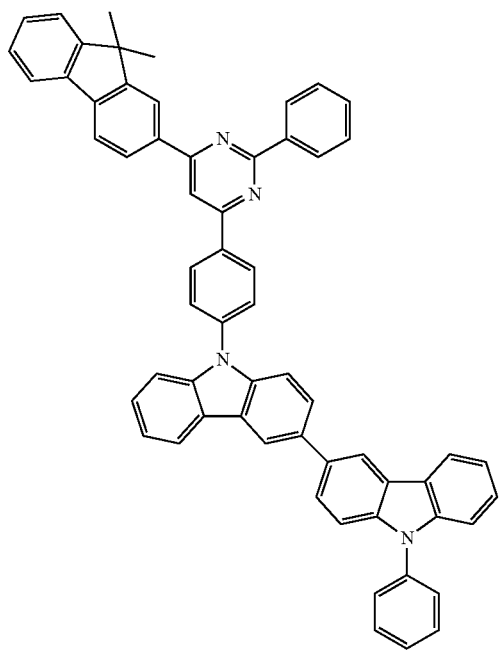
[44]
[45]
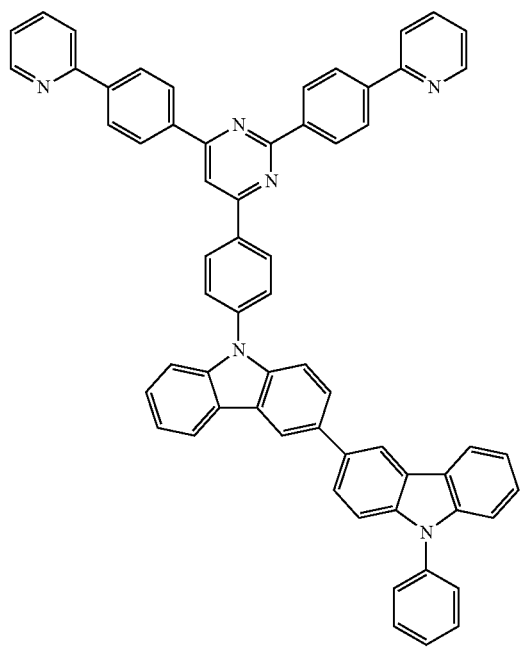
[46]
[47]

[48]
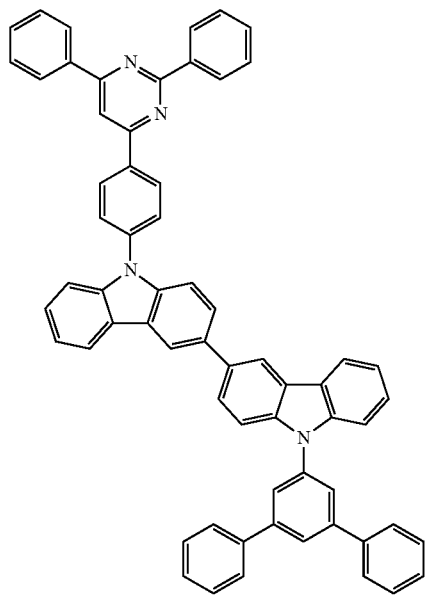
4. The organic light emitting diode display as claimed in claim 1, wherein the compound represented by Chemical Formula 2 is one of the following Compounds 49 to 73:
[49]
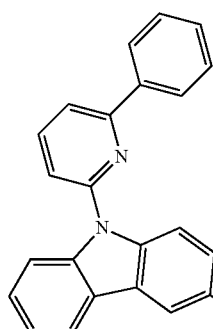
[50]
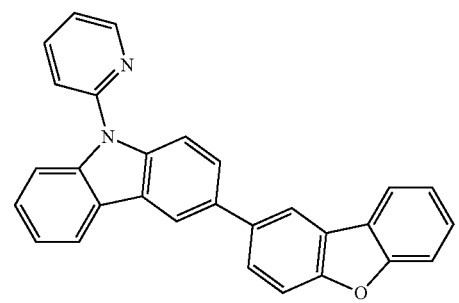
[51]
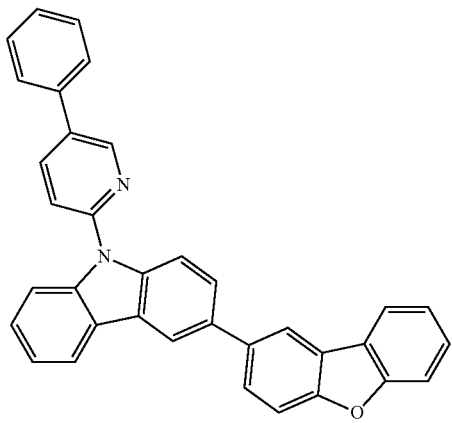
[52]
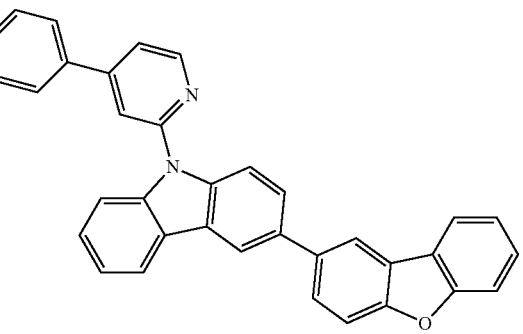
[53]
[54]
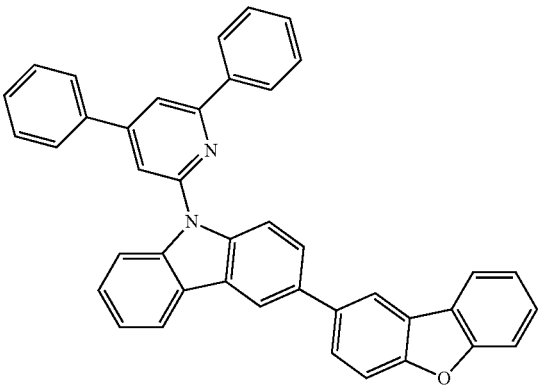

[55]
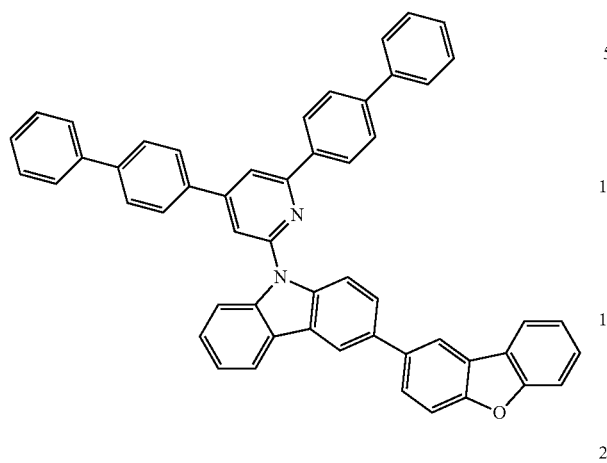
[56]
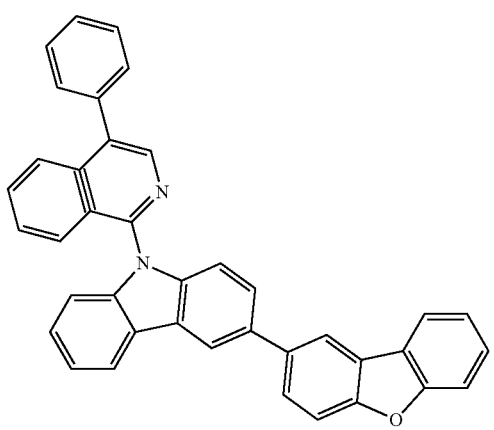
[57]
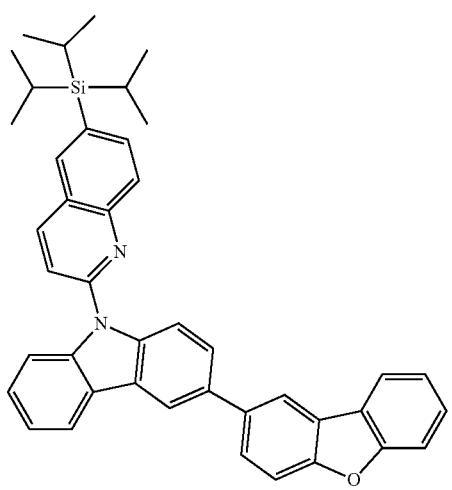
[58]
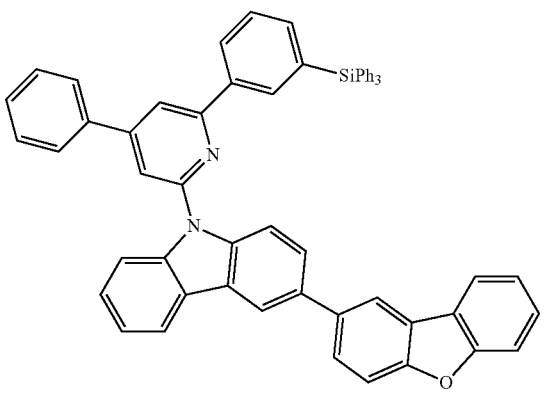
[59]
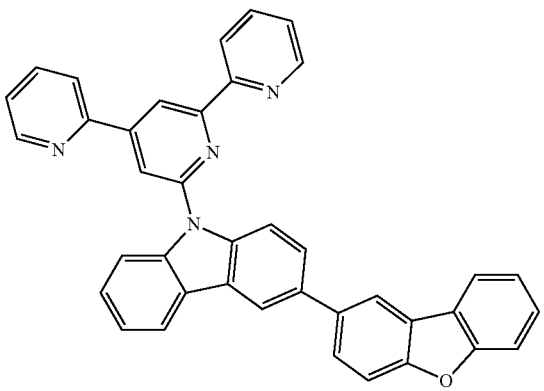
[60]
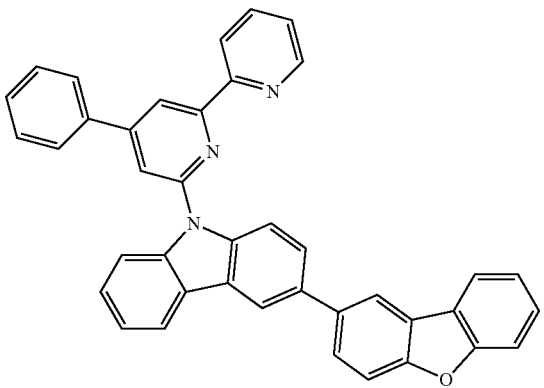

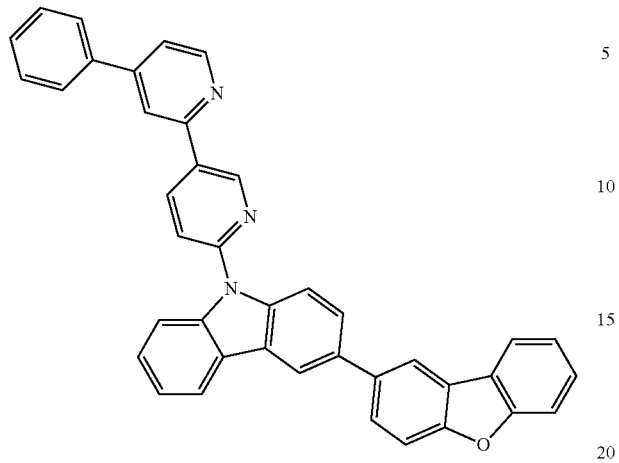
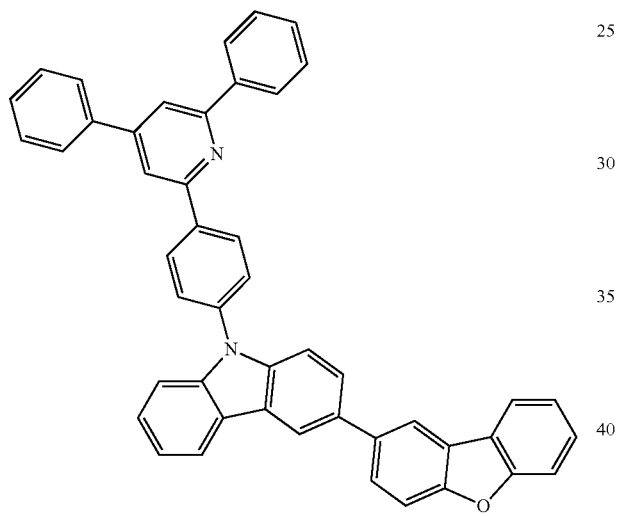
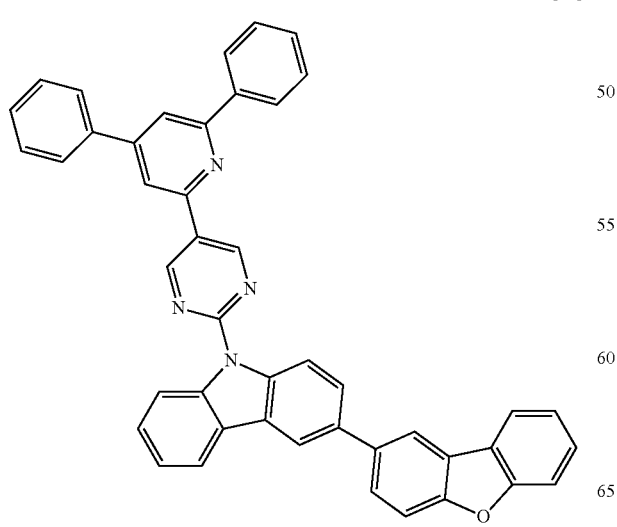

[67]
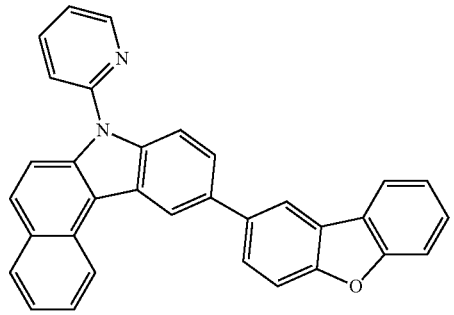
[68]
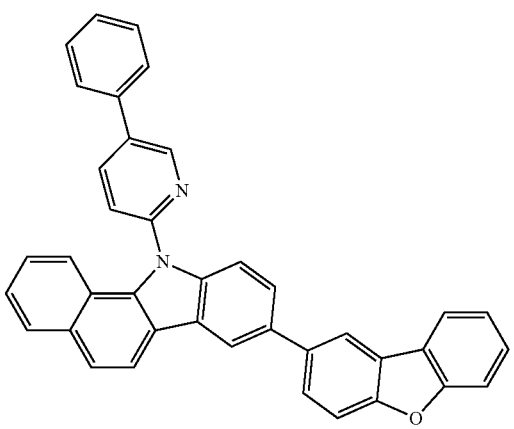
[69]
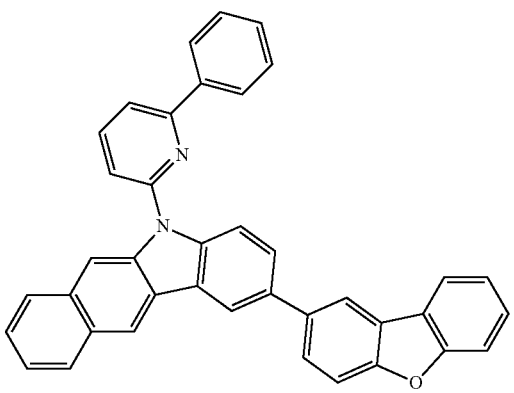
[71]
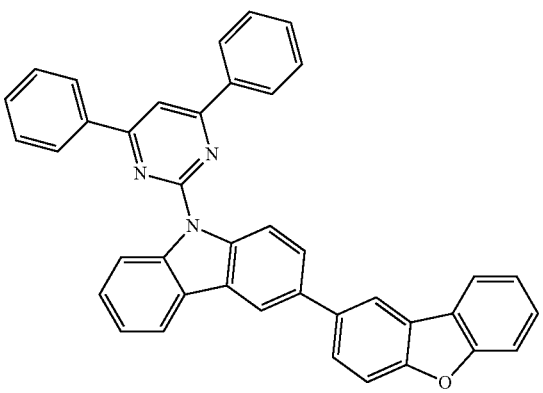
[72]
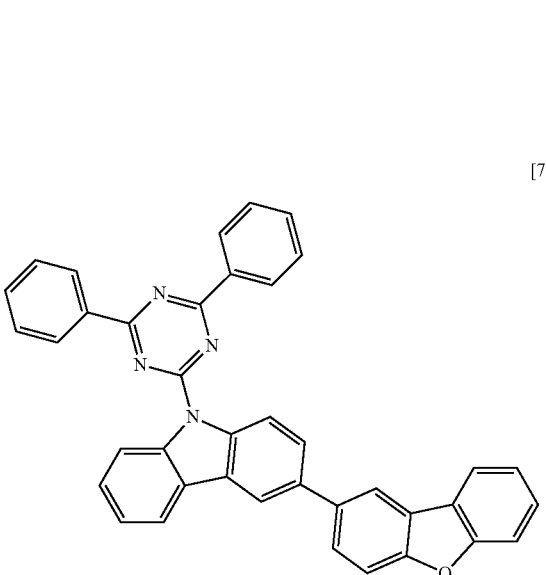
[73]
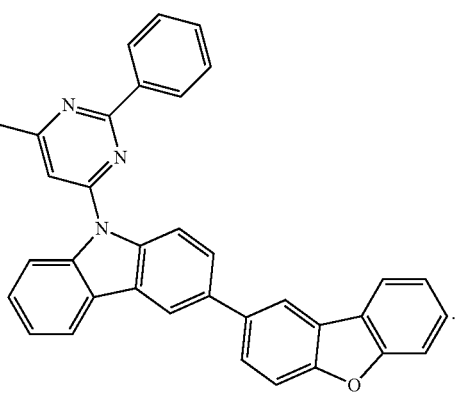
[70]

5. The organic light emitting diode display as claimed in claim 1, wherein the compound represented by Chemical Formula 3 is one of the following Compounds 74 to 78:
[74]
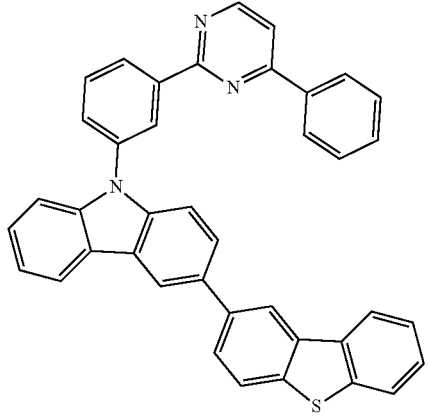
[75]
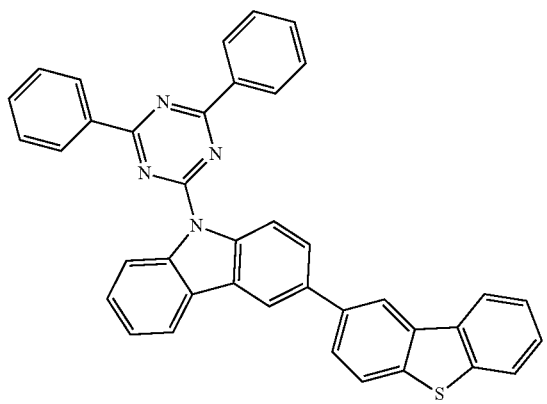
[76]
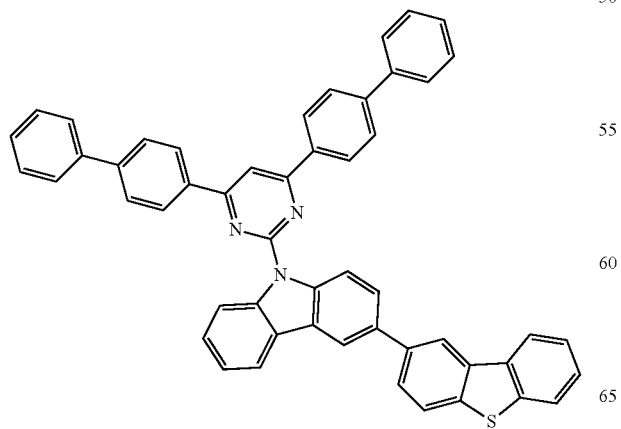
[77]
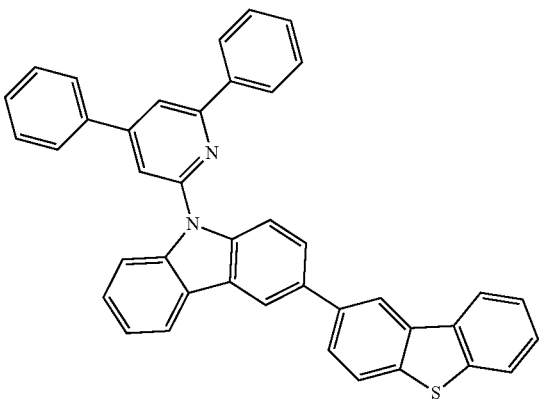
[78]
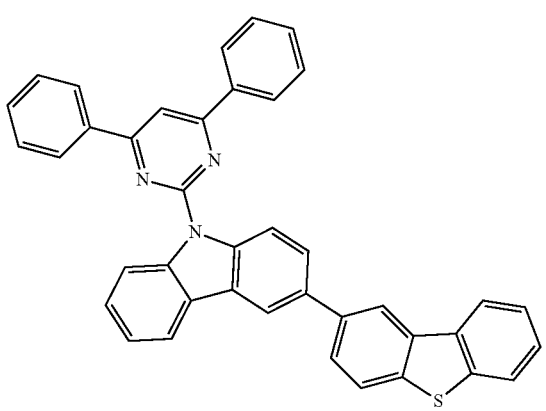
6. The organic light emitting diode display as claimed in claim 1, wherein the compound represented by Chemical Formula 4 is one of the following Compounds 79 to 84:
[79]
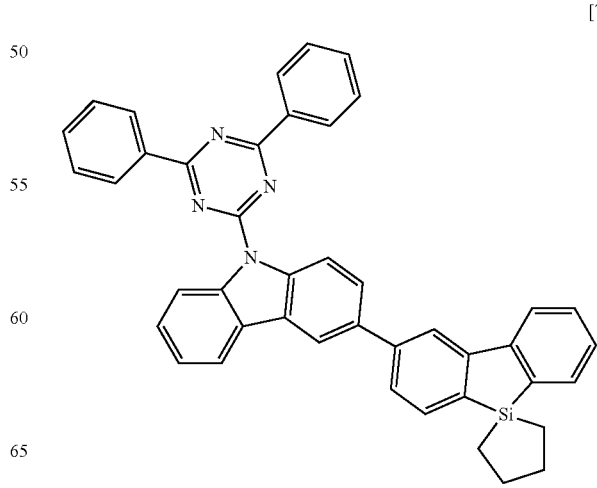

[80]
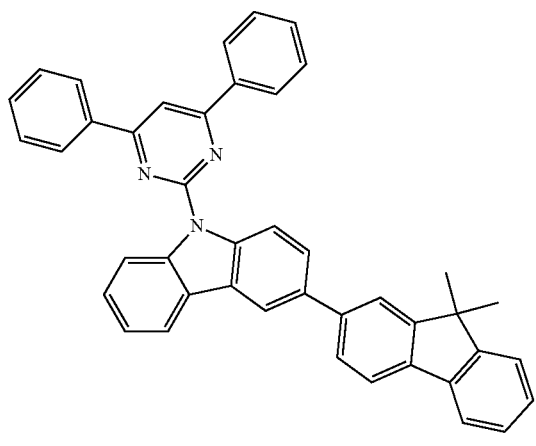
[81]
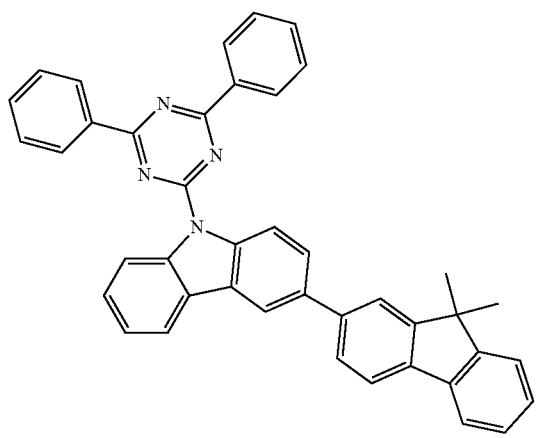
[82]
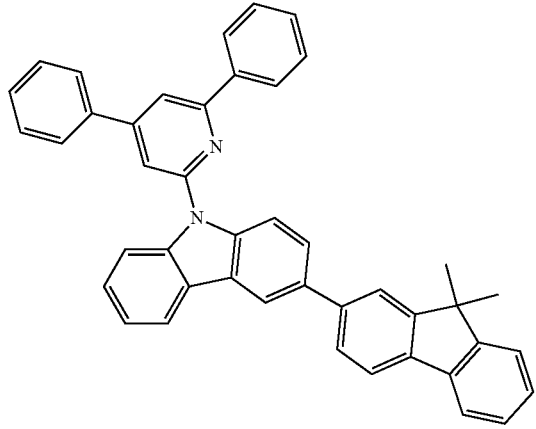
[83]
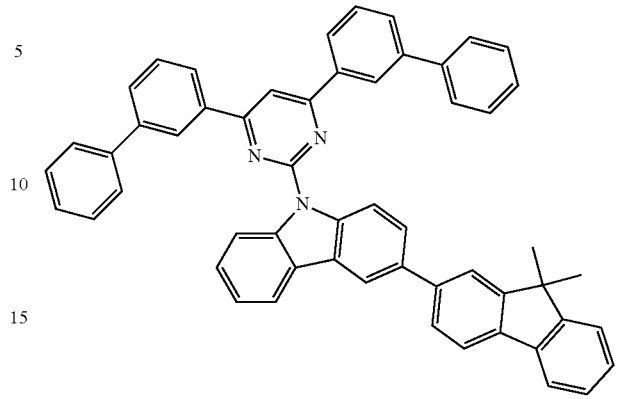
[84]
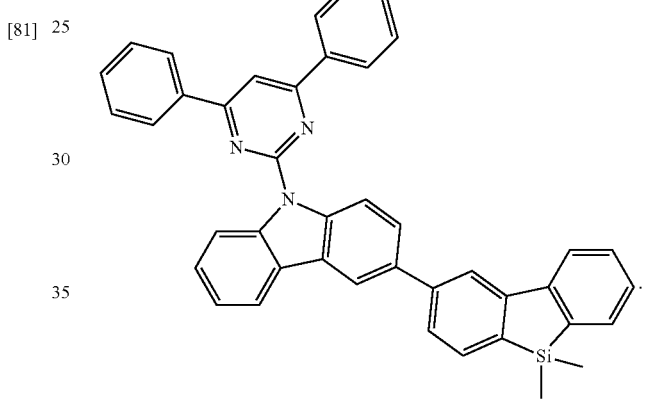
7. The organic light emitting diode display as claimed in claim 1, wherein the compound represented by Chemical Formula 5 is one of the following Compounds 85 to 88:
[85]
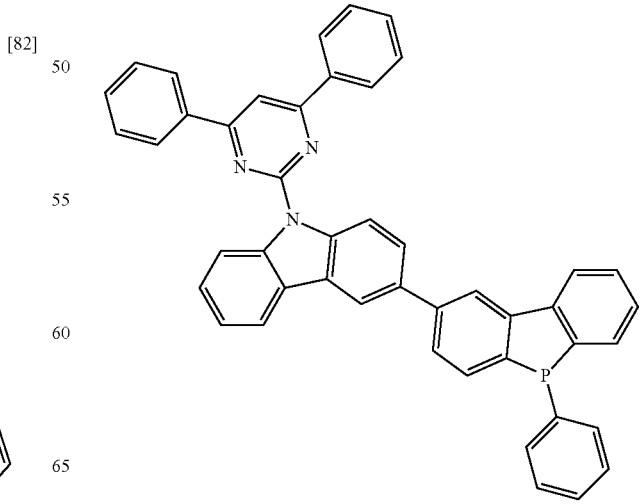

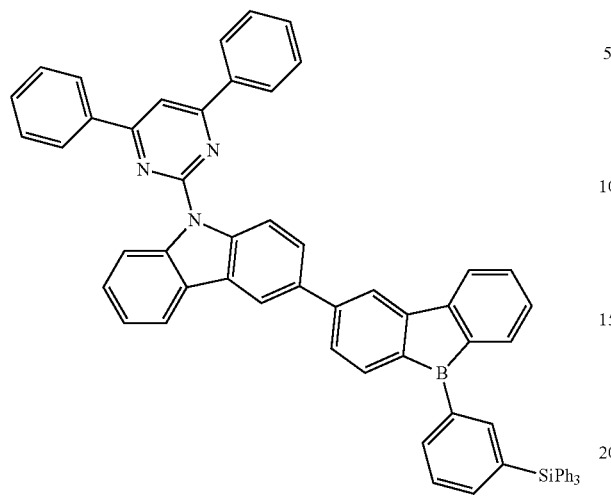

[86]

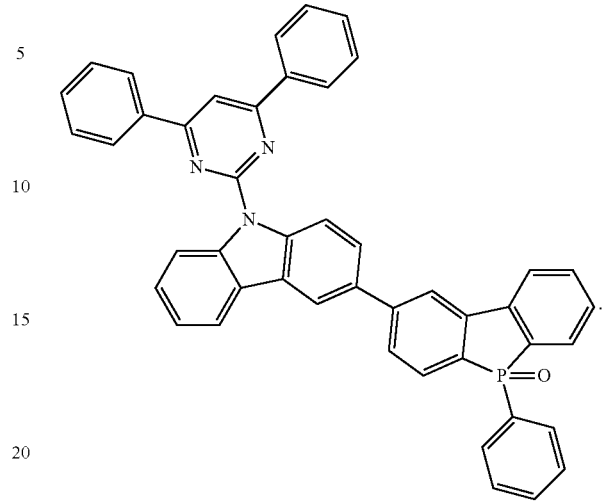

[88]

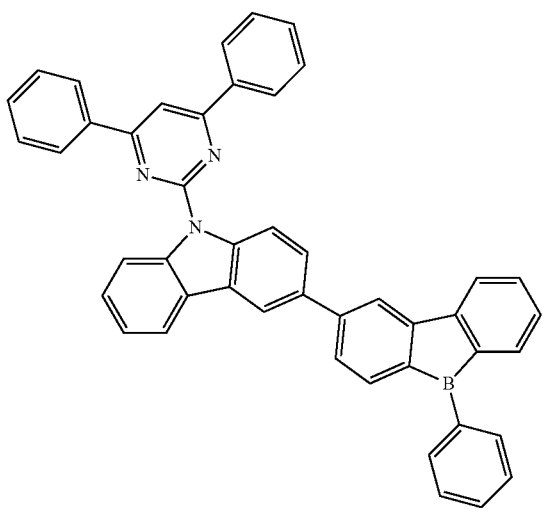

[87]

8. The organic light emitting diode display as claimed in claim 1, wherein the capping layer has a refractive index of about 1.9 or higher.

9. The organic light emitting diode display as claimed in claim 1, wherein the capping layer has a refractive index of about 1.9 to about 3.0.

10. The organic light emitting diode display as claimed in claim 1, wherein the capping layer has a thickness of about 10 nm to about 300 nm.

11. The organic light emitting diode display as claimed in claim 1, further comprising at least one of a hole injection layer and a hole transporting layer between the first electrode and the organic light emitting layer.

12. The organic light emitting diode display as claimed in claim 1, further comprising at least one of an electron transporting layer and an electron injection layer between the organic light emitting layer and the second electrode.

13. The organic light emitting diode display as claimed in claim 1, further comprising a second substrate on the capping layer, the second substrate being spaced apart from the capping layer.

14. The organic light emitting diode display as claimed in claim 13, further comprising an air layer in a space between the capping layer and the second substrate.

15. The organic light emitting diode display as claimed in claim 13, further comprising a filling member in a space between the capping layer and the second substrate.

16. The organic light emitting diode display as claimed in claim 1, further comprising a thin film encapsulation layer on the capping layer.

17. The organic light emitting diode display as claimed in claim 16, wherein the thin film encapsulation layer has a multilayer structure in which one or more inorganic layers and one or more organic layers are alternately laminated.

18. The organic light emitting diode display as claimed in claim 17, wherein one of the inorganic layers is disposed a lowest portion of the thin film encapsulation layer having a multilayer structure.

* * * * *